(12) United States Patent
Tomita

(10) Patent No.: US 6,373,783 B1
(45) Date of Patent: Apr. 16, 2002

(54) SEMICONDUCTOR INTEGRATED CIRCUIT, METHOD OF CONTROLLING THE SAME, AND VARIABLE DELAY CIRCUIT

(75) Inventor: Hiroyoshi Tomita, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/587,296

(22) Filed: Jun. 5, 2000

(30) Foreign Application Priority Data

Oct. 29, 1999 (JP) ............................................ 11-310036

(51) Int. Cl.[7] .................................................. G11C 8/00
(52) U.S. Cl. ........................ 365/233; 365/194; 365/203; 365/223
(58) Field of Search ................................ 365/233, 194, 365/203, 223, 189.01

(56) References Cited

U.S. PATENT DOCUMENTS

| | | | | |
|---|---|---|---|---|
| 5,539,696 A | * | 7/1996 | Patel | 365/189 |
| 5,917,760 A | * | 6/1999 | Millar | 365/194 |
| 6,111,815 A | * | 8/2000 | Takeda | 365/236 |
| 6,151,270 A | * | 11/2000 | Jeong | 365/233 |
| 6,166,990 A | * | 12/2000 | Ooishi et al. | 365/233 |
| 6,172,935 B1 | * | 1/2001 | Wright et al. | 365/233 |
| 6,198,689 B1 | * | 3/2001 | Yamazaki | 365/233 |
| 6,215,726 B1 | * | 4/2001 | Kubo | 365/233 |

\* cited by examiner

*Primary Examiner*—Hoai V. Ho
(74) *Attorney, Agent, or Firm*—Arent Fox Kintner Plotkin & Kahn, PLLC

(57) ABSTRACT

In performing a read operation or a write operation in a memory cell, a row control circuit is first operated to activate a word line. Subsequently, a command control circuit receives a column operation command in synchronization with a clock signal so as to operate a column control circuit. Here, under the control of a timing adjusting circuit, the column control circuit starts operating a predetermined delay time after the reception of the column operation command. By delaying the operation of the column control circuit, the read operation or the write operation in the memory cell can be performed at the optimum timing corresponding to the operating timing of an internal circuit independent of the cycle of the clock signal. As a result, the number of times in receiving commands per unit time can be increased to enhance the bus occupation rate of data. Since the column control circuit is operated at the optimum timing corresponding to the operating timing of the internal circuit, a read cycle time and a write cycle time can be shortened.

22 Claims, 33 Drawing Sheets

SEMICONDUCTOR INTEGRATED CIRCUIT, METHOD OF CONTROLLING THE SAME, AND VARIABLE DELAY CIRCUIT

BACKGROUND OF THE INVENTION

1. Field of the Invention

The present invention relates to a semiconductor integrated circuit which includes memory cells. More particularly, it relates to a semiconductor integrated circuit capable of enhancing a bus occupation rate of data irrespective of the frequency of a clock signal. It also relates to a method of controlling the semiconductor integrated circuit for enhancing a bus occupation rate of data irrespective of the frequency of a clock signal.

The present invention also relates to a variable delay circuit capable of setting a delay time at a predetermined value.

2. Description of the Related Art

The operating speeds of semiconductor integrated circuits have steadily been heightened owing to the progress of semiconductor manufacturing technology. In particular, the operating frequency of a logic LSI such as microcomputer has yearly been improving and the difference thereof from the operating frequency of a memory LSI such as DRAM has been increasing.

In order to reduce such differences, there have been developed high-speed DRAMs such as EDO DRAM (Extended Data Output DRAM), SDRAM (Synchronous DRAM), DDR SDRAM (Double Data Rate Synchronous DRAM), and Direct RDRAM (Rambus DRAM).

The high-speed DRAMs of this type are possible to read and write data from and into memory cells at high speed by successively accessing the memory cells connected to an identical word line. Concretely, there has been developed a DRAM whose maximum operating frequency exceeds 100 MHz. The high-speed DRAMs are often employed for the main storages of personal computers and workstations.

Meanwhile, the high-speed DRAMs of this type are used for not only personal computers and workstations but also the components of application products of microcomputers. In this case, the operating frequencies of the high-speed DRAMs are determined in accordance with the specifications of each product. Therefore, the operating frequency of the high-speed DRAM for such uses is set at, for example, 50 MHz or 75 MHz even in the case of setting the maximum operating frequency at 133 MHz.

When the high-speed DRAM is operated at the frequency lower than the maximum operating frequency, there arise some problems to be explained below.

FIG. 1(a) shows a read timing when the cycle "tCK" of a clock signal CLK is 20 ns (50 MHz).

By way of example, an SDRAM performs a read operation by receiving a read command RD which activates a circuit relevant to column addresses after the reception of an activation command ACTV which activates a circuit relevant to row addresses. In the following description, commands shall be expressed as "ACTV command", "RD command", or the like.

In this SDRAM, the minimum time of a "tRCD" (/RAS to /CAS Delay time) is set at 18 ns. The tRCD is a time from the reception of the ACTV command to that of a command corresponding to a column address such as the RD command.

In addition, the minimum time of a "tCAC" (/CAS Access time from Clock) is set at 14 ns. The tCAC is a time from the reception of the command corresponding to the command address to the outputting of read data.

The tRCD, the tCAC, and a "tAC" indicated in FIG. 1(b) are specifications necessary for properly operating SDRAM and each value of them does not depend upon the operating frequency of the SDRAM in the identical products. In the following description, the clock signal CLK shall be called "CLK signal".

In the case of operating the SDRAM at 50 MHz, the minimum time of the tRCD (18 ns) is less than the cycle of the CLK signal (20 ns). Therefore, the SDRAM can receive the RD command at the rising edge of the CLK signal (at 20 ns) as is next to that of the CLK signal corresponding to the reception of the ACTV command. The tRCD becomes 20 ns actually. In addition, the minimum time of the tCAC (14 ns) is less than the cycle of the CLK signal (20 ns). Therefore, the SDRAM outputs the read data QA0 the tCAC (14 ns) after the rising edge of the CLK signal as corresponds to the reception of the RD command. As a result, an access time tRAC (/RAS Access time from Clock) from the reception of the ACTV command to the outputting of the read data QA0 becomes 34 ns (tCK+tCAC).

On the other hand, FIG. 1(b) shows a read timing in the case where the cycle "tCK" of a CLK signal is 13 ns (about 75 MHz).

Here, the maximum time of the "tAC" (Access time from Clock) is set at 6 ns. The tAC is a time from the rising edge of the clock signal to the outputting of read data.

In the case of operating the SDRAM at 75 MHz, the minimum time of a "tRCD" (18 ns) is greater than the cycle of the CLK signal (13 ns). Therefore, the SDRAM receives an RD command at the second rising edge of the CLK signal (at 26 ns) after the reception of an ACTV command. The tRCD becomes 26 ns actually. In addition, the minimum time of a "tCAC" (14 ns) is greater than the cycle of the CLK signal (13 ns). Therefore, the SDRAM outputs the read data QA0 the tAC (6 ns) after the rising edge of the CLK signal next to that of the CLK signal corresponding to the reception of the RD command. As a result, an access time tRAC becomes 45 ns (3·tCK+tAC).

In the above read operations, the CLK signal at the higher frequency has the longer access time tRAC. In other words, the CLK signal at the higher frequency has the lower bus occupation rate of data, which causes a problem. Here, the "bus occupation rate" is a rate at which valid data are transmitted onto a data bus during a predetermined period. Therefore, the low bus occupation rate leads to degrading the performance of the whole system.

FIG. 2(a) shows a precharge operation which proceeds after an ACTV command in the case where the cycle "tCR" of a clock signal CLK is 20 ns (50 MHz). The precharge operation is an operation of charging a bit line to a predetermined voltage so as to inactivate a circuit relevant to row addresses.

In this SDRAM, the minimum time of a "tRAS" (/RAS active time) is set at 24 ns. The tRAS is a time from the reception of an ACTV command to that of a precharge command PRE.

In addition, the minimum time of a "tRP" (/RAS Precharge time) is set at 10 ns. The tRP is a time from the reception of the PRE command to that of the next ACTV command. The tRAS, the tRP, and a "tDPL" indicated at FIG. 2(b) are specifications necessary for properly operating the SDRAM and each value of them does not depend upon the operating frequency of the SDRAM in the identical products.

When operating the SDRAM at 50 MHz, the minimum time of the tRAS (24 ns) becomes greater than the cycle of the CLK signal (20 ns). Therefore, the SDRAM receives the PRE command at the second rising edge of the CLK signal (at 40 ns) after the reception of the ACTV command. The actual tRAS would be 40 ns. In addition, the SDRAM performs the precharge operation during the period of the tRP (10 ns) after the reception of the PRE command. Therefore, a cycle time "tRC" (/RAS Cycle time) from the reception of the ACTV command to that of the next ACTV command becomes 60 ns (3·tCK).

On the other hand, FIG. 2(b) shows a write operation accompanying a precharge operation in the case where the cycle "tCK" of a clock signal CLK is 20 ns (50 MHz).

Here, a WRA command (WRite with Auto-precharge) is a command for causing the SDRAM to automatically perform the precharge operation after the write operation. The minimum time of a "tRCD" is set at 18 ns the same as in the ordinary read command RD (FIG. 1) or write command WR (not shown). The minimum time of a "tDPL" (Data-in to Precharge Lead time) is set at 10 ns. The tDPL is a time from the reception of write data to that of a precharge command PRE.

In operating the SDRAM at 50 MHz, the minimum time of the tRCD (18 ns) is less than the cycle of the CLK signal (20 ns) as in FIG. 1(a). Therefore, the SDRAM can receive the WRA command at the rising edge of the CLK signal (at 20 ns) next to that of the CLK signal corresponding to the reception of an ACTV command.

The SDRAM simultaneously accepts the write data (not shown) with the WRA command and writes the accepted data into a memory cell during the period of the tDPL. Thereafter, the SDRAM performs the precharge operation during the period of a "tRP". The total of the tDPL and tRP is 20 ns, which is equal to one cycle tCK of the CLK signal. Therefore, the SDRAM can receive the next ACTV command at the rising edge of the CLK signal (at 40 ns) as is next to that of the CLK signal corresponding to the reception of the WRA command. Accordingly, a cycle time "tRC" (/RAS Cycle time) from the reception of the ACTV command to that of the next ACTV command becomes 40 ns (2·tCK).

In this manner, the cycle time tRC becomes shorter in performing the precharge operation together with the write operation than in performing the precharge operation alone. This causes a problem that the operation speed heightens in the more complicated operation.

FIG. 3 shows a different timing of the precharge operation of the SDRAM.

FIG. 3(a) shows the precharge operation after an ACTV command in the case where the cycle "tCK" of a clock signal CLK is 13 ns (75 MHz).

In operating the SDRAM at 75 MHz, the minimum time of a "tRAS" (24 ns) becomes greater than the cycle of the CLK signal (13 ns). Therefore, the SDRAM receives a PRE command at the second rising edge of the CLK signal (at 26 ns) after the reception of the ACTV command. The actual tRAS would be 26 ns. In addition, the SDRAM performs the precharge operation during the period of a "tRP" (10 ns) after the reception of the PRE command. Therefore, a cycle time "tRC" (/RAS Cycle time) from the reception of the ACTV command to that of the next ACTV command becomes 39 ns (3·tCK).

On the other hand, (b) FIG. 3 shows a write operation accompanying the precharge operation in the case where the cycle "tCK" of a clock signal CLK is 13 ns (75 MHz).

In operating the SDRAM at 75 MHz, the minimum time of a "tRCD" (18 ns) is greater than the cycle of the CLK signal (13 ns). Therefore, the SDRAM receives a WRA command at the second rising edge of the CLK signal (at 26 ns) after the reception of an ACTV command. Besides, the SDRAM accepts write data (not shown) simultaneously with the WRA command and writes the accepted data into a memory cell during the period of a "tDPL". Thereafter, the SDRAM performs the precharge operation during the period of a "tRP". The total of the tDPL and tRP is 20 ns, which is greater than one cycle tCK of the CLK signal. Therefore, the SDRAM can receive the next ACTV command at the second rising edge of the CLK signal (at 52 ns) after the reception of the WRA command. Accordingly, a cycle time "tRC" (/RAS Cycle time) from the reception of the ACTV command to that of the next ACTV command becomes 52 ns (4·tCK).

At the timing shown in FIG. 2(b) or FIG. 3(b), the CLK signal at the higher frequency delays the write operation, which causes a problem. Moreover, the CLK signal at the higher frequency lowers the bus occupation rate in the write operation.

Besides, at the operation timings (FIG. 3) at the higher frequency, the cycle time tRC during which the precharge operation is performed together with the write operation, becomes longer than the cycle time tRC during which the precharge operation is performed alone. This relation is opposite to that at the operating timings (FIG. 2) at the lower frequency. In other words, the cycle time tRC necessary for the respective operations do not depend upon the level of the frequency. This poses a problem that a timing design is difficult when operating the high-speed DRAM of this type mounted in the application products of the microcomputer, at the frequency lower than the maximum operating frequency thereof.

An object of the present invention is to provide a semiconductor integrated circuit capable of increasing the bus occupation rate of data independent of the operating frequency thereof and a method of controlling the semiconductor integrated circuit for increasing the bus occupation rate of data independent of the operating frequency thereof.

Another object of the present invention is to provide a variable delay circuit capable of setting a delay time to a predetermined length.

According to one of the aspects of a semiconductor integrated circuit in the present invention, a plurality of memory cells connected to a word line, a row control circuit, a column control circuit, a command control circuit, and a timing adjusting circuit are comprised. The row control circuit is first operated and the word line is activated when a read or a write operation is performed in the memory cell in the semiconductor integrated circuit. Subsequently, the command control circuit receives a column operation command in synchronization with a clock signal and operates the column control circuit. The timing adjusting circuit has the function of setting a delay time, which is from the reception of the column operation command to the start of the operation of the column control circuit, to be variable. Under the control of the timing adjusting circuit, the column control circuit initiates the operation a predetermined length of the delay time after the reception of the column operation command. Then, a read operation or a write operation in the memory cell selected by the word line being activated is performed.

Delaying the operation of the column control circuit in this manner results in performing a read or a write operation in the memory cell at the optimum timing corresponding to that of an internal circuit independent of the cycle of the clock signal. This increases the number of times in receiving commands per unit time and the bus occupation rate of read data or write data. Moreover, a read cycle time and a write cycle time can be shortened since the column control circuit is operated at the optimum timing corresponding to that of the internal circuit.

According to another aspect of the semiconductor integrated circuit in the present invention, the timing adjusting circuit sets a delay time to a predetermined length in accordance with a latency. The latency is the number of clock cycles from the reception of the column operation command to the performance of a read or a write operation and it is set in accordance with the frequency of the clock signal supplied. Therefore, the column control circuit can perform a read operation and a write operation at the optimum timings in accordance with the frequency of the clock signal.

The timing adjusting circuit is constructed of simple delay circuits or the like since the delay time is set variable in accordance with the latency.

According to another aspect of the semiconductor integrated circuit in the present invention, the timing adjusting circuit is readily able to set a delay time to a predetermined length, for example, by switching over a no plurality of delay circuits.

According to another aspect of the semiconductor integrated circuit in the present invention, the start of the operation of the column control circuit is delayed in synchronization with the delayed clock signal so that the operations of the column control circuit and other internal circuits can be precisely controlled.

According to another aspect of the semiconductor integrated circuit in the present invention, the timing adjusting circuit sets the delay time to a predetermined length in accordance with the actual operating timing of the row control circuit, the timing shifting due to the changes of a supply voltage, a temperature, or the like. Therefore, the column control circuit can be operated at the optimum timing corresponding to that of the row control circuit.

According to another aspect of the semiconductor integrated circuit in the present invention, the timing adjusting circuit sets the delay time to a predetermined length for every operation of the row control circuit. Since the frequency of setting the delay times is increased, the column control circuit can be precisely operated.

According to another aspect of the semiconductor integrated circuit in the present invention, the timing adjusting circuit sets the delay time to a predetermined length when the row control circuit has operated in the inactive state of the internal circuit. This results in decreasing the frequency of setting the delay time and reducing the power consumption.

According to another aspect of the semiconductor integrated circuit in the present invention, the timing adjusting circuit sets the delay time to a predetermined length in response to the reception of a refresh command for refreshing the memory cells. This results in decreasing the frequency of setting the delay time and reducing the power consumption.

According to another aspect of the semiconductor integrated circuit in the present invention, the timing adjusting circuit sets the delay time to a predetermined length in response to the reception of the first refresh command after the power is switched on. This results in decreasing the frequency of setting the delay time and reducing the power consumption.

According to another aspect of the semiconductor integrated circuit in the present invention, the timing adjusting circuit sets the delay time to a predetermined length in response to a request to adjust the delay time from the exterior. Therefore, the delay time is set variable in accordance with changes in the external environment such as a supply voltage. As a result, the delay time can be set only if necessary.

According to another aspect of the semiconductor integrated circuit in the present invention, the semiconductor integrated circuit comprises a mode register for setting an operating mode from the exterior. The timing adjusting circuit sets the delay time to a predetermined length in accordance with a value set by the mode register. By using the mode register, the delay time can be set only if necessary.

According to another aspect of the semiconductor integrated circuit in the present invention, the timing adjusting circuit sets the delay time to a predetermined length in accordance with a control signal fed to a control terminal. This enables the immediate setting of the delay time when a supply voltage, for example, has fluctuated.

According to another aspect of the semiconductor integrated circuit in the present invention, the semiconductor integrated circuit comprises a plurality of memory cells connected to a bit line, a precharging circuit, a command control circuit, and a timing adjusting circuit. When the semiconductor integrated circuit performs a precharge operation for setting the bit line to have a predetermined voltage, the command control circuit first receives a precharge command in synchronization with a clock signal and then operates the precharging circuit. The timing adjusting circuit has the function of setting a delay time, which is from the reception of the precharge command to the start of the operation of the precharging circuit, to be variable. Under the control of the timing adjusting circuit, the precharging circuit initiates the operation a predetermined length of the delay time after the reception of the precharge command. Then, the precharge operation is performed.

Delaying the operation of the precharging circuit in this manner makes it possible to perform the precharge operation at the optimum timing corresponding to that of an internal circuit independent of the cycle of the clock signal. As a result, the number of times in receiving commands per unit time is increased. It is accordingly possible to enhance the bus occupation rate of read data or write data. Moreover, shortening a precharge cycle time is possible since the precharging circuit is operated at the optimum timing corresponding to that of the internal circuit.

According to another aspect of the semiconductor integrated circuit in the present invention, the timing adjusting circuit sets the delay time to a predetermined length in accordance with a latency. Since the latency is set in accordance with the frequency of the clock signal supplied, the precharging circuit can perform the precharge operation at the optimum timing in accordance with the frequency of the clock signal.

According to another aspect of the semiconductor integrated circuit in the present invention, the timing adjusting circuit can readily set the delay time to a predetermined length, for example, by switching over a plurality of delay circuits.

According to another aspect of the semiconductor integrated circuit in the present invention, the start of the precharge operation is delayed in synchronization with the delayed clock signal so that the precharge operation can be precisely controlled.

According to another aspect of the semiconductor integrated circuit in the present invention, the timing adjusting circuit sets the delay time to a predetermined length in accordance with the actual operating timing of the row control circuit, the timing shifting in accordance with a supply voltage, a temperature, or the like. This results in operating the precharging circuit at the optimum timing corresponding to that of the row control circuit.

According to one of the aspects of a method of controlling a semiconductor integrated circuit in the present invention, when a read or a write operation is performed in the memory cell, a row control circuit is first operated and a word line is activated. Subsequently, a column control circuit operates upon the reception of a column operation command in synchronization with a clock signal. Here, a delay time from the reception of the column operation command to the start of the operation of the column control circuit is set variable. Therefore, the column control circuit initiates the operation a predetermined length of delay time after the reception of the column operation command. The read or the write operation in the memory cell selected by the word line being activated is performed.

Delaying the operation of the column control circuit in this manner makes it possible to perform a read or a write operation in the memory cell at the optimum timing corresponding to that of an internal circuit independent of the cycle of the clock signal. This results in increasing the number of times in receiving commands per unit time and the bus occupation rate of read data or write data. Moreover, it is possible to perform a read operation and a write operation at high speed since the column control circuit is operated at the optimum timing corresponding to that of the internal circuit.

According to another aspect of the method of controlling the semiconductor integrated circuit in the present invention, when a precharge operation for setting a bit line to have a predetermined voltage is performed, a precharging circuit operates upon receiving a precharge command in synchronization with a clock signal. Here, a delay time from the reception of the precharge command to the start of the operation of the precharging circuit is set variable so that the precharge circuit initiates the operation a predetermined length of delay time after the reception of the precharge command. Then, the precharge operation is performed.

Delaying the operation of the precharge circuit in this manner makes it possible to perform the precharge operation at the optimum timing corresponding to that of an internal circuit independent of the cycle of the clock signal. This results in increasing the number of times in receiving commands per unit time. It is accordingly possible to enhance the bus occupation rate of read data or write data.

According to one of the aspects of a variable delay circuit in the present invention, the first delay circuit, the second delay circuit, a detecting circuit and a selecting circuit are comprised. The first delay circuit is constructed by connecting a plurality of the first delay stages in cascade and it receives an input signal at the initial one of the first delay stages. The second delay circuit is constructed by connecting in cascade the second delay stages identical to the first delay stages and it receives the first timing signal at the initial one of the second delay stages. The detecting circuit receives the second timing signal and detects, of delayed timing signals outputted from each of the second delay stages, the one having a transition edge near the transition edge of the second timing signal. The selecting circuit selects a delayed signal outputted from the first delay stage corresponding to the second delay stage outputting the delayed timing signal detected by the detecting circuit.

As a result, the input signal can be delayed by a time from the transition edge of the first timing signal to that of the second timing signal. Besides, it is possible to adjust the delay time of the input signal by operating the detecting circuit if necessary. That is, the power consumption can be reduced by controlling the frequency of detecting the delay timing signal by the detecting circuit from the exterior.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

In the following, the embodiments of the present invention will be described with reference to the drawings. In each of the drawings, a signal line indicated by a bold line is composed of a plurality of lines. Besides, some circuits connected to the bold signal lines are composed of a plurality of elements.

Figure 1:
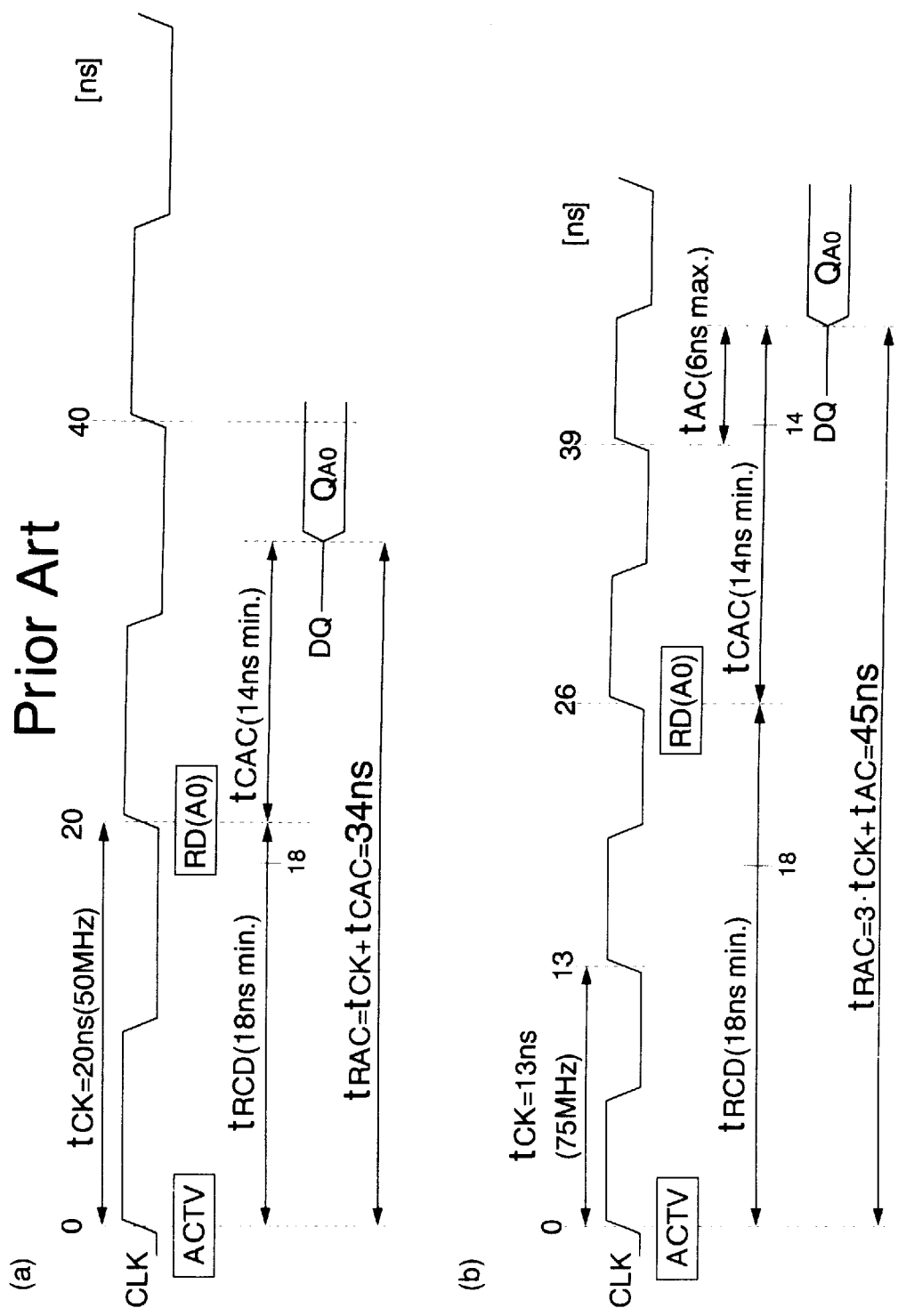
FIG. 1 is a timing chart showing the read operation of an SDRAM in the prior art.
Figure 2:
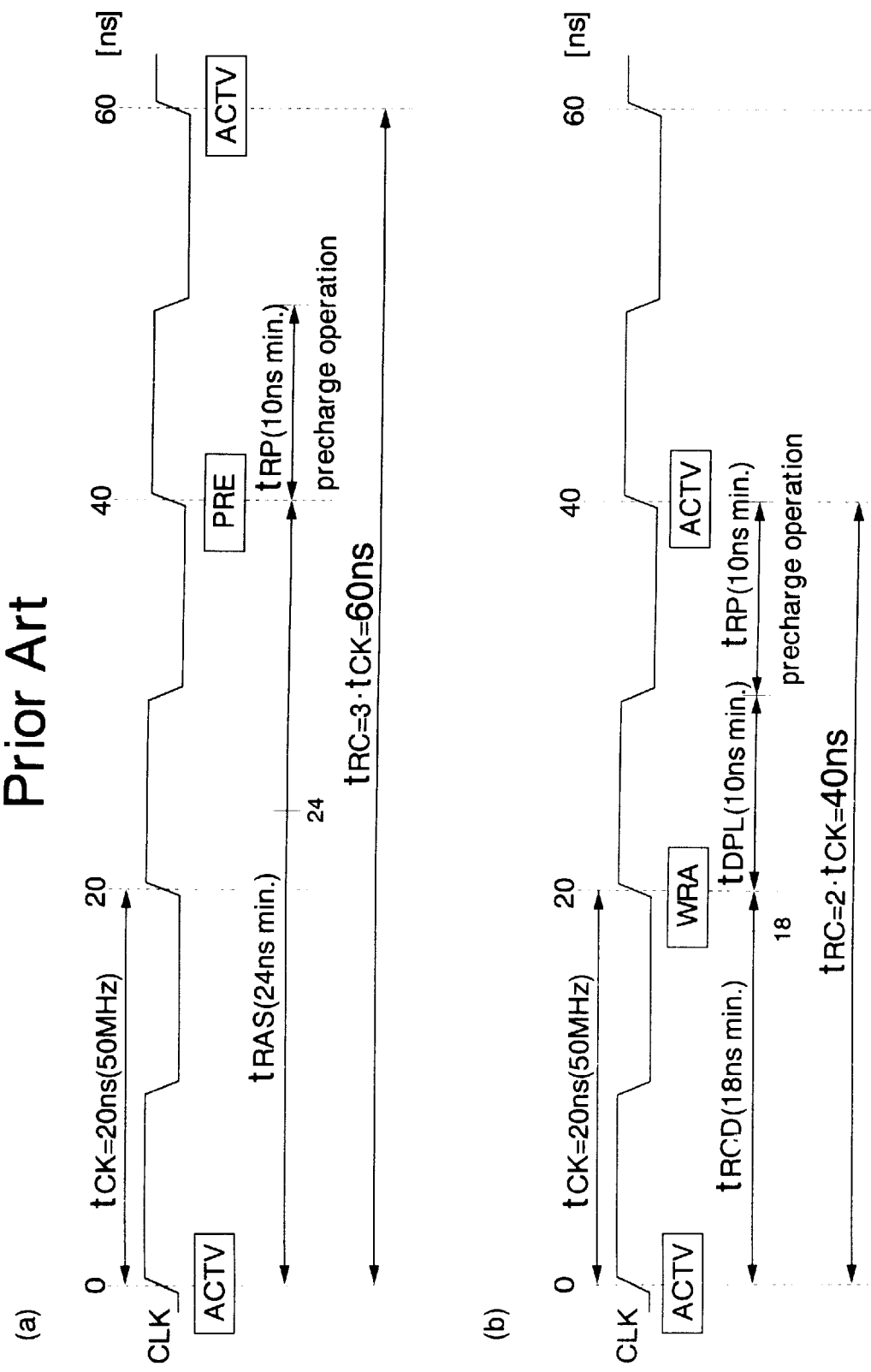
FIG. 2 is a timing chart showing the precharge operation of the SDRAM in the prior art.
Figure 3:
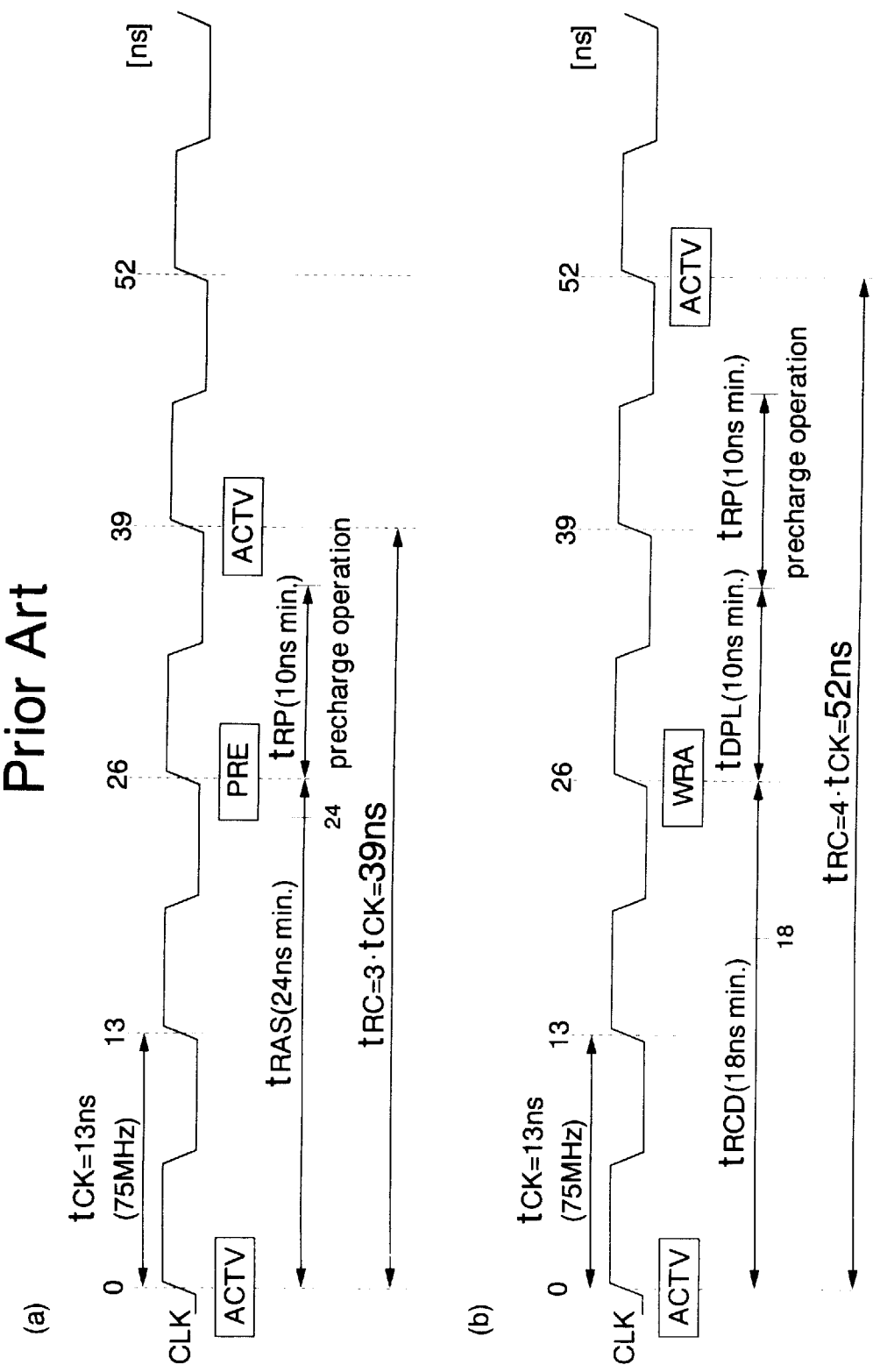
FIG. 3 is a timing chart showing another example of the precharge operation of the SDRAM in the prior art.
Figure 4:
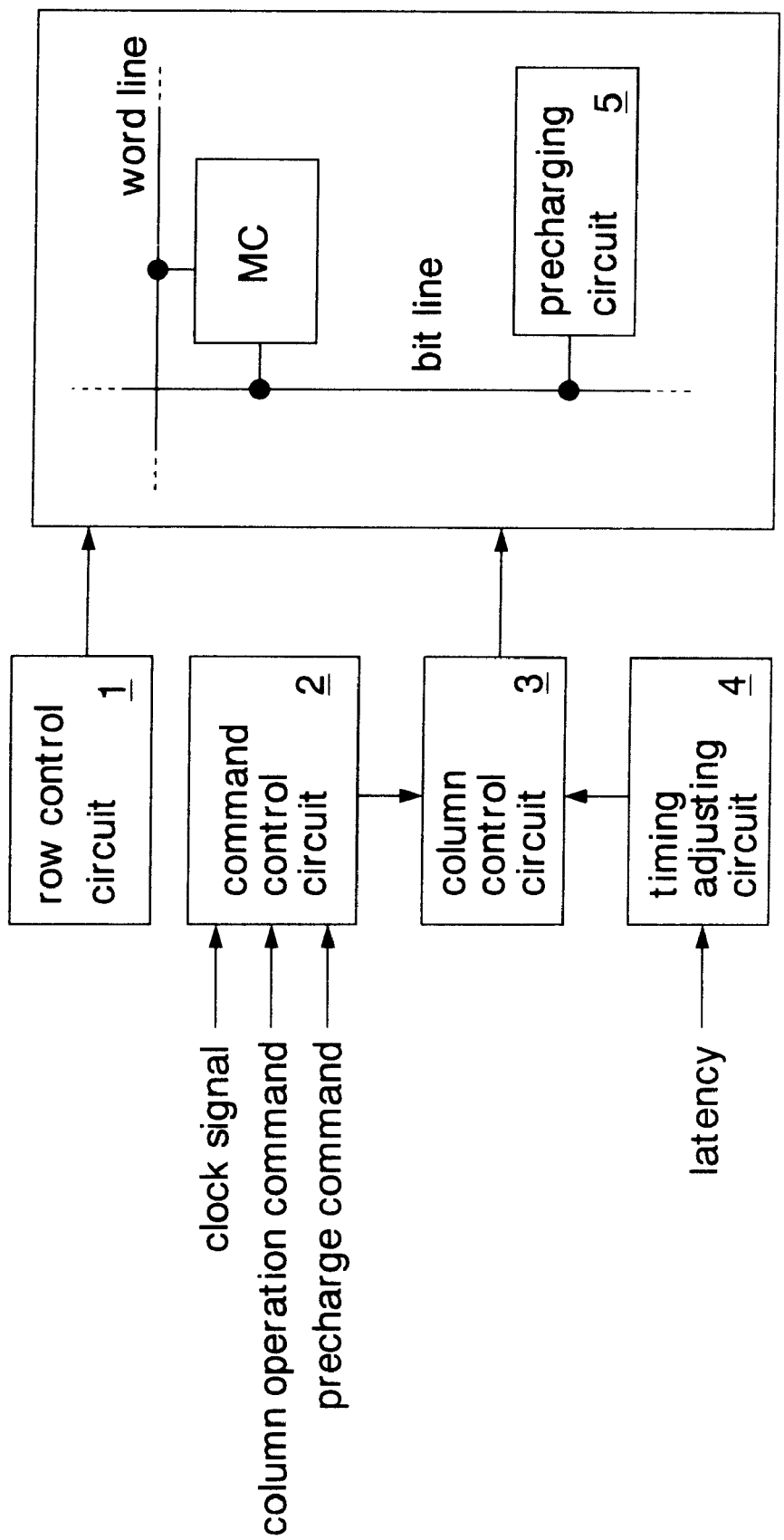
FIG. 4 is a block diagram showing the basic principles of a semiconductor integrated circuit and a method of controlling the semiconductor integrated circuit in the present invention.

FIG. 4 is a block diagram showing the basic principle of a semiconductor integrated circuit and a method of the same in the present invention.

The semiconductor integrated circuit comprises a plurality of memory cells MC connected to a word line, a row control circuit 1, a command control circuit 2, a column control circuit 3, a timing adjusting circuit 4, and a precharging circuit 5. In the semiconductor integrated circuit, when a read operation or a write operation to the memory cell MC is performed, the row control circuit 1 is first operated and the column control circuit 3 is subsequently operated. The timing adjusting circuit 4 has the function of varying a delay time in accordance with a latency, the delay time from the reception of a column operation command to the start of the operation of the column control circuit 3. Therefore, the column control circuit 3 is operated at the optimum timing in accordance with the frequency of a clock signal. Thus, the read operation or the write operation to the memory cell MC is performed.

Besides, when a bit line is precharged, the command control circuit 2 operates the precharging circuit 5 upon receiving a precharge command in synchronization with the clock signal. The timing adjusting circuit 4 also has the function of varying a delay time from the reception of the precharge command to the start of the precharging circuit 5. Under the control of the timing adjusting circuit 4, the precharging circuit 5 starts its operation the predetermined delay time after the reception of the precharge command. Then, the precharge operation is performed.

Figure 5:
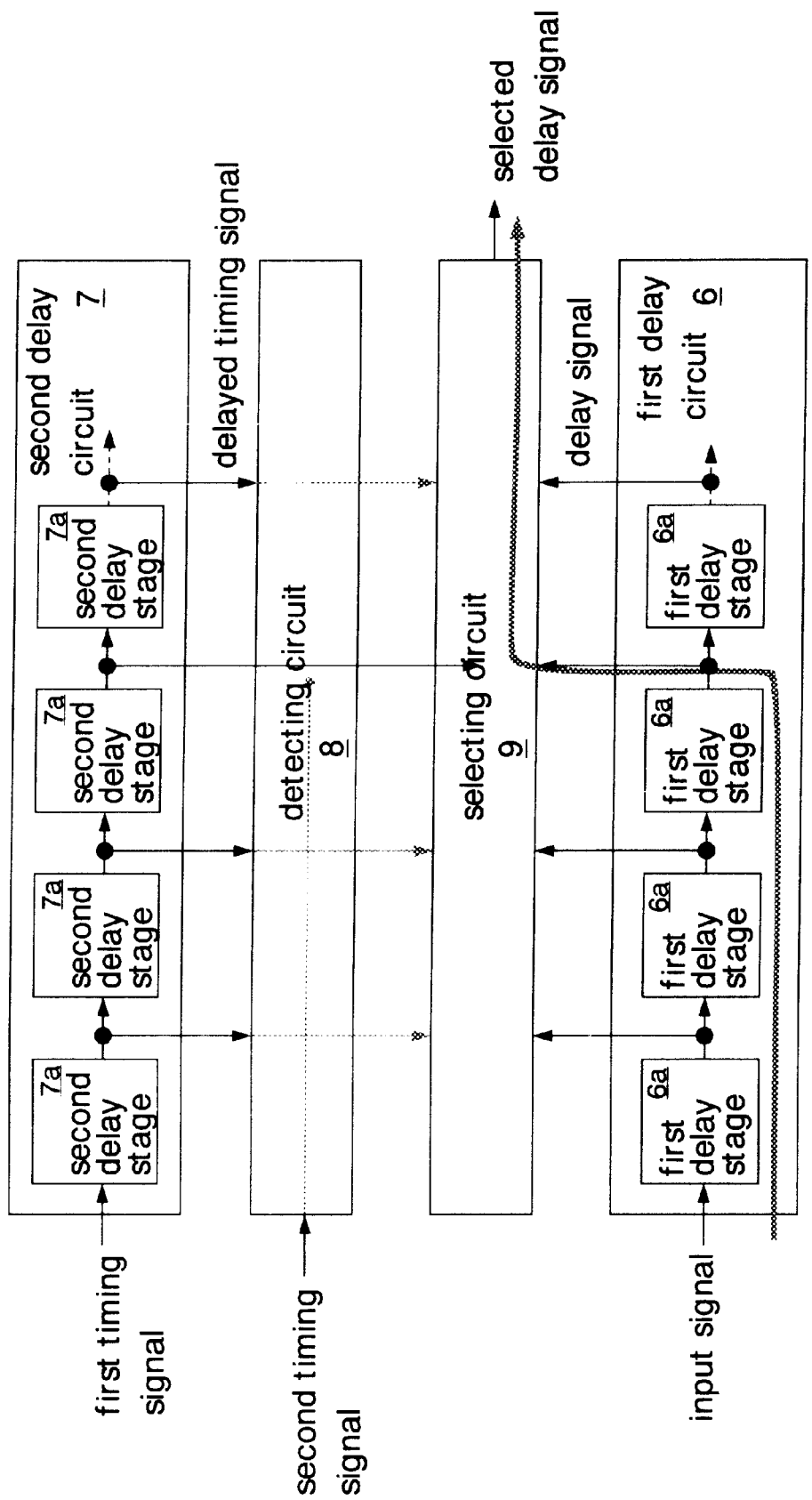
FIG. 5 is a block diagram showing the basic principle of a variable delay circuit in the present invention.

FIG. 5 is a block diagram showing the basic principle of a variable delay circuit in the present invention.

The variable delay circuit comprises a first delay circuit 6, a second delay circuit 7, a detecting circuit 8, and a selecting circuit 9. The first delay circuit 6 is constructed by connecting a plurality of first delay stages 6a in cascade and it receives an input signal at the initial one of the first delay stages. The second delay circuit 7 is constructed by connecting a plurality of second delay stages 7a identical to the first delay stages 6a in cascade and it receives a first timing signal at the initial one of the second delay stages. The detecting circuit 8 receives a second timing signal so as to detect that one of delayed timing signals outputted from the respective second delay stages 7a which has a transition edge adjacent to the transition edge of the second timing signal. The selecting circuit 9 selects a delay signal which is outputted from the first delay stage 6a corresponding to the second delay stage 7a that outputs the delayed timing signal detected by the detecting circuit 8.

As a result, the input signal can be delayed a time from the transition edge of the first timing signal to that of the second timing signal. Moreover, the delay time of the input signal can be adjusted by operating the detecting circuit 8 if necessary. For example, the power consumption can be reduced by changing the frequency of detecting the delay timing signal by the detecting circuit 8 from the exterior.

Figure 6:
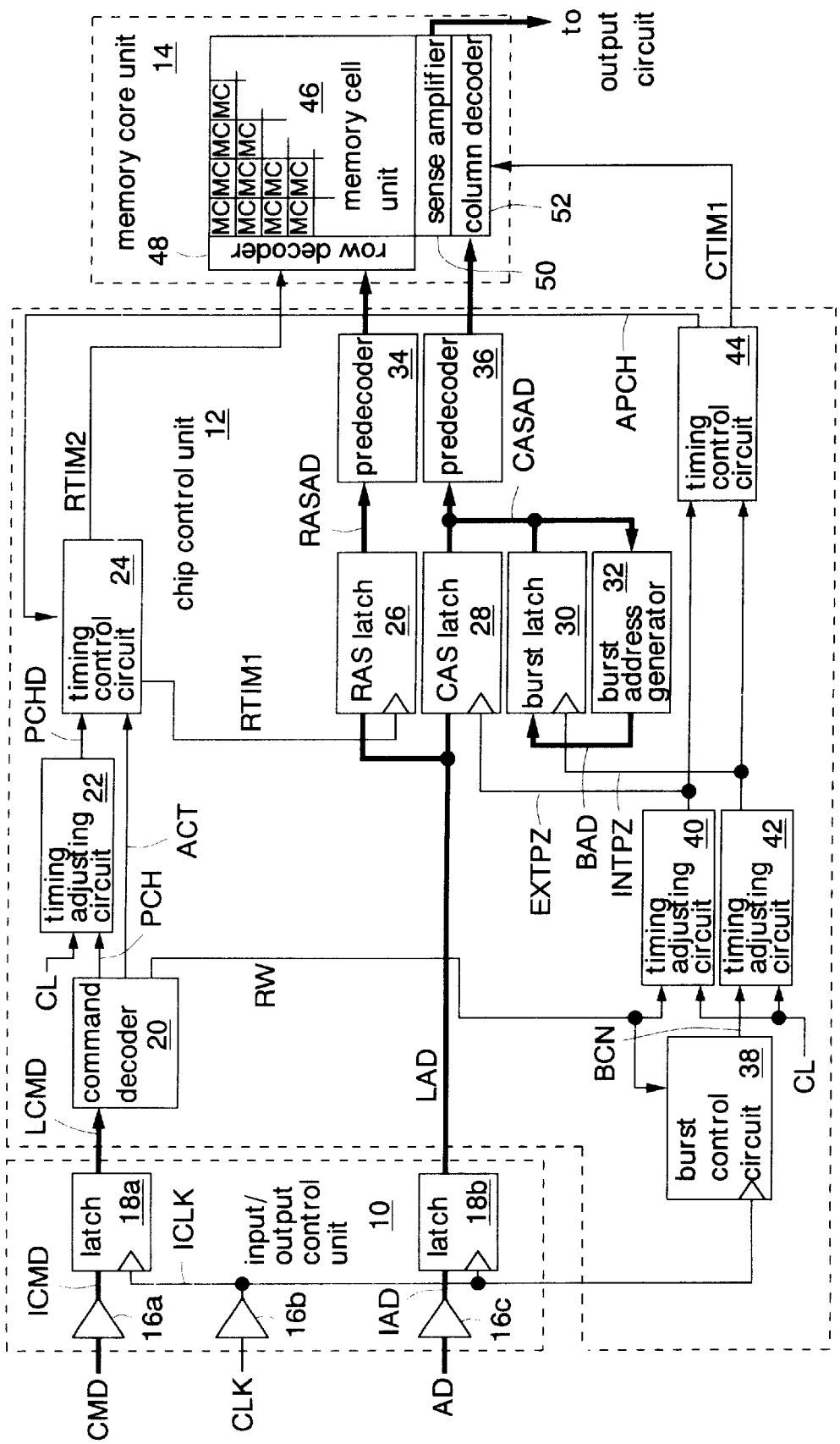
FIG. 6 is a block diagram showing the first embodiment of the semiconductor integrated circuit and the controlling method therefor.

FIG. 6 shows the first embodiment of the semiconductor integrated circuit and the controlling method therefor in the present invention.

The semiconductor integrated circuit of this embodiment is formed as an SDRAM on a silicon substrate by the use of CMOS process technology. This semiconductor integrated circuit comprises an input/output control unit 10, a chip control unit 12, and a memory core unit 14.

The input/output control unit 10 includes a plurality of input buffers 16a, 16b, 16c, and latches 18a, 18b.

The input buffer 16a receives a command signal CMD, and outputs the received signal as an internal command signal ICMD.

The input buffer 16b receives a clock signal CLK from the exterior, and outputs the received signal as an internal clock signal ICLK. The input buffer 16c receives an address signal AD, and outputs the received signal as an internal address signal IAD.

The latch 18a accepts the internal command signal ICMD in synchronization with the internal clock signal ICLK, and outputs the accepted signal as a latched command signal LCMD. The latch 18b accepts the internal address signal IAD in synchronization with the internal clock signal ICLK, and outputs the accepted signal as a latched address signal LAD.

In the following description, the names of signals shall be sometimes abbreviated such as "command signal CMD" to "CMD signal" and "clock signal CLK" to "CLK signal".

The chip control unit 12 includes a command, decoder 20, a timing adjusting circuit 22, a timing control circuit 24, a RAS latch 26, a CAS latch 28, a burst latch 30, a burst address generator 32, predecoders 34, 36, a burst control circuit 38, timing adjusting circuits 40, 42, and a timing control circuit 44.

The command decoder 20 corresponds to the command control circuit 2 shown in FIG. 4. The RAS latch 26, predecoder 34 and timing control circuit 24 correspond to the row control circuit 1 shown in FIG. 4. The CAS latch 28, burst latch 30, burst address generator 32, predecoder 36 and timing control circuit 44 correspond to the column control circuit 3 shown in FIG. 4.

The command decoder 20 receives the latched command signal LCMD and decodes the command thereof so as to generate any of command signals ACT, RW, PCH and the like, for controlling the basic circuits of the semiconductor integrated circuit. Here, the ACT signal is generated when the CMD signal for activating a word line has been fed. The RW signal is generated when the CMD signal corresponding to a read operation or a write operation has been fed. This RW signal corresponds to the column operation command indicated in FIG. 4. The PCH signal is generated when the CMD signal corresponding to a precharge operation has been fed. This PCH signal corresponds to the precharge command indicated in FIG. 4.

The timing adjusting circuit 22 receives a latency signal CL and the PCH signal and it delays the PCH signal in accordance with the latency signal CL so as to output the resulting signal as a delayed precharge signal PCHD. Here, the latency signal CL corresponds to the value of a CAS latency set by a mode register (not shown) or the like. The CAS latency is the number of clock cycles of the CLK signal from the reception of a read command to the outputting of read data. In this embodiment, when the CLK signal at 50 MHz is supplied, the CAS latency is set at "1" and at the same time the CL signal turns to low level. Besides, when the CLK signal of 75 MHz is supplied, the CAS latency is set at "2" land at the same time the CL signal turns to high level.

The timing control circuit 24 receives the PCHD signal and an auto precharge signal APCH fed from the timing control circuit 44, and it outputs row timing signals RTIM1, RTIM2 for controlling circuits relevant to row addresses.

The RAS latch 26 accepts a latched row address signal among the LAD signals in synchronization with the RTIM1 signal, and outputs the accepted signal as a row address signal RASAD.

The CAS latch 28 accepts a latched column address signal among the LAD signals in synchronization with a timing signal EXTPZ fed from the timing adjusting circuit 40, and it outputs the accepted signal as a column address signal CASAD.

The burst latch 30 accepts a burst address BAD in synchronization with a timing signal INTPZ fed from the timing adjusting circuit 42, and it outputs the accepted signal as a column address signal CASAD.

The burst address generator 32 receives the CASAD signal, and it increases the received address signal by 1 so as to output the resulting signal as the BAD signal.

The predecoder 34 generates a decoding signal by receiving the RASAD signal and outputs the decoding signal to the row decoder 48 of the memory core unit 14. The predecoder 36 generates a decoding signal by receiving the CASAD signal and outputs the decoding signal to the column decoder 52 of the memory core unit 14.

The burst control circuit 38 accepts the RW signal in synchronization with the ICLK signal and outputs a burst control signal BCN.

The timing adjusting circuit 40 receives the CL signal and the RW signal and it delays the RW signal in accordance with the CL signal so as to output the resulting signal as the timing signal EXTPZ. The timing adjusting circuit 42 receives the CL signal and the BCN signal and it delays the BCN signal in accordance with the CL signal so as to output the resulting signal as the timing signal INTPZ. Here, the EXTPZ signal is generated on the basis of the command signal CMD externally fed while the INTPZ signal is generated on the basis of the burst control signal BCN internally generated.

The timing control circuit 44 receives the timing signals EXTPZ, INTPZ and outputs the auto precharge signal APCH and a column timing signal CTIM1.

The memory core unit 14 includes a memory cell unit 46 having a plurality of memory cells MC, the row decoder 48, a sense amplifier 50, and the column decoder 52. In addition, the memory core unit 14 includes a bit line and a precharging circuit (not shown).

The row decoder 48 receives the RTIM2 signal and the predecoded signal from the predecoder 34, and it has the function of activating a word line (not shown) connected to the memory cells MC. The column decoder 52 receives the CTIM1 signal, and the predecoded signal from the predecoder 36, and it has the function of controlling a column switch (not shown) connected to the bit line. The sense amplifier 50 amplifies data transmitted from the memory cell MC through the bit line, and outputs the amplified signal to an output circuit.

Figure 7:
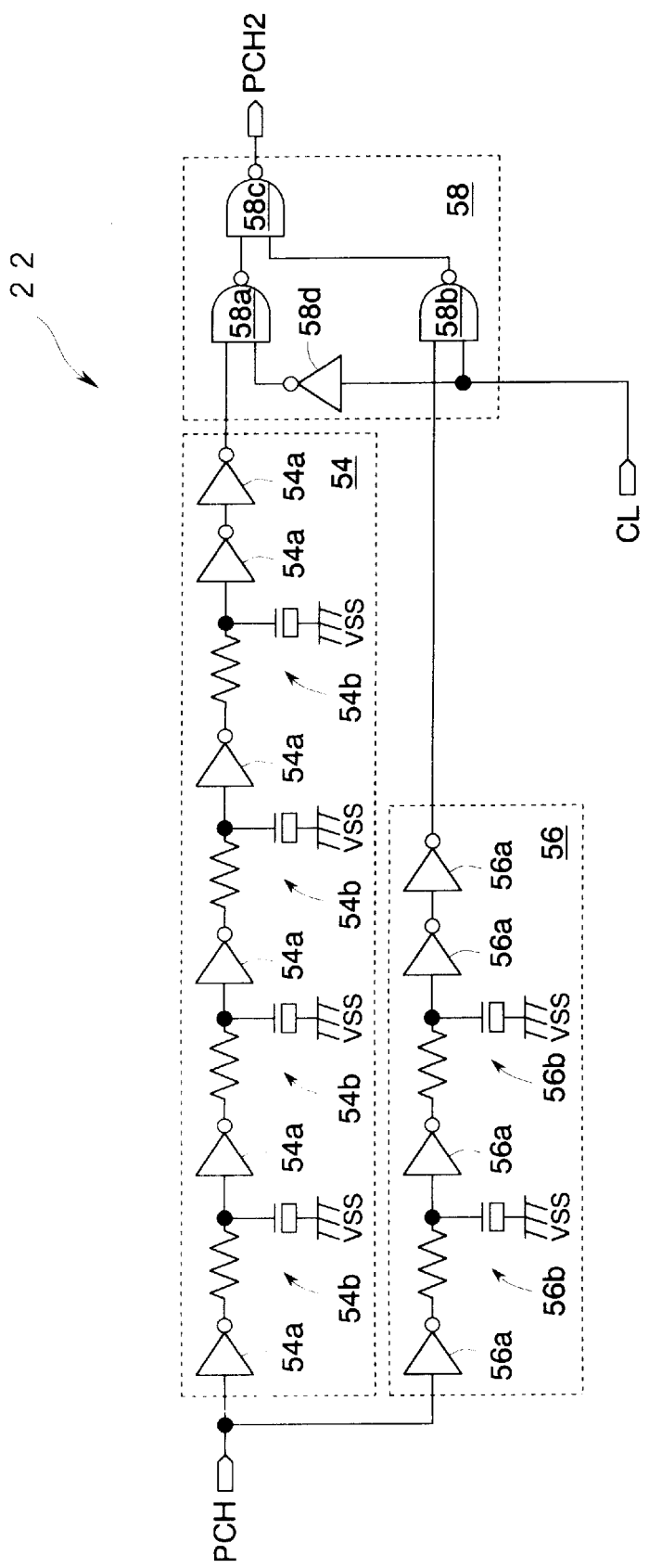
FIG. 7 is a circuit diagram showing a timing adjusting circuit shown in FIG. 6.

FIG. 7 shows the details of the timing adjusting circuit 22.

The timing adjusting circuit 22 includes delay circuits 54, 56, and a combinational circuit 58.

The delay circuit 54 is constructed that four CR time-constant circuits 54b are arranged among six inverters 54a connected in cascade. On the other hand, the delay circuit 56 is constructed that two CR time-constant circuits 56b are arranged among four inverters 56a connected in cascade. Each of the CR time-constant circuits 54b, 56b is constituted, for example, by a diffusion resistor and a MOS capacitor in which the source and the drain of an nMOS are connected to a ground line VSS. Both the delay circuits 54, 56 receive the PCH signal and output the resulting delayed signals to the combinational circuit 58.

The combinational circuit 58 is constructed of 2-input NAND gates 58a, 58b to which the output nodes of the delay circuits 54, 56 are respectively connected, a 2-input NAND gate 58c which outputs the logical sum between the outputs of the NAND gates 58a, 58b as a PCH2 signal, and an inverter 58d. The NAND gate 58a is fed with the inverted logic of the CL signal through the inverter 58d. The NAND gate 58b is fed with the CL signal.

At the low level of the CL signal, the combinational circuit 58 delays the received PCH signal by the delay circuit 54 and outputs the resulting signal as the PCH2 signal. At the high level of the CL signal, it delays the received PCH signal by the delay circuit 56 and outputs the resulting signal as the PCH2 signal. In this embodiment, the PCH2 signal is delayed by 4 ns from the PCH signal at the low level of CL signal and it is delayed by 2 ns from the PCH signal at the high level of the CL signal.

Figure 8:
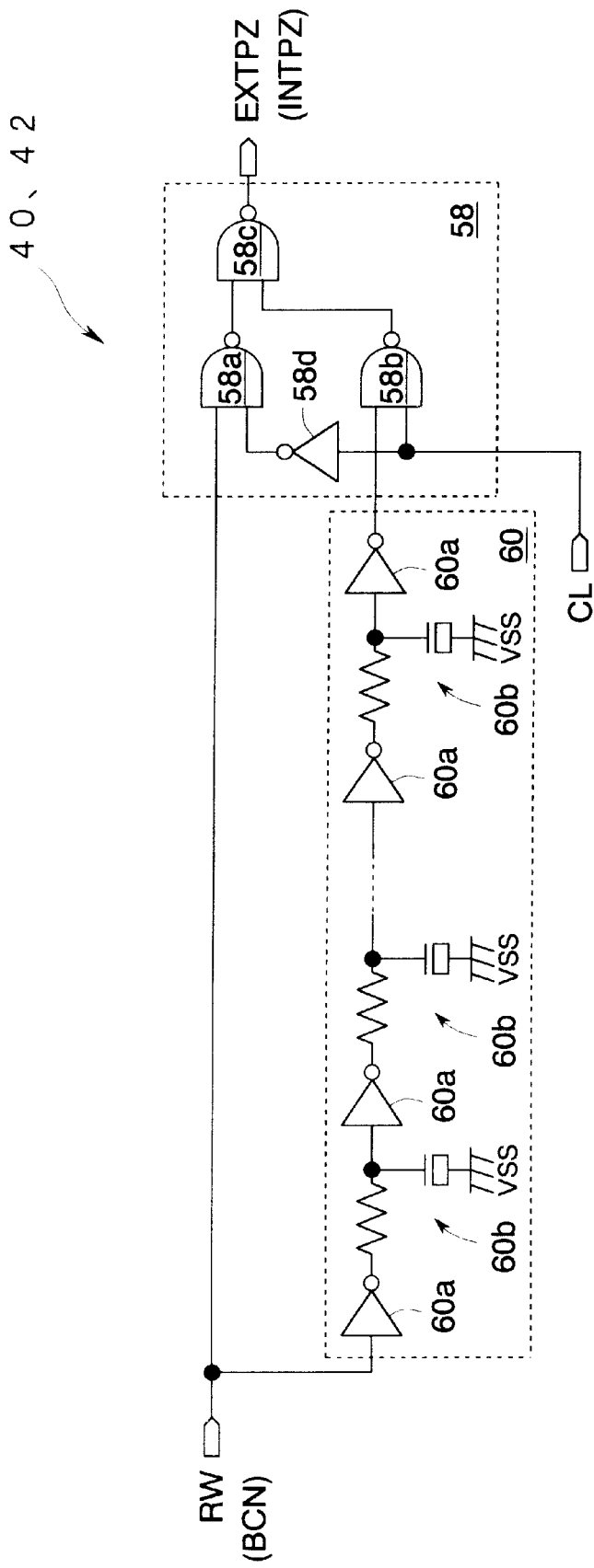
FIG. 8 is a circuit diagram showing another timing adjusting circuit shown in FIG. 6.

FIG. 8 shows the details of each of the timing adjusting circuits 40, 42.

Each of the timing adjusting circuits 40, 42 is configured of a delay circuit 60 and a combinational circuit 58.

The delay circuit 60 includes a plurality of CR time-constant circuits 60b arranged among an even number of inverters 60a connected in cascade. Each of the CR time-constant circuits 60b is constituted, for example, by a diffusion resistor, and a MOS capacitor in which the source and drain of an nMOS are connected to a ground line VSS. The delay circuit 60 receives the RW (or BCN) signal and outputs the resulting delayed signal to the combinational circuit 58.

At the low level of the CL signal, the timing adjusting circuit 40 (or 42) outputs the received RW (or BCN) signal as the EXTPZ (or INTPZ) signal without the delaying and at the high level of the CL signal, it delays the received RW (or BCN) signal by the delay circuit 60 and outputs the resulting signal as the EXTPZ (or INTPZ) signal. In this embodiment, the timing adjusting circuit 40 (or the INTPZ signal of the timing adjusting circuit 42) delays the EXTPZ signal by 5 ns from the RW signal (or BCN signal) at the high level of the CL signal.

Next, the operation of the above SDRAM will be described.

Figure 9:
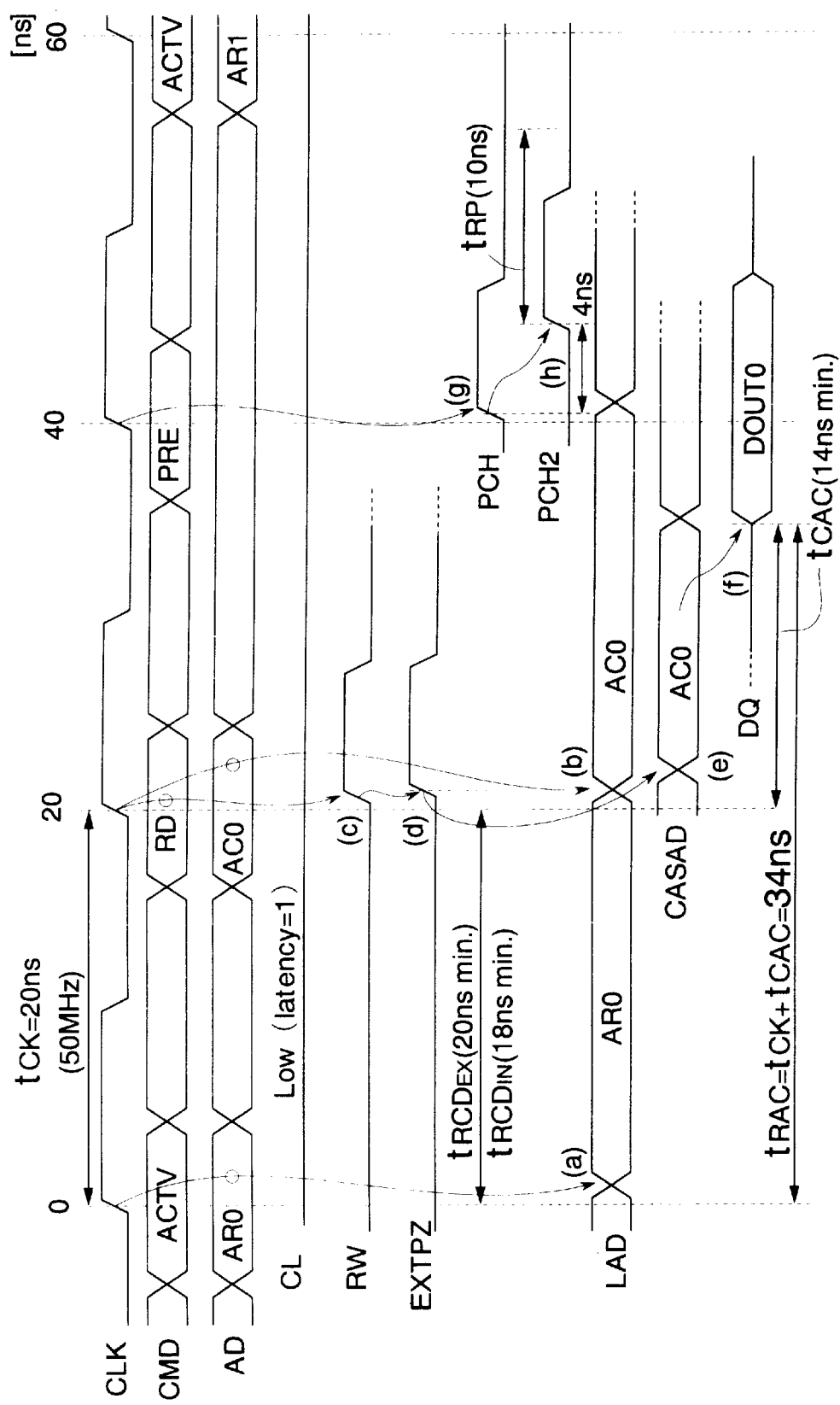
FIG. 9 is a timing chart showing the read operation and precharge operation of the SDRAM in the first embodiment.

FIG. 9 shows a read operation and a precharge operation of the SDRAM in the case where the cycle "tCK" of the CLK signal is 20 ns (50 MHz). In this embodiment, the minimum time of a "tRCDEX" as an external specification is set at 13 ns, and the minimum time of a "tRCDIN" as an internal specification is set at 18 ns. Here, the external specification is a value, which the users of the SDRAM must observe, while the internal specification is the actual value of the semiconductor integrated circuit. In addition, the minimum time of a "tCAC" and that of a "tRP" are respectively set at the same values; 14 ns and 10 ns as in the prior art. Besides, in the case of 50 MHz, a CAS latency is "1", and hence, the CL signal is held at the low level.

First, the latches 18a, 18b shown in FIG. 6 accept the ACTV command and the row address signal AD (AR0) in synchronization with the rising edge of the CLK signal (ICLK signal), so as to output the latched command signal LCMD and the latched address signal LAD, respectively (FIG. 9(a)). The command decoder 20 activates the PCH signal upon receiving the LCMD signal. Then, the timing control circuit 24, the RAS latch 26 and the predecoder 34 are operated and the row decoder 48 is activated.

The minimum time of the tRCDEX (13 ns) is less than the cycle of the CLK signal (tCK=20 ns). Therefore, the SDRAM can receive the RD command at the rising edge of the CLK signal (at 20 ns) next to that of the CLK signal corresponding to the reception of the ACTV command.

Subsequently, the latches 18a, 18b accept the RD command and the column address signal AD (AC0) in synchronization with the rising edge of the CLK signal (ICLK signal) (at 20 ns) so as to output the latched command signal LCMD and the latched address signal LAD, respectively (FIG. 9(b)). The command decoder 20 activates the RW signal upon receiving the RD command (FIG. 9(c)).

The timing adjusting circuit 40 shown in FIG. 8 receives the RW signal and outputs the received signal as the EXTPZ signal without delaying the received signal (FIG. 9(d)). The CAS latch 28 shown in FIG. 6 accepts the LAD signal in synchronization with the EXTPZ signal and outputs the accepted signal as the CASAD signal (FIG. 9(e)). Then, the timing control circuit 44 and the predecoder 36 are operated and the column decoder 52 is activated. Thereafter, the data read out of the memory cell MC is amplified by the sense amplifier 50, and the amplified data is outputted as read data DOUT0 from a data input/output terminal DQ through the output circuit (FIG. 9(f)). As a result, an access time "tRAC" from the reception of the ACTV command to the outputting of the read data DOUT0 becomes the same value; 34 ns (tCK+tCAC) as in the prior art.

Besides, the latches 18a, 18b accept the PRE command in synchronization with the next rising edge of the CLK signal (at 40 ns). The command decoder 20 activates the PCH signal upon receiving the PRE command (FIG. 9(g)).

The timing adjusting circuit 22 shown in FIG. 7 delays the PCH signal by 4 ns and outputs the delayed signal as the PCH2 signal (FIG. 9(h)). The timing control circuit 24 controls the precharge operation upon receiving the PCH2 signal. The precharge operation is performed during the period of the tRP (10 ns). Therefore, the SDRAM can accept the next ACTV command in synchronization with the next rising edge of the CLK signal (at 60 ns).

Figure 10:
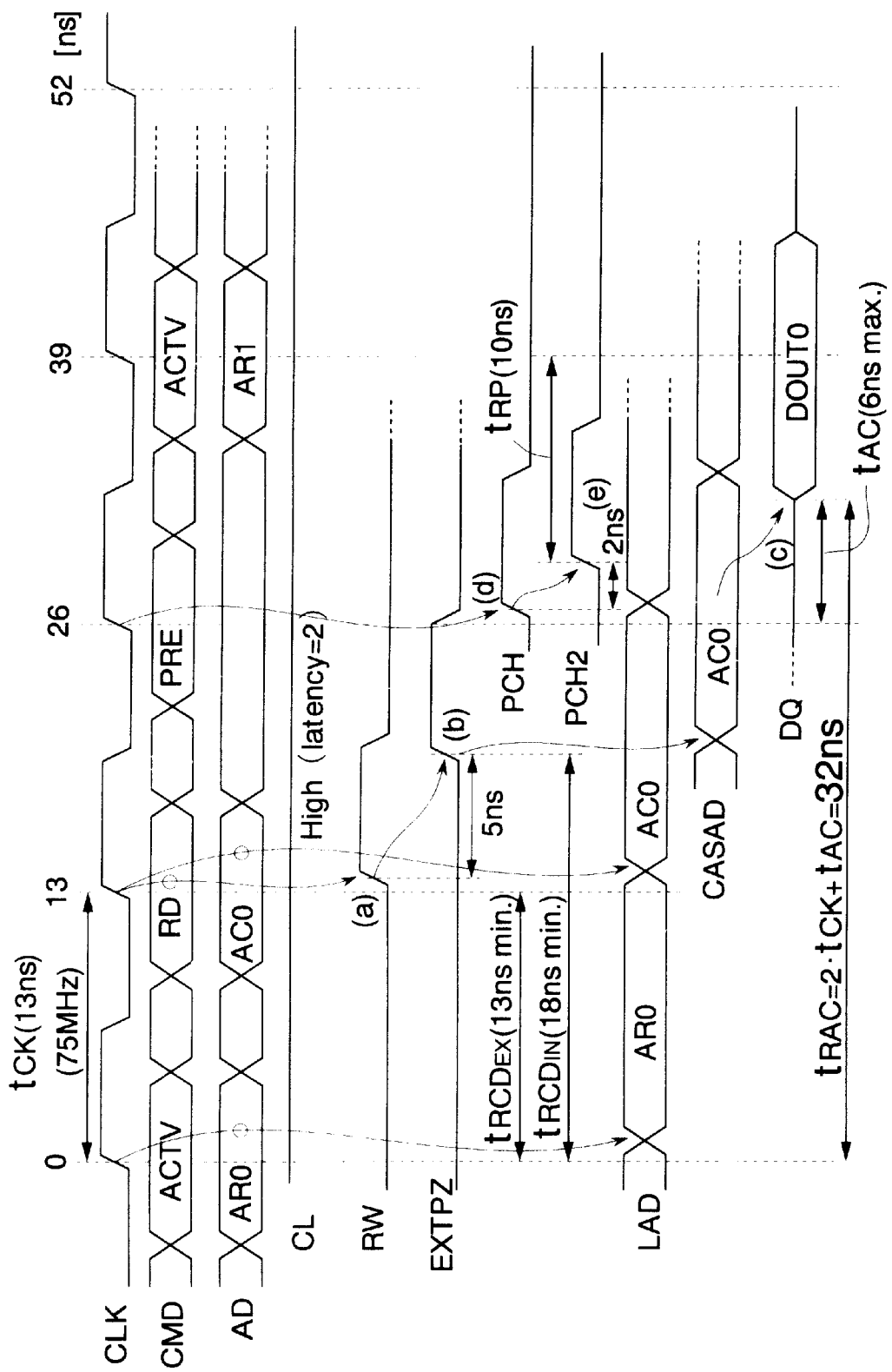
FIG. 10 is a timing chart showing another example of the read operation and precharge operation of the SDRAM in the first embodiment.

FIG. 10 shows the read operation and the precharge operation of the SDRAM in the case where the cycle "tCK" of the CLK signal is 13 ns (75 MHz). The minimum time of a "tRCDEX" (13 ns), the minimum time of a "tRCDIN" (18 ns) and the minimum time of a "tRP" (10 ns) are the same as in FIG. 9. In addition, the maximum time of a "tAC" t is set at 6 ns. In the case of 75 MHz, a CAS latency is "2" and hence, the CL signal is held at the high level.

First, in the same manner as in FIG. 9, the SDRAM activates the row decoder 48 shown in FIG. 6 upon receiving the ACTV command.

The minimum time of the tRCDEX (13 ns) is equal to the cycle of the CLK signal(tCK=13 ns). Therefore, the SDRAM can receive the RD command at the rising edge of the CLK signal (at 13 ns) next to that of the CLK signal corresponding to the reception of the ACTV command.

Subsequently, in the same manner as in FIG. 9, the SDRAM activates the RW signal upon receiving the RD command (FIG. 10(a)). The timing adjusting circuit 40 shown in FIG. 8 receives the RW signal, delays the received signal by 5 ns, and outputs the delayed signal as the EXTPZ signal (FIG. 10(b). The tRCDIN becomes 18 ns which is greater than one cycle of the CLK signal (tCK=13 ns) owing to the delay of the EXTPZ signal by 5 ns by the timing adjusting circuit 40. Thereafter, read data DOUT0 is outputted in the same manner as in FIG. 9 (FIG. 10(c)).

As a result, an access time "tRAC" from the reception of the ACTV command to the outputting of the read data DOUT0 becomes 32 ns (tCK+tAC) which is 13 ns shorter than in the prior art. Since the tRAC is shortened, the bus occupation rate of data is substantially increased. That is, the performance of a system employing the SDRAM is enhanced.

Besides, the SDRAM receives the PRE command in synchronization with the next rising edge of the CLK signal (at 26 ns) and activates the PCH signal (FIG. 10(d)).

The timing adjusting circuit 22 shown in FIG. 7 delays the PCH signal by 2 ns, and outputs the delayed signal as the PCH2 signal (FIG. 10(e)). The timing control circuit 24 controls the precharge operation upon receiving the PCH2 signal. The precharge operation is performed during the period of the tRP (10 ns). Therefore, the SDRAM can receive the next ACTV command in synchronization with the next rising edge of the CLK signal (at 39 ns).

Figure 11:
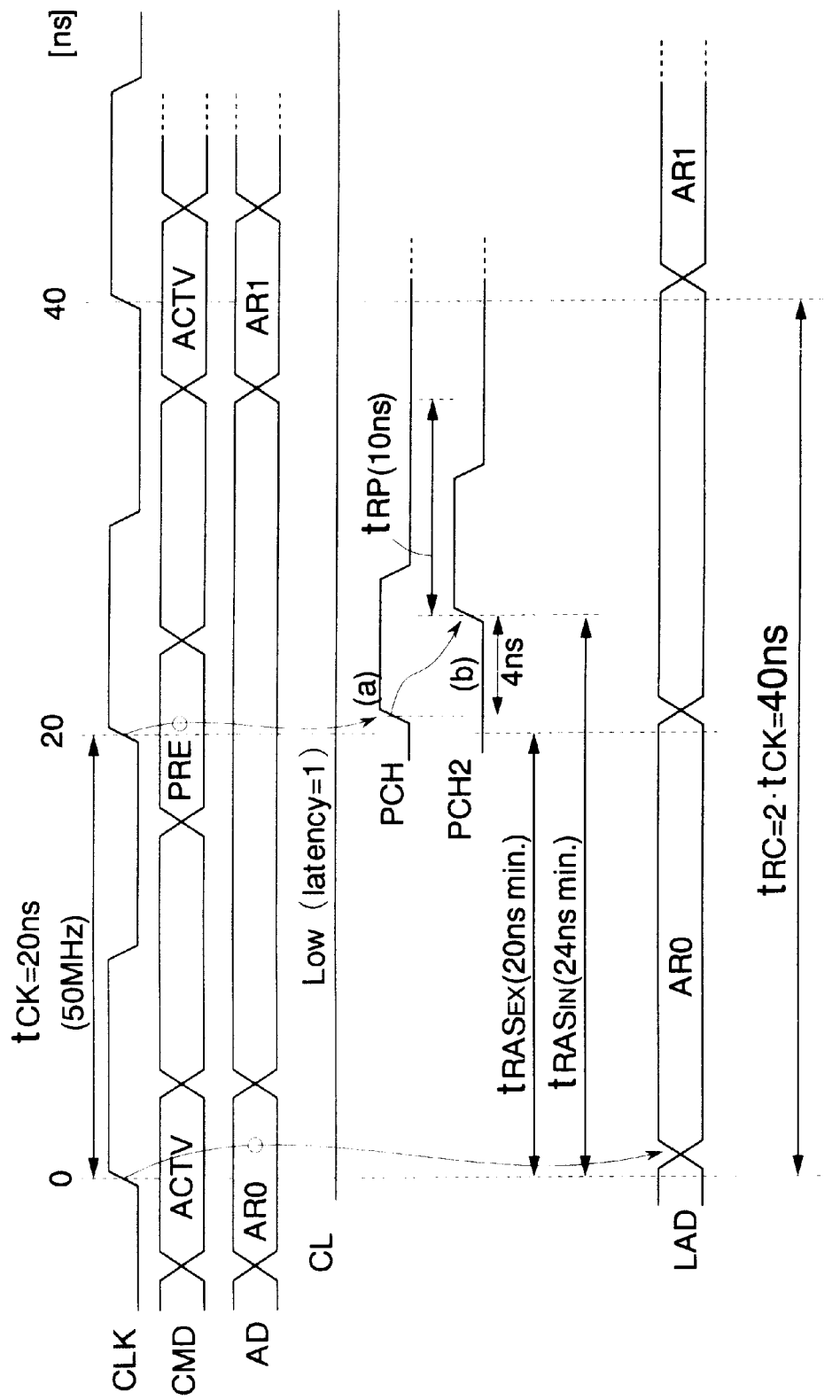
FIG. 11 is a timing chart showing the precharge operation of the SDRAM in the first embodiment.
Figure 15:
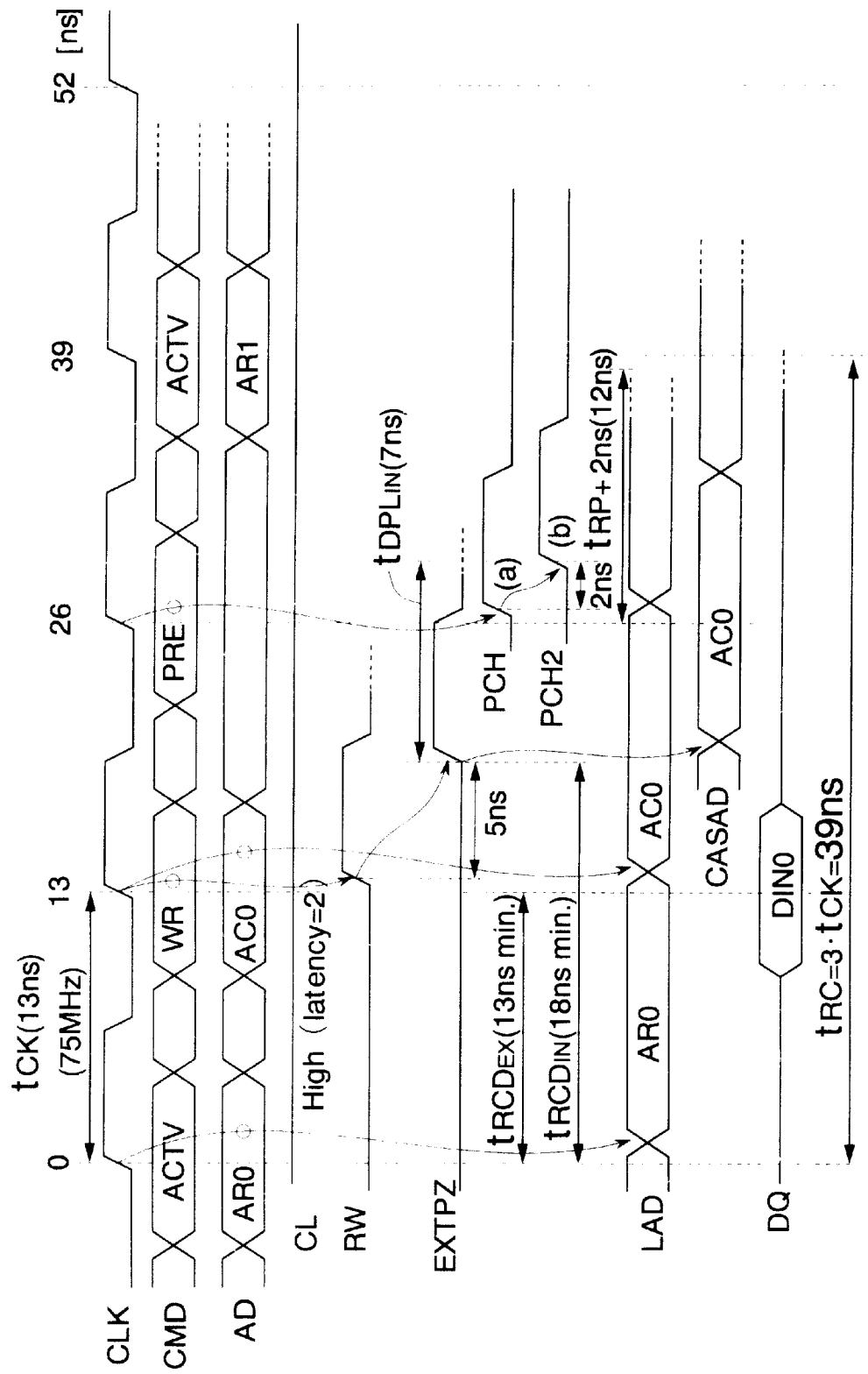
FIG. 15 is a timing chart showing the write operation and precharge operation of the SDRAM in the first embodiment.

Incidentally, the reasons of delaying the PCH2 signals by 4 ns and 2 ns will be elucidated with reference to FIG. 11 and FIG. 15.

FIG. 11 shows the precharge operation of the SDRAM in the case where the cycle "tCK" of the CLK signal is 20 ns (50 MHz). In this embodiment, the minimum time of a "tRASEX" as an external specification is set at 20 ns and the minimum time of a "tRASIN" as an internal specification is set at 24 ns.

First, in the same manner as in FIG. 9, the SDRAM activates the row decoder 48 shown in FIG. 6, upon receiving the ACTV command.

The minimum time of the tRASEX (20 ns)is equal to the cycle of the CLK signal (tCK=20 ns). Therefore, the SDRAM can receive the PRE command at the rising edge of the CLK signal (at 20 ns) next to that of the CLK signal corresponding to the reception of the ACTV command.

Subsequently, in the same manner as in FIG. 9, the SDRAM activates the PCH signal upon receiving the PRE command (FIG. 11(a)).

The timing adjusting circuit 22 shown in FIG. 7 receives the PCH signal, delays the received signal by 4 ns, and outputs the delayed signal as the PCH2 signal (FIG. 11(b)). The tRASIN becomes 24 ns which is greater than one cycle of the CLK signal (tCK=20 ns) owing to the delay of the PCH2 signal by 4 ns by the timing adjusting circuit 22. Thereafter, in the same manner as in FIG. 9, the timing control circuit 24 controls the precharge operation upon receiving the PCH2 signal. The precharge operation is performed during the period of the tRP (10 ns). Therefore, the SDRAM can receive the next ACTV command in synchronization with the next rising edge of the CLK signal (at 40 ns).

As a result, a cycle time "tRC" from the reception of the ACTV command to that of the next ACTV command becomes 40 ns (2·tCK) which is one clock cycle shorter than in the prior art.

Figure 12:
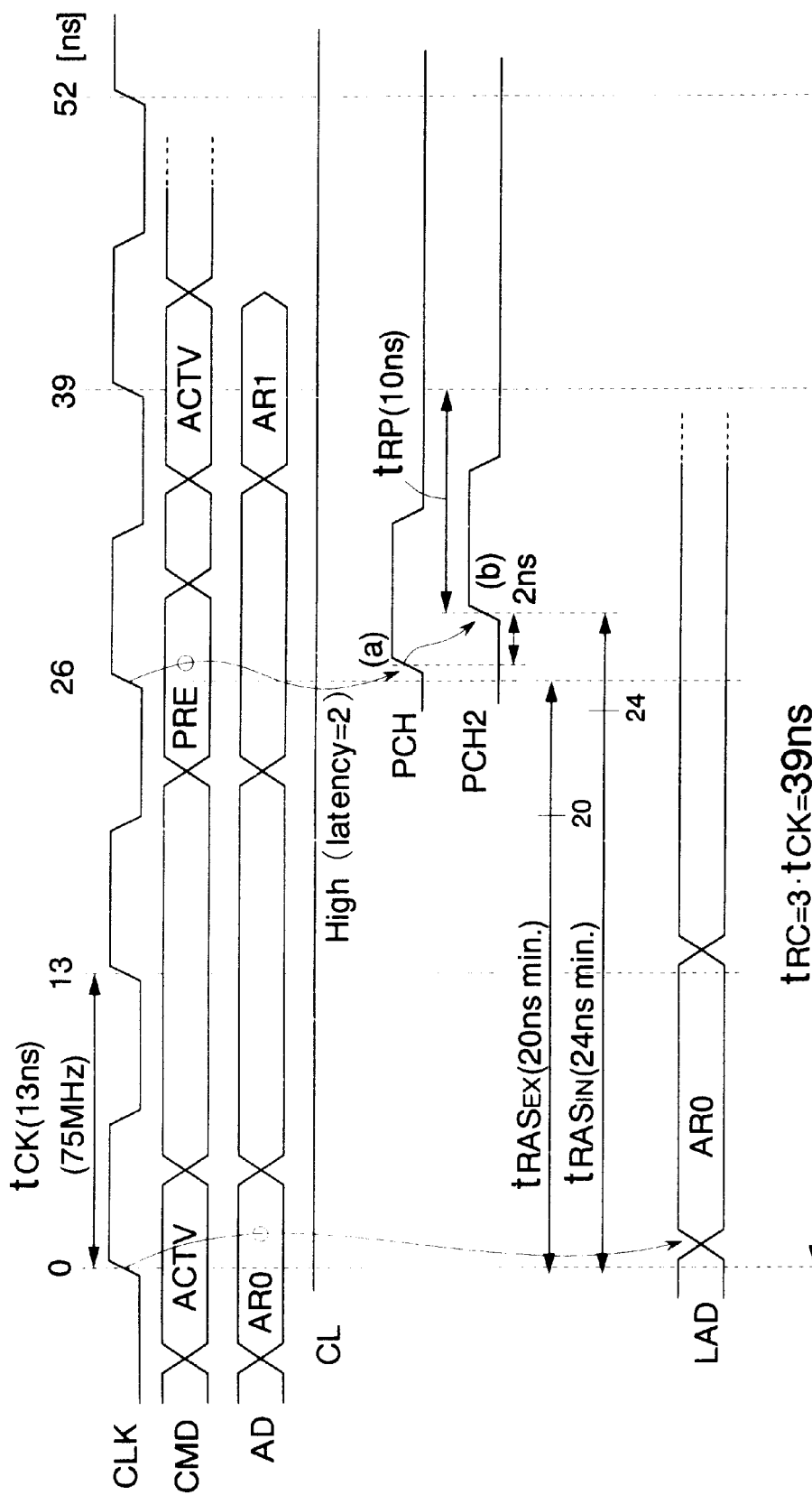
FIG. 12 is a timing chart showing another example of the precharge operation of the SDRAM in the first embodiment.

FIG. 12 shows the precharge operation of the SDRAM in the case where the cycle "tCK", of the CLK signal is 13 ns (75 MHz). The minimum times of a "tRASEX" and a "tRASIN" are respectively set at the same values; 20 ns and 24 ns as in FIG. 11.

First, in the same manner as in FIG. 9, the SDRAM activates the row decoder 48 shown in FIG. 6, upon receiving the ACTV command.

The minimum time (20 ns) of the tRASEX is less than two cycles of the CLK signal (26 ns). Therefore, the SDRAM can receive the PRE command at the second rising edge of the CLK signal (at 26 ns) with respect to that of the CLK signal corresponding to the reception of the ACTV command.

Subsequently, in the same manner as in FIG. 9, the SDRAM activates the PCH signal upon receiving the PRE command (FIG. 12(a)).

The timing adjusting circuit 22 shown in FIG. 7 delays the PCH signal by 2 ns, and outputs the delayed signal as the PCH2 signal (FIG. 12(b)). Therefore, the activation timing of the PCH2 signal satisfies the tRASIN (24 ns). Thereafter, in the same manner as in FIG. 9, the timing control circuit 24 controls the precharge operation upon receiving the PCH2 signal. The precharge operation is performed during the period of the TRP (10 ns). Therefore, the SDRAM can receive the next ACTV command in synchronization with the next edge of the CLK signal (at 39 ns)

As a result, a cycle time "tRC" (/RAS Cycle time) from the reception of the ACTV command to that of the next ACTV command becomes the same value; 39 ns (3·tCK) as in the prior art, in spite of the additional provision of the timing adjusting circuit 22.

Figure 13:
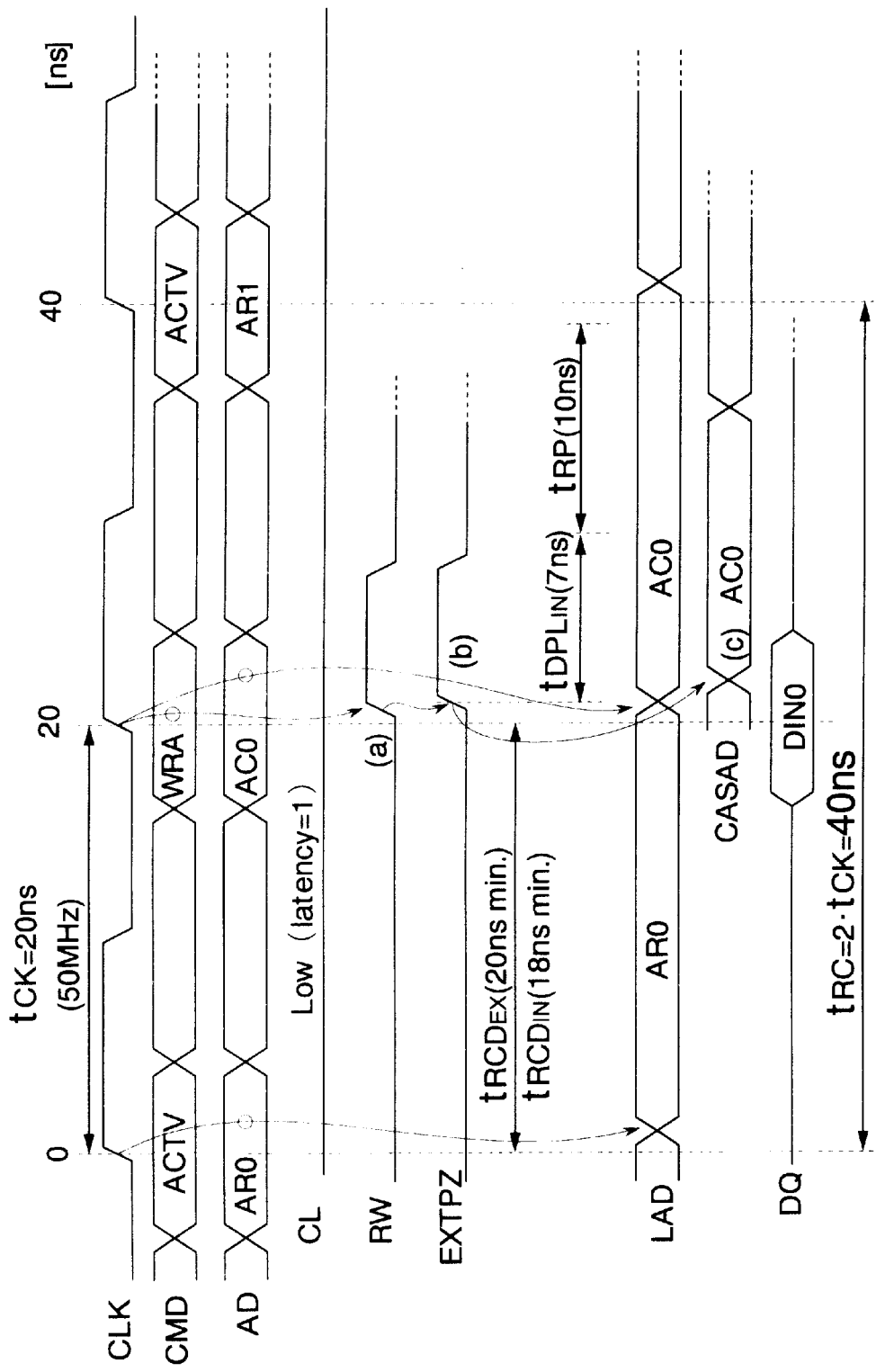
FIG. 13 is a timing chart showing the write operation of the SDRAM in the first embodiment as is attended with the precharge operation thereof.

FIG. 13 shows the write operation of the SDRAM attended with the precharge operation thereof in the case where the cycle "tCK" of the CLK signal is 20 ns (50 MHz). In this embodiment, the minimum time of a "tDPL" is set at 10 ns. The tDPL is a specified value from the rising edge of the CLK signal, and a "tDPLIN" which is an actual value from the rising edge of the EXTPZ signal becomes 7 ns. The operation in FIG. 13 will be described using the tDPLIN.

First, in the same manner as in FIG. 9, the SDRAM activates the row decoder 48 shown in FIG. 6, upon receiving the ACTV command.

The minimum time (18 ns) of a "tRCDIN" is less than the cycle of the CLK signal (tCK=20 ns). Therefore, the SDRAM can receive the WRA command at the rising edge of the CLK signal (at 20 ns) next to that of the CLK signal corresponding to the reception of the ACTV command.

Subsequently, the SDRAM accepts the WRA command, a write address (AC0) and write data (DIN0) in synchronization with the rising edge of the CLK signal (ICLK signal) (at 20 ns). The command decoder 20 activates the RW signal upon receiving the WRA command (FIG. 13(a)).

The timing adjusting circuit 40 shown in FIG. 8 outputs the RW signal as the EXTPZ signal without delaying the RW signal (FIG. 13(b)). The CAS latch 28 shown in FIG. 6 accepts the LAD signal in synchronization with the EXTPZ signal, and outputs the accepted signal as the CASAD signal (FIG. 13(c)). Then, the timing control circuit 44 and predecoder 36 are operated and the column decoder 52 is activated. Thereafter, the write data DIN0 is written into the memory cell MC.

Besides, the SDRAM starts the precharge operation the tDPLIN (7 ns) after the rising edge of the EXTPZ signal. The precharge operation is performed during the period of a "tRP" (10 ns). Therefore, the SDRAM can accept the next ACTV command in synchronization with the next rising edge of the CLK signal (at 40 ns).

As a result, a cycle time "tRC" from the reception of the ACTV command to that of the next ACTV command becomes the same value; 40 ns (2·tCK) as in the prior art.

Figure 14:
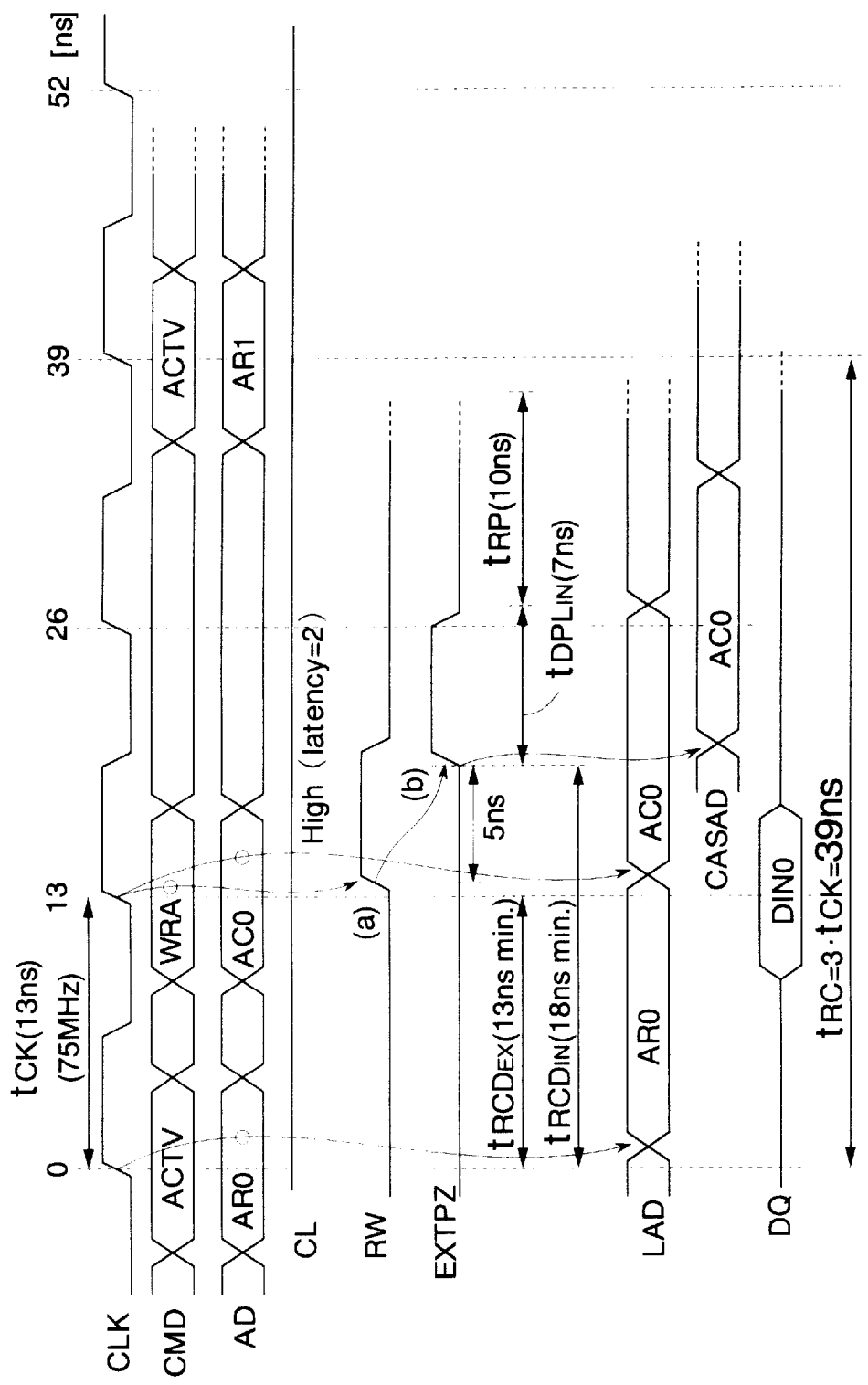
FIG. 14 is a timing chart showing another example of the write operation of the SDRAM in the first embodiment as is attended with the precharge operation thereof.

FIG. 14 shows the write operation of the SDRAM attended with the precharge operation thereof in the case where the cycle "tCK" of the CLK signal is 13 ns (75 MHz).

First, in the same manner as in FIG. 9, the SDRAM activates the row decoder 48 shown in FIG. 6, upon receiving the ACTV command.

The minimum time (13 ns) of a "tRCDEX" is equal to the cycle of the CLK signal (13 ns). Therefore, the SDRAM can receive the WRA command at the rising edge of the CLK signal (at 13 ns) next to that of the CLK signal corresponding to the reception of the ACTV command.

Subsequently, in the same manner as in FIG. 13, the SDRAM accepts the WRA command, a write address (AC0) and write data (DIN0) in synchronization with the rising edge of the CLK signal (ICLK signal) (at 13 ns). The SDRAM activates the RW signal upon receiving the WRA command (FIG. 14(a)).

The timing adjusting circuit 40 shown in FIG. 8 receives the RW signal, delays the received signal by 5 ns, and outputs the delayed signal as the EXTPZ signal (FIG. 14(b)). A "tRCDIN" becomes 18 ns owing to the delay of the EXTPZ signal by 5 ns by the timing adjusting circuit 40, in the same manner as in FIG. 10.

Thereafter, in the same manner as in FIG. 13, the timing control circuit 44 and the predecoder 36 are operated to activate the column decoder 52, and the write data DIN0 is written into the memory cell MC.

Besides, the SDRAM starts the precharge operation a "tDPLIN" (7 ns) after the rising edge of the EXTPZ signal. The precharge operation is performed during the period of a "tRP", (10 ns). Therefore, the SDRAM can accept the next ACTV command in synchronization with the next rising edge of the CLK signal (at 39 ns).

As a result, a cycle time "tRC" from the reception of the ACTV command to that of the next ACTV command becomes 39 ns (3·tCK) which is one clock cycle shorter than in the prior art.

In consequence, the bus occupation rate of data is substantially increased and the performance of a system employing the SDRAM is enhanced.

FIG. 15 shows the write operation and the precharge operation of the SDRAM in the case where the cycle "tCK" of the CLK signal is 13 ns (75 MHz). Until the third rising edge of the CLK signal (at 26 ns), the timings of the operations are the same as in FIG. 14 and the description thereof shall be omitted here.

The SDRAM activates the PCH signal upon receiving the PRE command in synchronization with the rising edge of the CLK signal (at 26 ns) (FIG. 15(a)).

The timing adjusting circuit 22 shown in FIG. 7 receives the PCH signal, delays the received signal by 2 ns, and outputs the delayed signal as the PCH2 signal (FIG.15(b)). A "tDPLIN" becomes 7 ns owing to the delay of the PCH2 signal by 2 ns by the timing adjusting circuit 22 (FIG. 15(c)).

Thereafter, the timing control circuit 24 controls the precharge operation upon receiving the PCH2 signal. The precharge operation is performed during the period of a "tRP" (10 ns). Therefore, the SDRAM can receive the next ACTV command in synchronization with the next rising edge of the CLK signal (at 39 ns).

That is, a cycle time "tRC" becomes the same value; 39 ns (3·tCK) as in FIG. 14.

Figure 16:
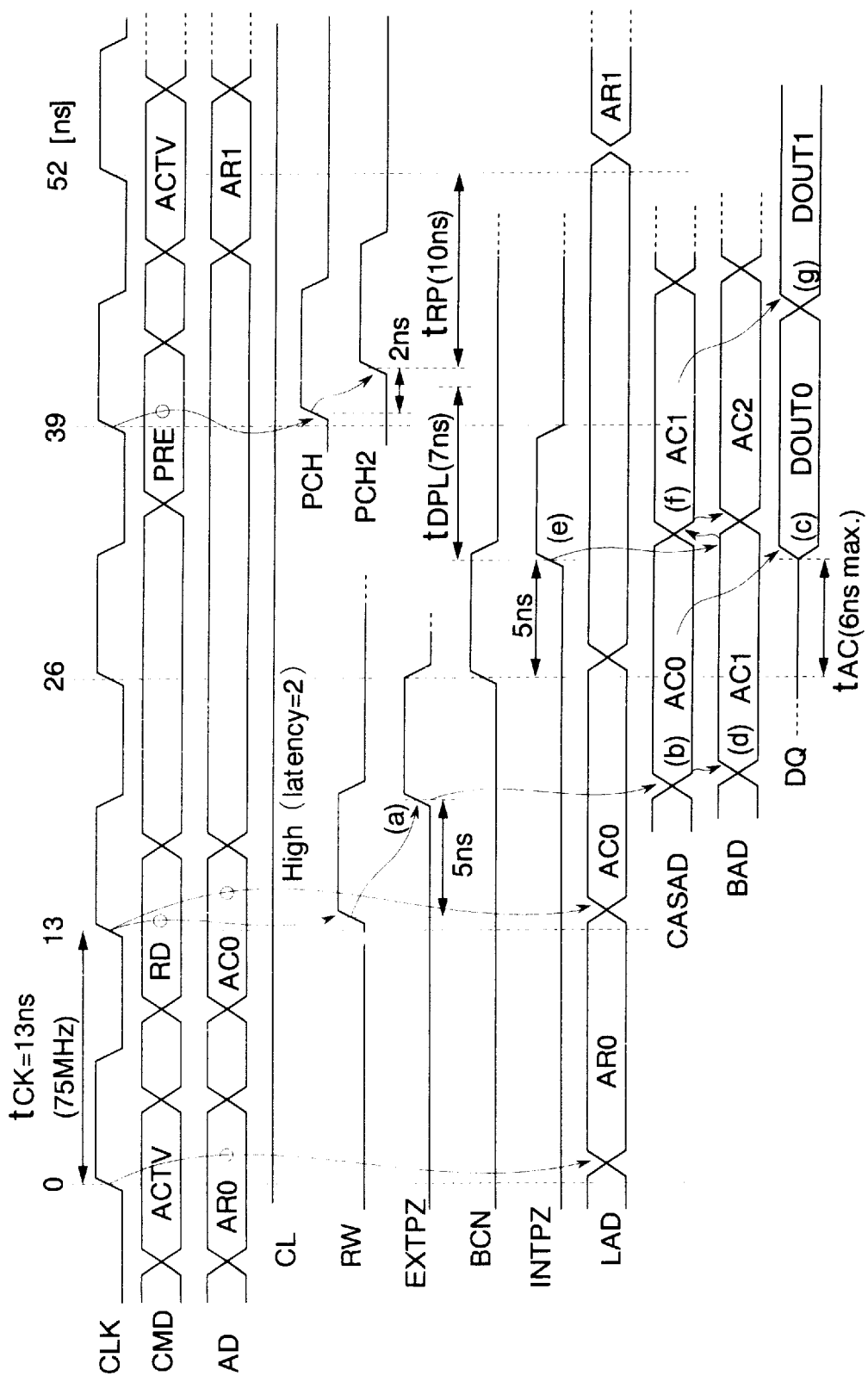
FIG. 16 is a timing chart showing the burst read operation of the SDRAM in the first embodiment.

FIG. 16 shows the burst read operation of the SDRAM in the case where the cycle "tCK" of the CLK signal is 13 ns (75 MHz). Until the activation of the EXPTZ signal, the timings of the operation are the same as in FIG. 10 and the description thereof shall be omitted here.

The burst control circuit 38 shown in FIG. 6 is activated upon receiving the high level of the RW signal, for a time correspondent to "a burst length" being the number of times at which read data are continuously outputted. Incidentally, the burst length is set by a mode register or the like (not shown) in advance. In this example, the burst length is set at "2". Then, the burst control circuit 38 activates the burst control signal BCN at the number of times smaller than the burst length by 1, in synchronization with the CLK signal (FIG. 16(a)).

The CAS latch 28 shown in FIG. 6 accepts the LAD signal in synchronization with the EXTPZ signal, and outputs the accepted signal as the CASAD signal (FIG. 16(b)). Then, the timing control circuit 44 and predecoder 36 are operated, and the column decoder 52 is activated. Thereafter, the data read out of the memory cell MC is amplified by the sense amplifier 50, and the amplified data is outputted as the read data DOUT0 (FIG. 16(c)).

Besides, the burst address generator 32 shown in FIG. 6 receives the CASAD signal (AC0) and it increases the received address signal by 1 so as to output the resulting signal as the bank address signal BAD (AC1) (FIG. 16(d)).

The timing adjusting circuit 42 receives the BCN signal and it delays the received signal by 5 ns so as to output the resulting signal as the INTPZ signal (FIG. 16(e)). The burst latch 30 accepts the BAD signal in synchronization with the INTPZ signal and it outputs the accepted signal as the CASAD signal (AC1) (FIG. 16(f)).

The timing control circuit 44 receives the INTPZ signal, and outputs the timing signal CTIM1. Then, the column decoder 52 corresponding to the CASAD signal (AC1) is activated, and the data read out of the memory cell MC is outputted as the read data DOUT1 (FIG. 16(g)).

Besides, the SDRAM receives the PRE command and performs 15 the precharge operation in synchronization with the second rising edge of the CLK signal (at 39 ns) with respect to the RD command. Also, it receives the next ACTV command in synchronization with the next rising edge of the CLK signal (at 52 ns). Incidentally, the operating timings of the respective circuits based on the PRE command are the same as in FIG. 10 and the description thereof shall be therefore omitted here.

As described above, according to the semiconductor integrated circuit and the method of controlling the same in the present invention, the delay time from the reception of the command (RD or WRA) concerning a column address to the start of the operation of the circuit concerning the column address is controlled by the timing adjusting circuit 40 or 42. Also, the delay time from the reception of the precharge command (PRE) to the start of the precharge operation is controlled by the timing adjusting circuit 22. In the SDRAM or the like of clock synchronous type, therefore, the read operation, the write operation or the precharge operation can be performed at the optimum timing correspondent to that of the internal circuit irrespective of the clock cycle. As a result, the number of times in receiving the command per unit time increases to enhance the bus occupation rate of the read data or the write data.

Since the circuit relevant to the column address is operated at the optimum timing correspondent to the operating timing of the internal circuit, the read cycle time, the write cycle time or the precharge cycle time can be shortened.

Moreover, the timing adjusting circuit 22, 40 or 42 varies the delay time in accordance with the latency. Therefore, the read or the write operation can be performed at the optimum timing in accordance with the frequency of the clock signal supplied. The timing adjusting circuit 22, 40 or 42 can be constructed of simple delay circuits.

Since the delay circuits 54, 56 are formed in the timing adjusting circuit 22, the predetermined delay time can be easily set merely by changing over the delay circuits 54, 56. Likewise, since the delay circuit 60 is formed in each of the timing adjusting circuits 40, 42, the predetermined delay time can be easily set in accordance with the presence or the absence of using the delay circuit 60.

Figure 17:
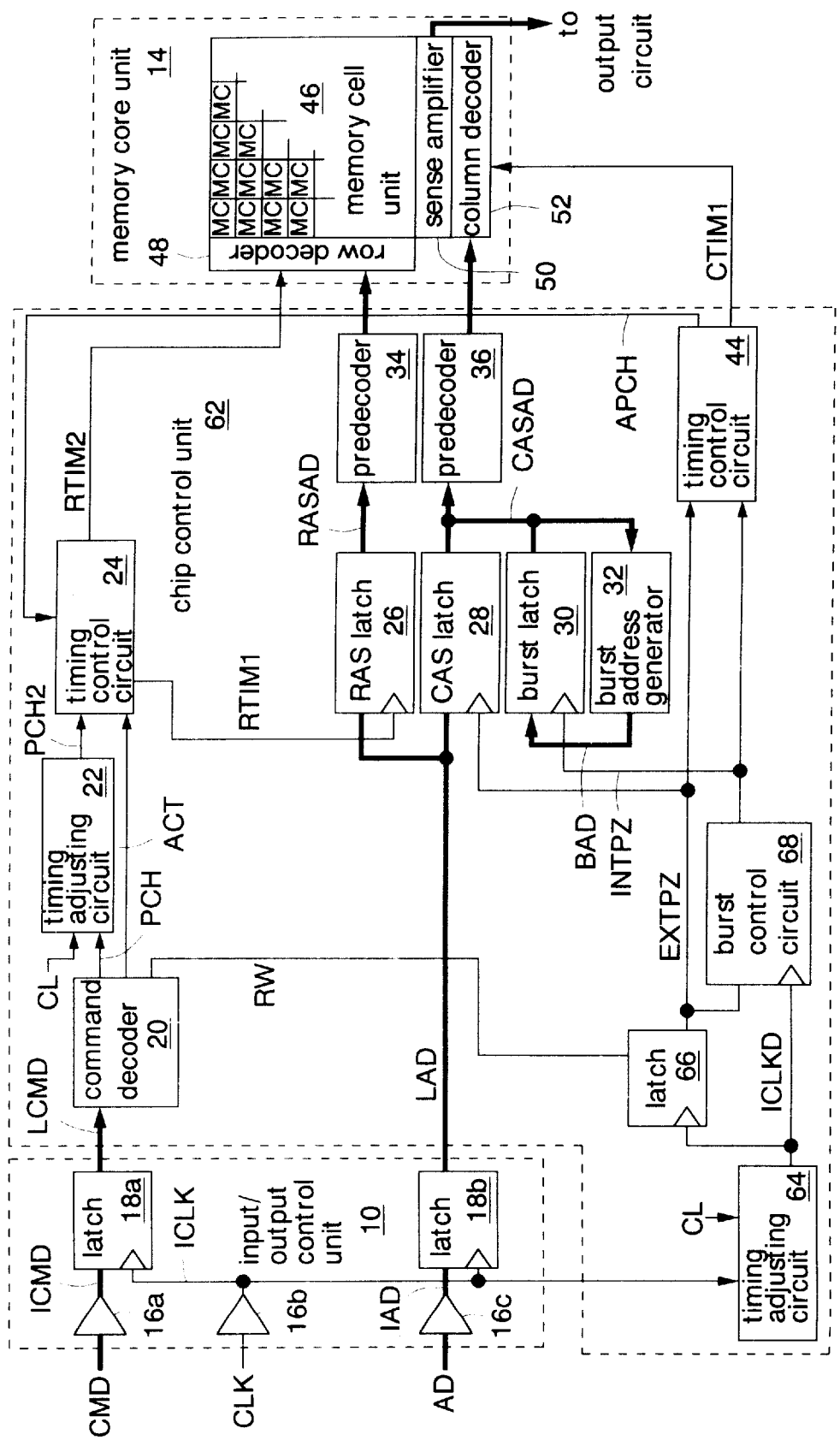
FIG. 17 is a block diagram showing the second embodiment of the semiconductor integrated circuit and the controlling method therefor.

FIG. 17 shows the second embodiment of the semiconductor integrated circuit and the method of controlling the same in the present invention. The same circuits and signals as those explained in the first embodiment will be indicated by identical reference numerals and the description thereof shall be omitted here.

In this embodiment, a chip control unit 62 includes a timing adjusting circuit 64, a latch 66 and a burst control circuit 68 instead of the timing adjusting circuits 40, 42 and burst control circuit 38 of the chip control unit 12 in the first embodiment. The remaining construction is the same as in the first embodiment.

The timing adjusting circuit 64 receives a CL signal and an ICLK signal, delays the ICLK signal in accordance with the CL signal, and outputs the delayed signal as a delayed internal clock signal ICLKD.

The latch 66 accepts a RW signal in synchronization with the ICLKD signal, and outputs the accepted signal as an EXTPZ signal.

The burst control circuit 68 is activated upon receiving the high level of the EXTPZ signal and outputs the ICLKD signal as an INTPZ signal at the number of times being smaller than a burst length by 1.

Next, the operation of the SDRAM in the second embodiment will be described.

Figure 18:
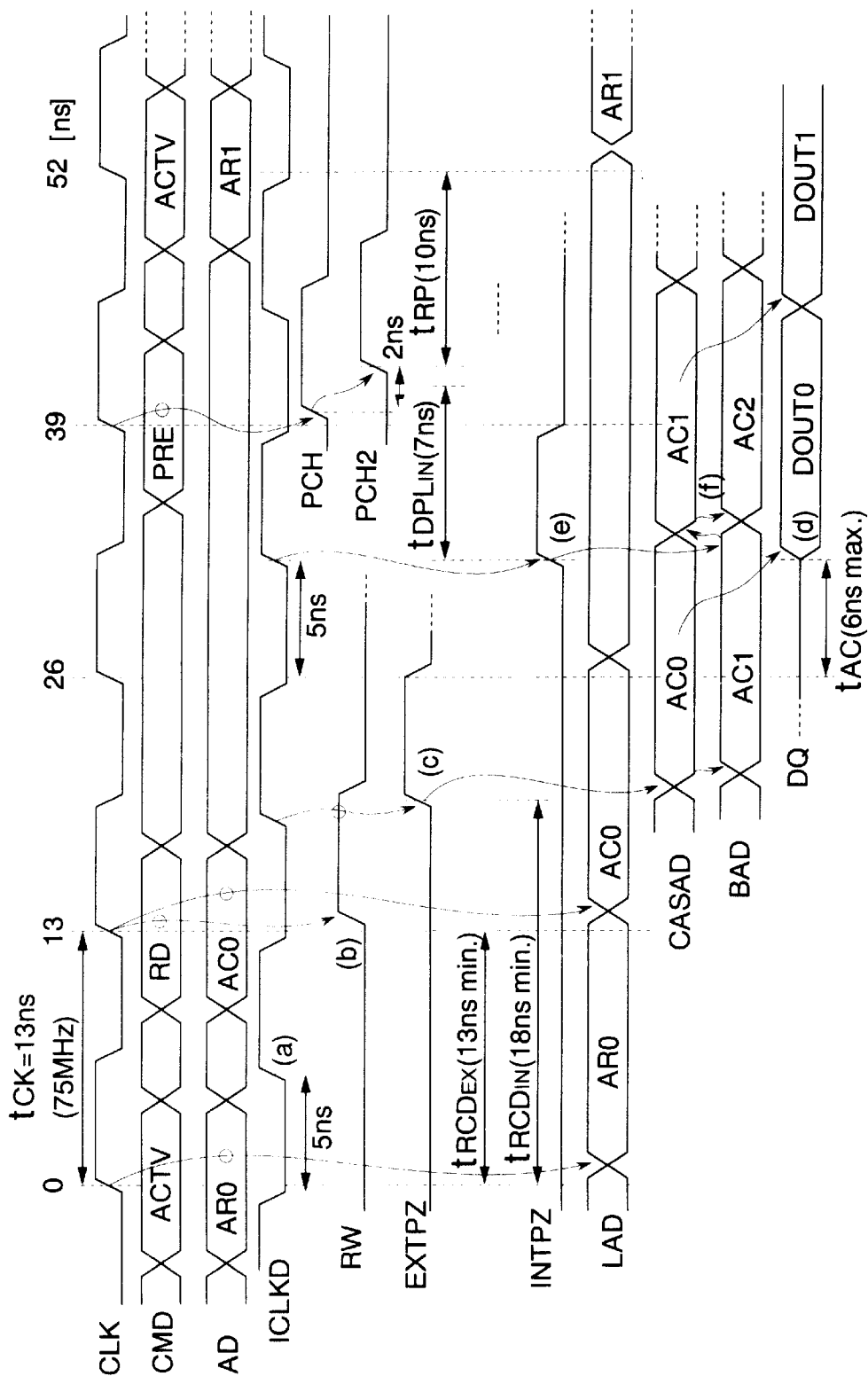
FIG. 18 is a timing chart showing the burst read operation of the SDRAM in the second embodiment.

FIG. 18 shows the timings of the burst read of the SDRAM in the case where the cycle "tCK" of a CLK signal is 13 ns (75 MHz). The timing specifications of the minimum time of a "tRCDEX" (13 ns) or the like are the same as in the first embodiment. In the case of 75 MHz, a CAS latency is "2" and hence, the CL signal is held at the high level.

First, the SDRAM activates a row decoder 48 shown in FIG. 6, upon receiving an ACTV command. The timing adjusting circuit 64 delays the CLK signal (ICLK signal) by about 5 ns, and outputs the delayed signal as the ICLKD signal (FIG. 18(a)).

Subsequently, the SDRAM activates the RW signal upon receiving an RD command (FIG. 18(b)). The latch 66 accepts the RW signal in synchronization with the rising edge of the ICLKD signal and outputs the accepted signal as the EXTPZ signal for about a half clock cycle (FIG. 18(c)). In this manner, the ICLKD signal is delayed by about 5 ns from the CLK signal by the timing adjusting circuit 64, whereby a "tRCDIN" becomes 18 ns which is greater than one cycle (tCK=13 ns) of the CLK signal. Thereafter, read data DOUT0 is outputted in the same manner as in FIG. 9 showing the first embodiment (FIG. 18(d)).

The burst control circuit 68 is activated by the high level of the EXTPZ signal, and outputs the ICLKD signal as the INTPZ signal the number of times being smaller than a burst length by 1. In this example, the burst length is set at "2" and hence, the INTPZ signal is activated once (FIG. 18(e)).

Thereafter, a burst latch 30 and a burst address generator 32 are operated, and the burst read is performed at the same timing as in FIG. 16 (FIG. 18(f)).

Besides, the SDRAM receives a PRE command and performs a precharge operation in synchronization with the second rising edge of the CLK signal (at 39 ns) with respect to the RD command. Also, it receives the next ACTV command in synchronization with the next rising edge of the CLK signal (at 52 ns). Incidentally, the operating timings of the respective circuits based on the PRE command are the same as in FIG. 10 and the description thereof shall be therefore omitted here.

Also in this embodiment, the same effects as in the foregoing first embodiment can be attained. Further, this embodiment includes the latch 66 which accepts the command signal RW in synchronization with the delayed internal clock signal ICLKD. Since the EXTPZ signal and the INTPZ signal are generated in synchronization with the ICLKD signal, the shifts of their timings are minimized. It is accordingly possible to enhance the precision of the control timings of the circuit relevant to a row address.

Moreover, since the timing adjusting circuit 64 can be commonly used as a delay element for generating the EXTPZ signal and the INTPZ signal, the circuit of the SDRAM can be made smaller in size.

Figure 19:
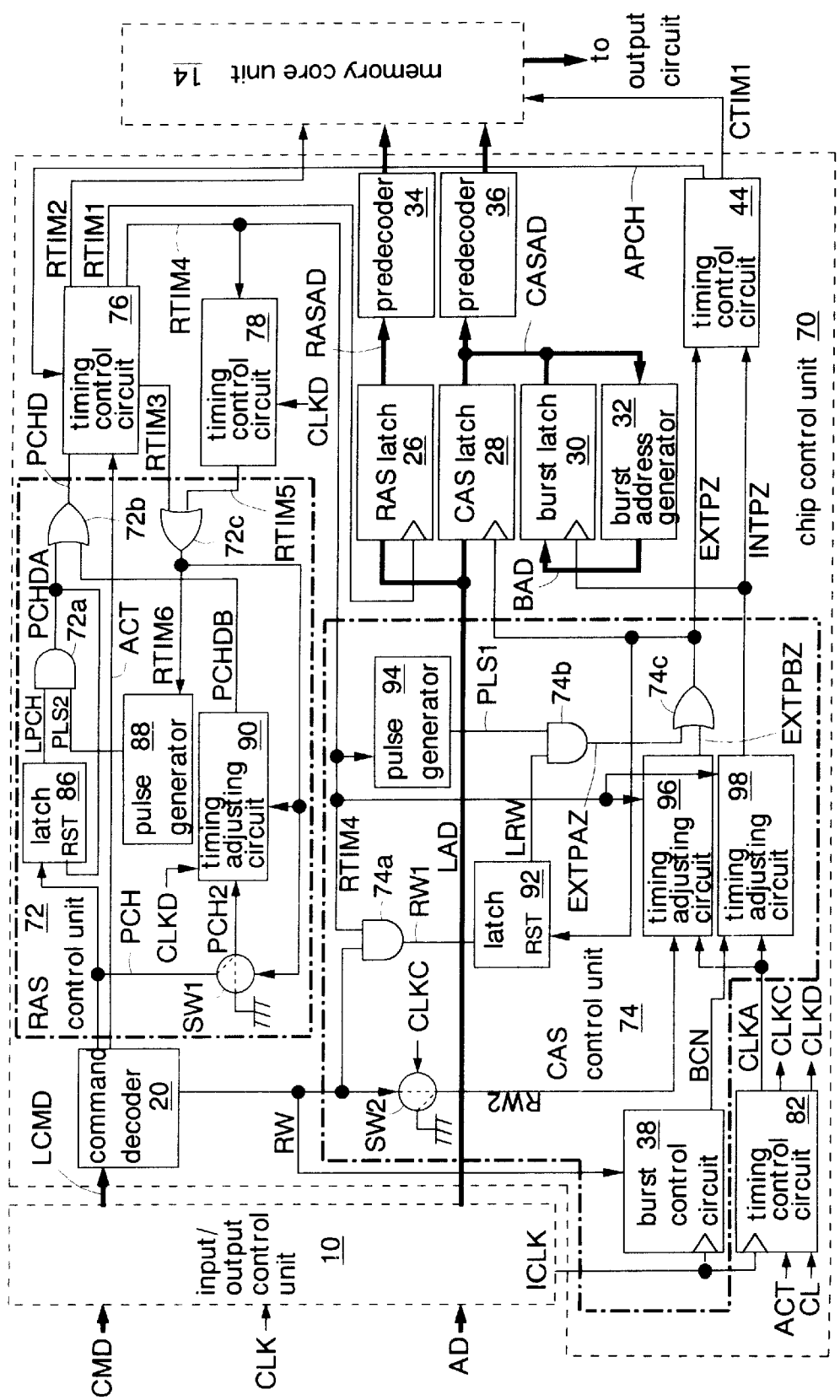
FIG. 19 is a block diagram showing the third embodiment of the semiconductor integrated circuit and the controlling method therefor, and one embodiment of the variable delay circuit.

FIG. 19 shows the third embodiment of the semiconductor integrated circuit and the method of controlling the same and one embodiment of the variable delay circuit in the present invention. The same circuits and signals as those explained in the first embodiment will be indicated by identical reference numbers and the description thereof shall be omitted here.

In this embodiment, a chip control unit 70 differs from the chip control unit 12 in the first embodiment. An input/output control unit 10 and a memory core unit 14 are the same as in the first embodiment.

The chip control unit 70 includes a command decoder 20, a RAS control unit 72, a CAS control unit 74, timing control circuits 76, 78, a RAS latch 26, a CAS latch 28, a burst latch 30, a burst address generator 32, predecoders 34, 36, and timing control circuits 82, 44.

The RAS control unit 72 receives a command signal PCH from the command decoder 20, a row timing signal RTIM3 from the timing control circuit 76 and a row timing signal RTIM5 from the timing control circuit 78, and it outputs a delayed precharge signal PCHD to the timing control circuit 76.

The CAS control unit 74 receives an ICLK signal from the input/output control unit 10, an RW signal from the command decoder 20, a timing signal CLKA from the timing control circuit 82 and a row timing signal RTIM4 from the timing control circuit 76, and it outputs timing signals EXTPZ, INTPZ.

The timing control circuit 76 receives the delayed precharge signal PCHD and an auto precharge signal APCH, and it outputs row timing signals RTIM1, RTIM2, RTIM3, RTIM4 for controlling a circuit relevant to a row address. Here, the RTIM3 signal turns to a low level after the lapse of a time tRASIN being the actual value of the internal circuit. The RTIM4 signal turns to the low level after the lapse of a time tRCDIN being the actual value of the internal circuit. The timing control circuit 78 receives the RTIM4 signal, delays the received signal by a time corresponding to "tDPL", and outputs the delayed signal as the timing signal RTIM5.

The timing control circuit 82 receives the ICLK signal, an ACT signal and a CL signal, and outputs timing signals CLKA, CLKC, CLKD.

The RAS control unit 72 includes a latch 86, a pulse generator 88, a timing adjusting circuit 90, a switch SW1, an AND gate 72a, and OR gates 72b, 72c.

The latch 86 accepts the PCH signal, and outputs the accepted signal as a latched command signal LPCH. The signal accepted by the latch 86 is reset when the reset terminal RST of this latch has received a delayed command signal PCHDA (high level) from the AND gate 72a.

The pulse generator 88 outputs a high pulse signal PLS2 upon receiving the falling edge of an RTIM6 signal.

The timing adjusting circuit 90 receives a PCH2 signal, the CLKD signal and the RTIM6 signal and outputs a delayed command signal PCHDB.

The switch SW1 has the function of turning the PCH2 signal to a ground level when the RTIM6 signal is at the high level, and transmitting the PCH signal as the PCH2 signal when the RTIM6 signal is at the low level. This switch SW1 is formed of, for example, a CMOS transmission gate which receives the RTIM6 signal.

The AND gate 72a outputs the logical multiplication between the LPCH signal and the PLS2 signal as the delayed command signal PCHDA. The OR gate 72b outputs the logical sum between the PCHDA signal and the PCHDB signal as the delayed precharge signal PCHD. The OR gate 72c outputs the logical sum between the RTIM3 signal and the RTIM5 signal as the RTIM6 signal.

The CAS control unit 74 includes a burst control circuit 38, a latch 92, a pulse generator 94, timing adjusting circuits 96, 98, a switch SW2, AND gates 74a, 74b, and an OR gate 74c.

The burst control circuit 38 accepts the RW signal in synchronization with the ICLK signal and outputs a burst control signal BCN.

The latch 92 accepts a command signal RW1, and outputs the accepted signal as a latched command signal LRW. The signal accepted by the latch 92 is reset when the reset terminal RST of this latch has received the EXTPZ signal of high level.

The pulse generator 94 outputs a high pulse signal PLS1 upon receiving the falling edge of the RTIM4 signal.

The timing adjusting circuit 96 receives a command signal RW2, the CLKA signal and the RTIM4 signal, and outputs a timing signal EXTPBZ. On the other hand, the timing adjusting circuit 98 receives the burst control signal BCN, the timing signal CLKA and the row timing signal RTIM1, and outputs the timing signal INTPZ.

The switch SW2 has the function of turning the RW2 signal to the ground level when the CLKC signal is at the high level, and transmitting the RW signal as the RW2 signal when the CLKC signal is at the low level. This switch SW2 is formed of, for example, a CMOS transmission gate which receives the CLKC signal.

The AND gate 74a outputs the logical multiplication between the RW signal and the RTIM4 signal as the RW1 signal. The OR gate 72c receives the EXPTBZ signal and the output signal EXTPAZ of the AND gate 74b, and outputs the EXTPZ signal.

Figure 20:
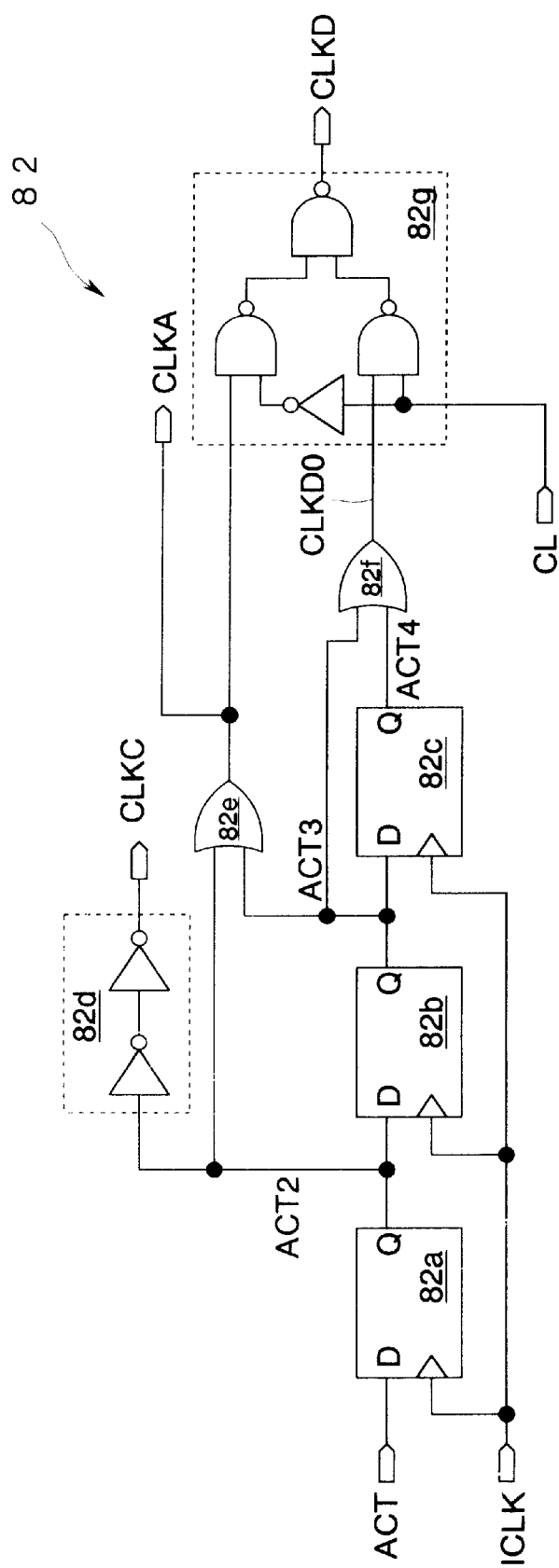
FIG. 20 is a circuit diagram showing a timing control circuit shown in FIG. 19.

FIG. 20 shows the details of the timing control circuit 82.

The timing control circuit 82 is constructed of D-flip-flop circuits 82a, 82b, 82c connected in cascade, an inverter row 82d having two inverters connected in cascade, OR gates 82e, 82f, and a selector 82g.

The D-flip-flop circuit 82a at the initial stage accepts the ACT signal in synchronization with the ICLK signal, and outputs the accepted signal as a command signal ACT2. The D-flip-flop circuit 82b at the next stage accepts the ACT2 signal in synchronization with the ICLK signal, and outputs the accepted signal as a command signal ACT3. The D-flip-flop circuit 82c at the final stage accepts the ACT3 signal in synchronization with the ICLK signal, and outputs the accepted signal as a command signal ACT4.

The inverter row 82d receives the ACT2 signal, and outputs the received signal as the CLKC signal. The OR gate 82e outputs the logical sum between the ACT2 signal and the ACT3 signal as the CLKA signal. The OR gate 82f outputs the logical sum between the ACT3 signal and the ACT4 signal as a timing signal CLKD0.

The selector 82g outputs the CLKA signal as the CLKD signal when the CL signal is at the low level and it outputs the CLKD0 signal as the CLKD signal when the CL signal is at the high level.

Figure 21:
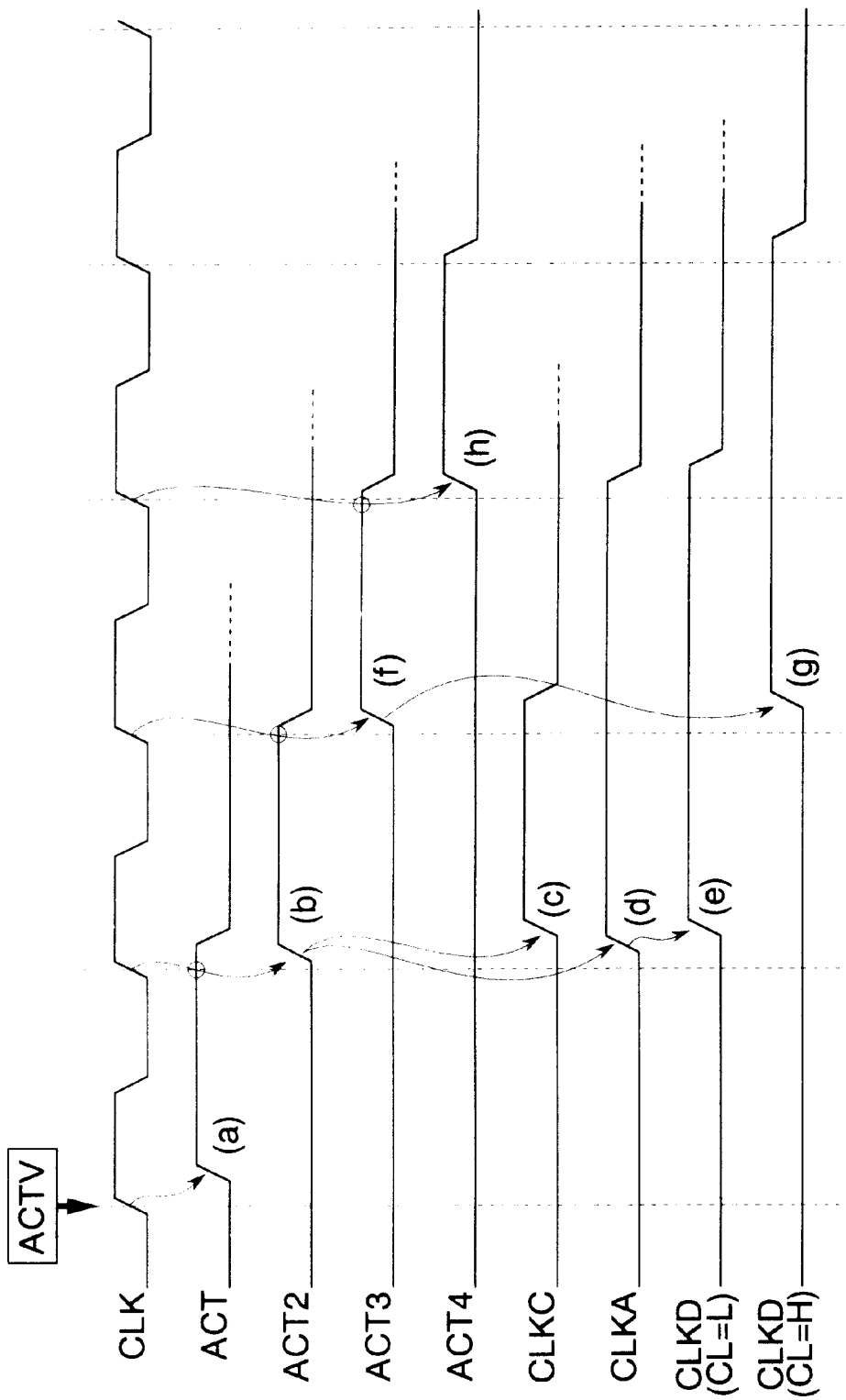
FIG. 21 is a timing chart showing the operation of the timing control circuit shown in FIG. 19.

FIG. 21 shows the operating timing of the timing control circuit 82.

First, the SDRAM accepts an ACTV command and activates the ACT signal in synchronization with the rising edge of the ICLK signal (FIG. 21(a)).

The D-flip-flop circuit 82a accepts the ACT signal and activates the ACT2 signal in synchronization with the rising edge of the ICLK signal (FIG. 21(b)). Besides, the CLKC signal and CLKA signal are activated by the activation of the ACT2 signal (FIGS. 21(c) and (d)).

Here, in the case where the CL signal is at the low level, the CLKD signal is activated by the activation of the CLKA signal (FIG. 21(e)).

The D-flip-flop circuit 82b accepts the ACT2 signal and activates the ACT3 signal in synchronization with the rising edge of the ICLK signal (FIG. 21(f)). Here, in the case where the CL signal is at the high level, the CLKD signal is activated by the activation of the ACT3 signal (FIG. 21(g)).

The D-flip-flop circuit 82c accepts the ACT3 signal and outputs the ACT4 signal in synchronization with the rising edge of the ICLK signal (FIG. 21(h)).

The CLKC signal is activated during a period of substantially one clock cycle of a CLK signal from the rising edge of the clock signal subsequent to the one receiving the ACTV command, while the CLKA signal is activated during a period of substantially two clock cycles of the CLK signal from the rising edge of the clock signal subsequent to the one receiving the ACTV command. Also, the CLKD signal is activated during the period of substantially two clock cycles of the CLK signal from the rising edge thereof or the rising edge of the second clock signal after receiving the ACTV command, in accordance with the level of the CL signal.

Figure 22:
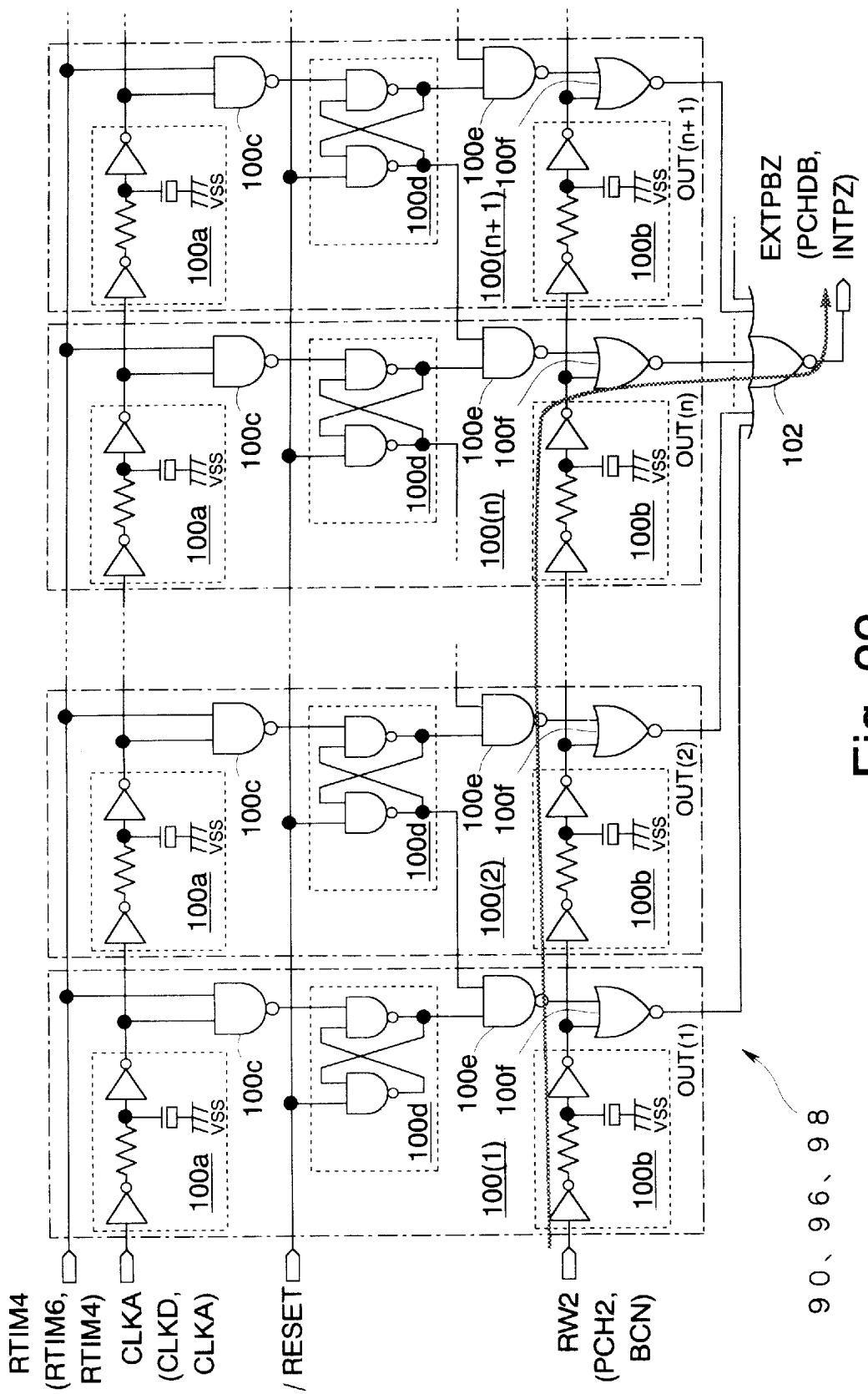
FIG. 22 is a circuit diagram showing a timing adjusting circuit shown in FIG. 19.

FIG. 22 shows the details of each of the timing adjusting circuits 90, 96, 98. Since the timing adjusting circuits 90, 96, 98 have the same circuit arrangements, the timing adjusting circuit 96 shall be explained here. Incidentally, the names of the signals connected to the terminals of the timing adjusting circuits 90, 98 are indicated in parentheses. Besides, a reset signal /RESET not shown in FIG. 19, is activated before the operations of the timing adjusting circuits 90, 96, 98.

The timing adjusting circuit 96 is constructed of a plurality of delay setting parts 100 which are connected in cascade, and a NOR gate 102 which receives the output signals OUT of the respective delay setting parts 100.

Each of the delay setting parts 100 is configured of delay circuits 100a, 100b, a NAND gate 100c, a flip-flop circuit 100d, a NAND gate 100e, and a NOR gate 100f. Here, the delay setting parts 100 correspond to the second delay circuit 7 and the first delay circuit 6 which are shown in FIG. 5. The delay circuits 100a and the delay circuits 100b correspond to the second delay stages 7a and the first delay stages 6a shown in FIG. 5, respectively. The NAND gates 100c and the flip-flop circuits 100d correspond to the detecting circuit 8 shown in FIG. 5. The NAND gates 100e and the NOR gates 100f correspond to the selecting circuit 9 shown in FIG. 5.

Each of the delay circuits 100a, 100b is constructed that an CR time-constant circuit is arranged between two inverters connected in cascade. The CR time-constant circuit is constituted by, for example, a diffusion resistor, and a MOS capacitor in which the source and drain of an nMOS are connected to a ground line VSS. The delay circuits 100a, 100b are identical.

Each of the delay setting parts 100 receives the RTIM4 signal by the NAND gate 100c. The delay circuit 100a receives the CLKA signal and outputs the delayed signal to the NAND gate 100c and the delay setting part 100 of the succeeding stage. The delay circuit 100b receives the RW2 signal and outputs the delayed signal to the NOR gate 100f and the delay setting part 100 of the succeeding stage.

The flip-flop circuit 100d receives the /RESET signal at its one input node and the output of the NAND gate 100c at its other input node. In addition, the flip-flop circuit 100d is so formed that the output node of its side receiving the /RESET signal is connected to the input node of the NAND gate 100e of the preceding stage, and that the output node of its side receiving the output of the NAND gate 100c is connected to the input node of the NAND gate 100e of its own stage.

The NAND gate 100e receives the output of the flip-flop circuit 100d of its own stage and that of the flip-flop circuit 100d of the succeeding stage. The NOR gate 100f outputs the OUT signal.

Figure 23:
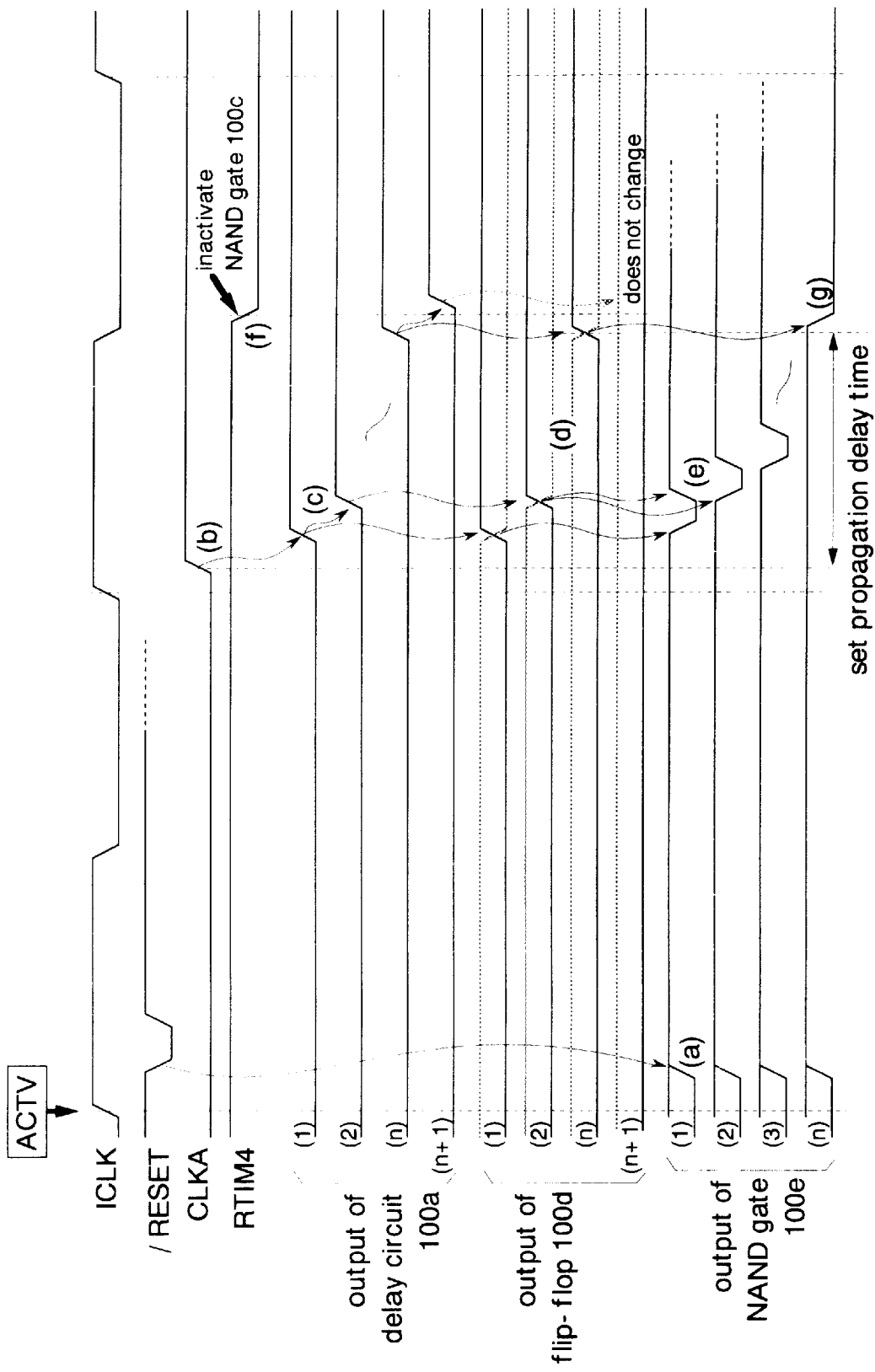
FIG. 23 is a timing chart showing the operation of the timing adjusting circuit shown in FIG. 22.

FIG. 23 shows the operation of setting the propagation delay time of the timing adjusting circuit 96. Incidentally, also the timing adjusting circuits 90, 98 operate at the same timings.

First, the SDRAM activates the /RESET signal upon receiving the ACTV command. The flip-flop circuit 100d of each of the delay setting parts 100 is reset upon receiving the /RESET signal. The output of the NAND gate 100e of each stage changes to a high level upon receiving the low-level output of the flip-flop circuit 100d of its own stage and the high-level output of the flip-flop circuit 100d of the succeeding stage (FIG. 23(a)).

The SDRAM starts the operation of the circuit. corresponding to a row address after having received the ACTV command. The CLKA signal is activated in synchronization with the ICLK signal after the ACTV command (FIG. 23(b)). Each delay circuit 100a receives the CLKA signal, and transmits the delayed signal to the NAND gate 100c of its own stage and to the delay circuit 100a of the succeeding stage (FIG. 23(c)). Such delayed signals are transmitted in succession.

While the RTIM4 signal is at the high level, the NAND gate 100c inverts the signal received from the delay circuit 100a and outputs the inverted signal to the flip-flop circuit 100d.

The flip-flop circuit 100d is set upon receiving the low-level output of the NAND gate 100c. Owing to the setting, the flip-flop circuit 100d outputs the high-level output to the NAND gate 100e of its own stage and outputs the low-level output to the NAND gate 100e of the delay setting part 100 of the preceding stage (FIG. 23(d)).

The NAND gate 100e receives the high-level output from the flip-flop circuit 100d of its own stage and the low-level output from the flip-flop circuit 100d of the succeeding stage, and it outputs a low pulse signal (FIG. 23(e)). Such low pulse signals are outputted from the NAND gates 100e in succession.

After a predetermined time, the RTIM4 signal changes to the low level (FIG. 23(f)). The NAND gate 100c is inactivated upon receiving the low level of the RTIM4 signal, to inhibit the transmission of the delayed CLKA signal to the flip-flop circuit 100d. As a result, only the NOR gate 100f which is receiving the low-level output of the NAND gate 100e on this occasion is activated (FIG. 23(g)). That is, the time difference between the transition edges of the CLKA signal and the RTIM4 signal is detected. The minimum detectable time becomes less than the propagation delay time of one delay circuit 100a. Therefore, the detecting precision can be enhanced by setting the time constant of each delay circuit 100a smaller.

Accordingly, the RW2 signal transmitted to the delay circuits 100b in succession are delayed by number-n delay circuits 100b and the delayed signal is thereafter outputted as the EXTPBZ signal from the NOR gate 102. Since the delay circuits 100a, 100b are the same circuits, the propagation delay time of the n-delay circuits 100b equalizes to a time from the rising edge of the CLKA signal to the falling edge of the RTIM4 signal.

A bold arrow in FIG. 22 indicates the transmission path of the RW2 signal in the case where the RTIM4 signal changes to the low level immediately after the CLKA signal has been transmitted to the n-th delay setting part 100(n) to set the nth flip-flop circuit 100d. On this occasion, only the output of the NAND gate 100e of the delay setting part 100(n) is at the low level, so that one of the delay signals of the RW2 signal outputted from the delay circuits 100b is selected.

In this manner, the timing adjusting circuit 96 measures the time from the rising edge of the CLKA signal to the falling edge of the RTIM4 signal, delays the RW2 signal by the measured time and outputs the delayed signal as the EXTPBZ signal. The RTIM4 signal is outputted in correspondence with the time tRCDIN being the actual value of the chip of the SDRAM. Therefore, the RW2 signal is generated in accordance with the actual time tRCDIN which shifts depending upon the supply voltage, temperature, or the like of the chip.

Likewise, the timing adjusting circuit 90 measures a time from the rising edge of the PCH2 signal to the falling edge of the RTIM6 signal, delays the PCH2 signal by the measured time and outputs the delayed signal as the PCHDB signal.

The timing adjusting circuit 98 measures a time from the rising edge of the CLKA signal to the falling edge of the BCN signal, delays the BCN signal by the measured time and outputs the delayed signal as the INTPZ signal.

Next, the operation of the above SDRAM will be described.

Figure 24:
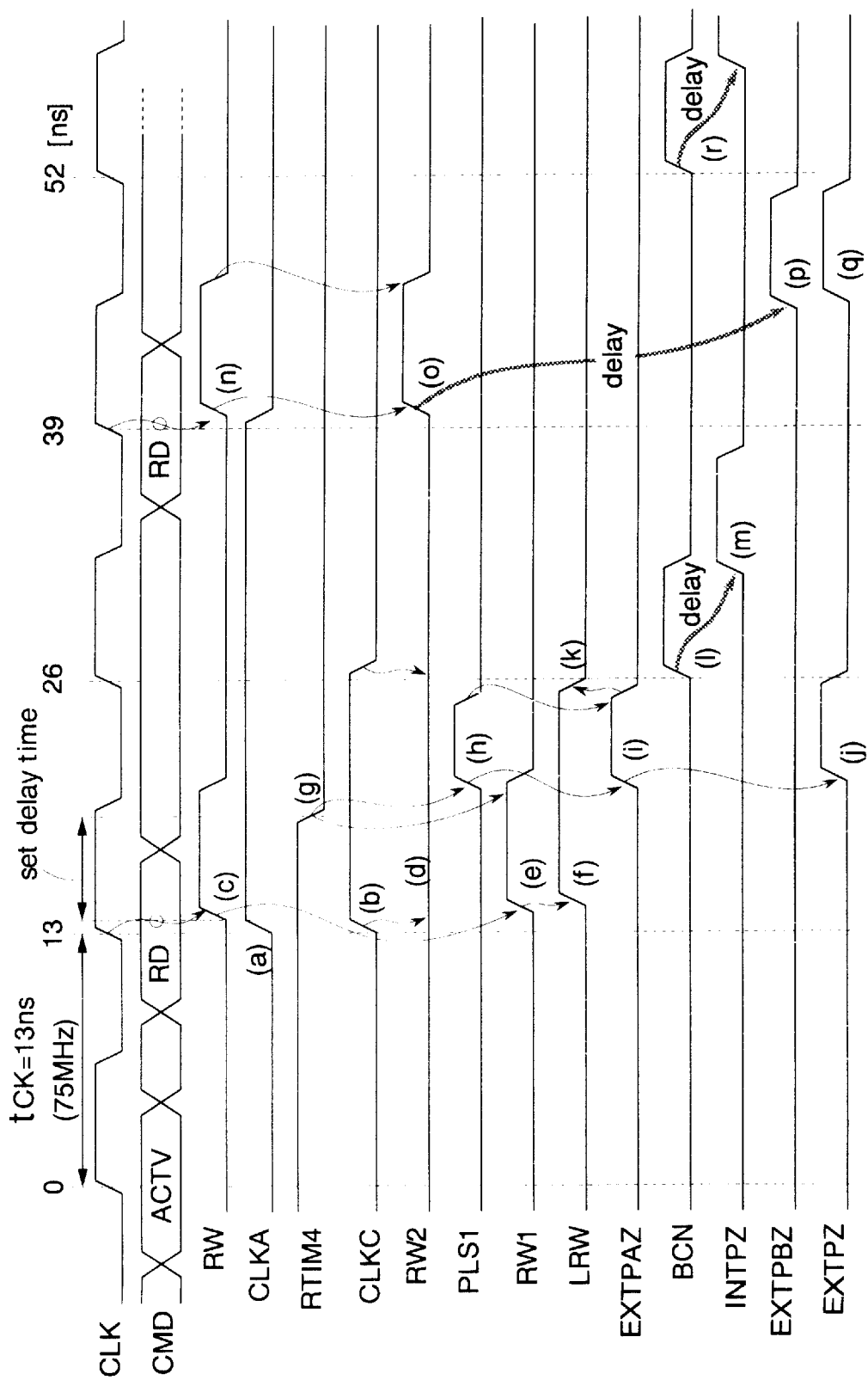
FIG. 24 is a timing chart showing the burst read operation of the SDRAM in the third embodiment.

FIG. 24 shows the burst read operation of the SDRAM in the case where the cycle "tCK" of the CLK signal is 13 ns (75 MHz). Here, the operation of the CAS control unit 74 shown in FIG. 19 will be described in detail. By the way, in the case where the cycle tCK of the CLK signal is 13 ns, a burst length is set at "2".

First, the SDRAM activates the row decoder 48 (FIG. 6), upon receiving the ACTV command. Subsequently, the timing control circuit 82 activates the CLKA signal and the CLKC signal in synchronization with the second rising edge of the CLK signal (at 13 ns) (FIGS. 24(a), (b)). Besides, the SDRAM activates the RW signal upon receiving an RD command (FIG. 24(c)).

During the high-level period of the CLKC signal, the switch SW2 is kept connected to the ground line VSS, and hence, the RW2 signal holds its low level (FIG. 24(d)).

The AND gate 74a turns the RW1 signal to the high level upon receiving the high level of the RW signal and that of the RTIM4 signal (FIG. 24(e)). The latch 92 accepts the RW1 signal, and outputs the accepted signal as the LRW signal (FIG. 24(f)).

Here, the timing adjusting circuit 96 measures the time from the rising edge of the CLKA signal to the falling edge of the RTIM4 signal as shown in FIG. 23 (delay setting), after the reception of the ACTV command. Simultaneously, also the timing adjusting circuits 90, 98 perform delay settings similarly.

Thereafter, the RTIM4 signal changes to the low level (FIG. 24(g)). The pulse generator 94 generates the PLS1 signal upon receiving the low level of the RTIM4 signal (FIG. 24(h)). The AND gate 74b turns the EXTPAZ signal to the high level upon receiving the high level of the LRW signal and that of the PLS1 signal (FIG. 24(i)). The OR gate 74c outputs the EXTPAZ signal as the EXTPZ signal (FIG. 24(j)). The latch 92 is reset upon receiving the high level of the EXTPZ signal and it turns the LRW signal to the low level (FIG. 24(k)).

In this manner, the EXTPZ signal for the first read operation after the ACTV command is generated from the RTIM4 signal.

Subsequently, the burst control circuit 38 outputs the BCN signal in synchronization with the ICLK signal (at 26 ns) (FIG. 24(l)). The timing adjusting circuit 98 delays the BCN signal by a predetermined time and outputs the delayed signal as the INTPZ signal (FIG. 24(m)). Then, the burst read operation is performed in the same way as in FIG. 16.

Subsequently, the SDRAM activates the RW signal upon receiving the RD command in synchronization with the CLK signal (at 39 ns) (FIG. 24(n)). The switch SW2 outputs the RW signal as the RW2 signal upon receiving the low level of the CLKC signal (FIG. 24(o)). The timing adjusting circuit 96 delays the RW2 signal by a predetermined time and outputs the delayed signal as the EXTPBZ signal (FIG. 24(p)). The OR gate 74c outputs the EXTPBZ signal as the EXTPZ signal (FIG. 24(q)). Then, the read operation and further the burst read operation are performed (FIG. 24(r)).

Figure 25:
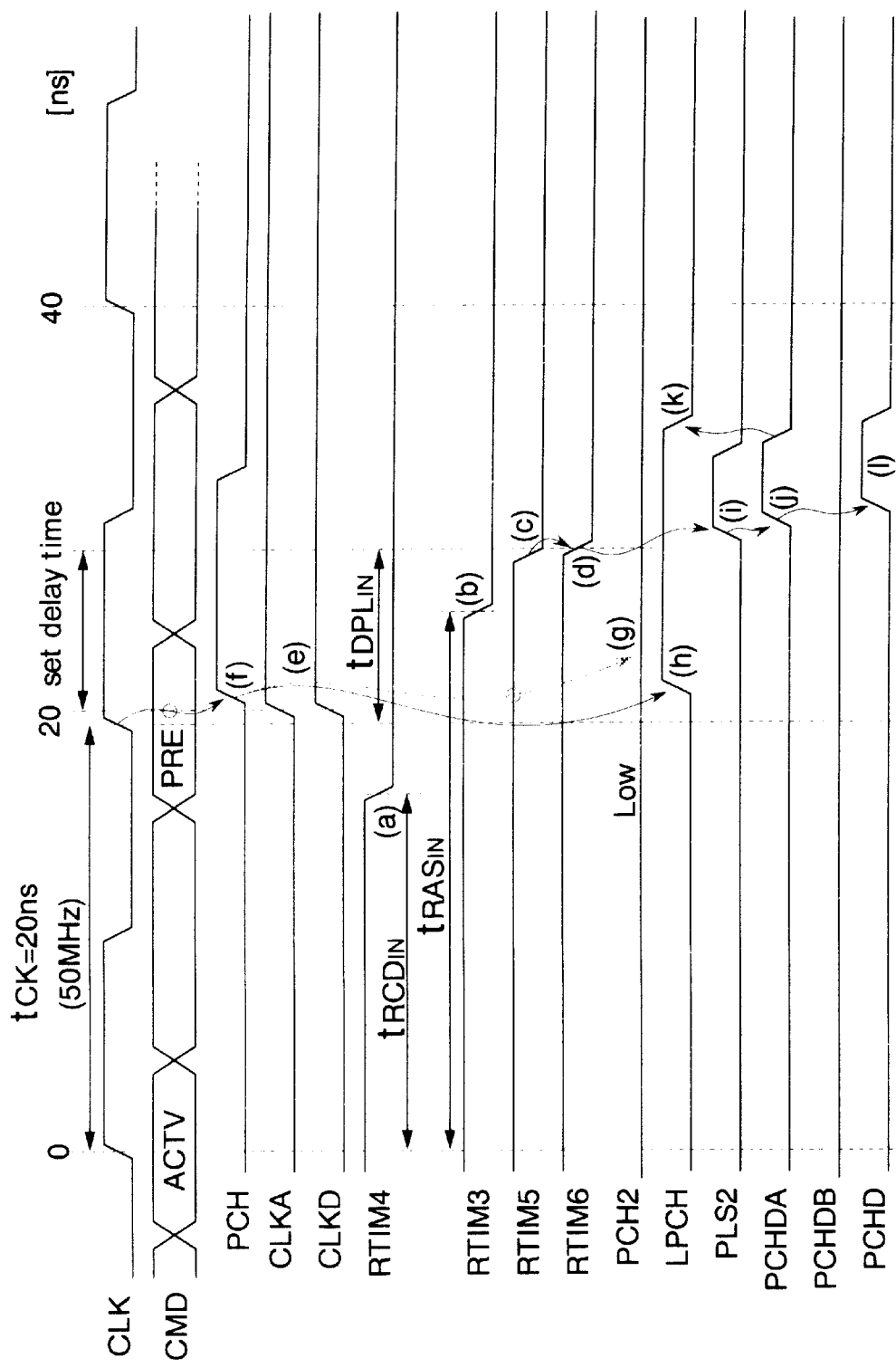
FIG. 25 is a timing chart showing the precharge operation of the SDRAM in the third embodiment.

FIG. 25 shows the precharge operation of the SDRAM in the case where the cycle "tCK" of the CLK signal is 20 ns (50 MHz). In the case where the cycle tCK of the CLK signal is 20 ns, a burst length is set at "1". Here, the operation of the RAS control unit 72 shown in FIG. 19 will be described in detail.

First, the SDRAM activates the row decoder 48 shown in FIG. 17, upon receiving the ACTV command. The timing control circuit 76 turns the RTIM4 signal to the low level after the lapse of the time tRCDIN (18 ns in this example) being the actual value of the internal circuit, and it turns the RTIM3 signal to the low level after the lapse of the time tRASIN (24 ns in this example) being the actual value of the internal circuit (FIGS. 25(a), (b)). The timing control circuit 78 delays the later one of the RTIM4 signal and the CLKA signal by the time tDPL (10 ns), and outputs the delayed signal as the RTIM5 signal (FIG. 25(c)).

The OR gate 72c outputs the logical sum between the RTIM3 signal and the RTIM5 signal as the RTIM6 signal (FIG. 25(d)). That is, the RTIM6 signal is outputted in conformity with that one of the RTIM3 signal and the RTIM5 signal whose falling edge is later.

On the other hand, the timing control circuit 82 activates the CLKA signal and the CLKD signal in synchronization with the second rising edge of the CLK signal (at 20 ns) (FIGS. 25(e), (b)). Besides, the SDRAM activates the PCH signal upon receiving a PRE command (FIG. 25(f)).

Here, the timing adjusting circuit 90 measures the time from the rising edge of the CLKD signal to the falling edge of the RTIM6 signal after the reception of the ACTV command, likewise to the timings shown in FIG. 23 (delay setting).

During the high-level period of the RTIM6 signal, the switch SW1 is kept connected to the ground line VSS and hence, the PCH2 signal holds its low level (FIG. 25(g)).

The latch 86 accepts the PCH signal, and outputs the accepted signal as the LPCH signal (FIG. 25(h)). The pulse generator 88 generates the PLS2 signal upon receiving the low level of the RTIM6 signal (FIG. 25(i)). The AND gate 72a turns the PCHDA signal to the high level upon receiving the high level of the LPCH signal and that of the PLS2 signal (FIG. 25(j)). The latch 86 is reset upon receiving the high level of the PCHDA signal, and it turns the LPCH signal to the low level (FIG. 25(k)). The OR gate 72c outputs the PCHDA signal as the PCHD signal (FIG. 25(l)). Then, the precharge operation is performed.

In this manner, when the PRE command has been received at the next rising edge of the CLK signal after the ACTV command, the PCHD signal for performing the precharge operation is generated from the PCHDA signal.

Figure 26:
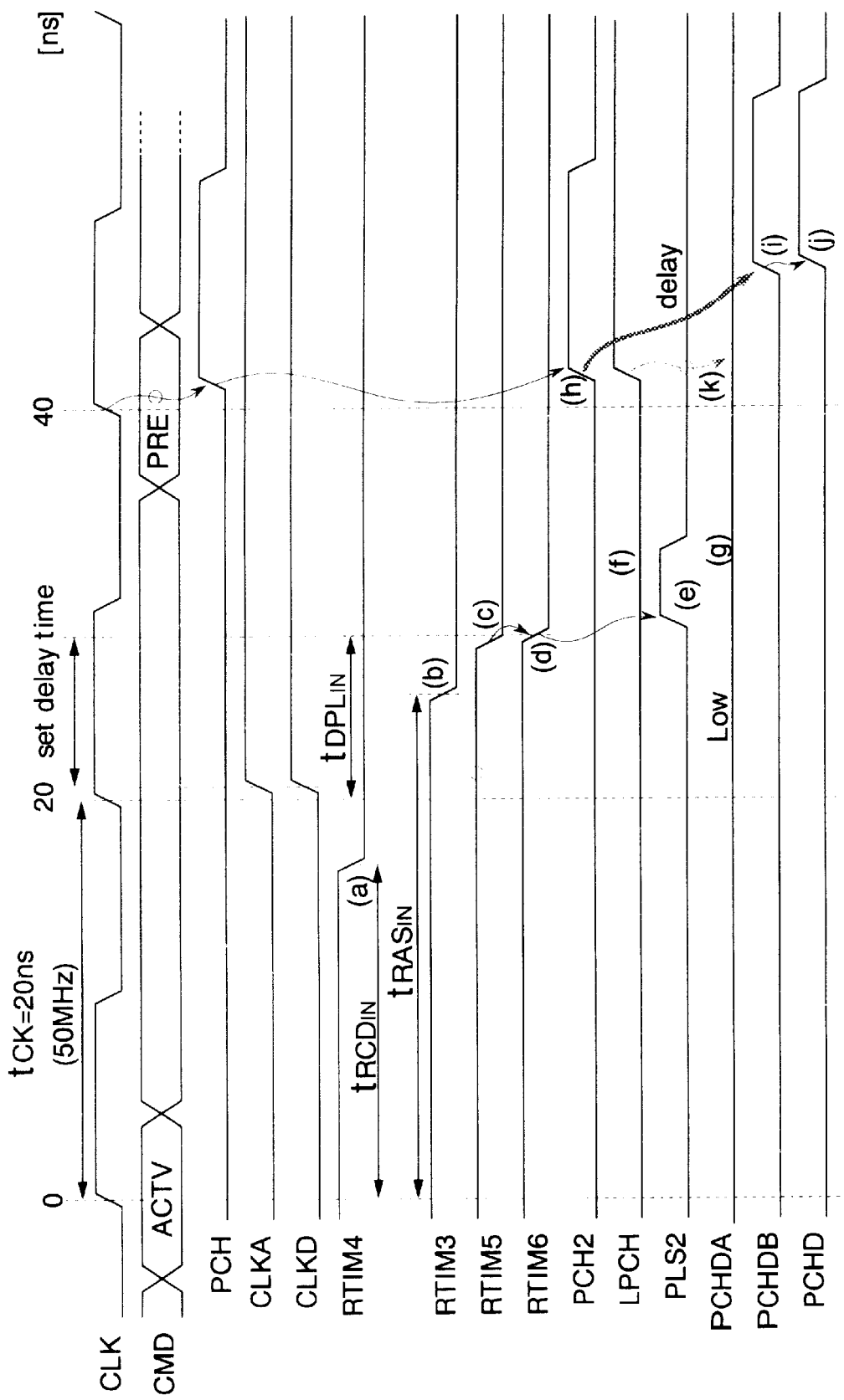
FIG. 26 is a timing chart showing another example of the precharge operation of the SDRAM in the third embodiment.

FIG. 26 shows another example of the precharge operation of the SDRAM in the case where the cycle "tCK" of the CLK signal is 20 ns (50 MHz). Also in FIG. 26, the operation of the RAS control unit 72 shown in FIG. 19 will be described in detail.

In this example, the SDRAM receives the PRE command in synchronization with the second rising edge of the CLK signal (at 40 ns) after having received the ACTV command. The operations indicated by symbols (a)~(d) in the figure are the same as in FIG. 24 and the description thereof shall be omitted here.

The pulse generator 88 generates the PLS2 signal upon receiving the low level of the RTIM6 signal (FIG. 26(e)). On this occasion, the PRE command is not fed to the SDRAM, and hence, the latch 86 holds the LPCH signal at the low level. Therefore, the PCHDA signal is not activated (FIG. 26(f), (g))

Thereafter, the SDRAM receives the PRE command in synchronization with the rising edge of the CLK signal (at 40 ns) and activates the PCH signal. The switch SW1 outputs the PCH signal as the PCH2 signal upon receiving the low level of the RTIM6 signal (FIG. 26(h)). The timing adjusting circuit 90 delays the PCH2 signal by the predetermined time, and outputs the delayed signal as the PCHDB signal (FIG. 26(i)). The OR gate 72b outputs the PCHDB signal as the PCHD signal (FIG. 26(j)). Then, the precharge operation is performed.

Incidentally, the latch 86 turns the LPCH signal to the high level in response to the activation of the PCH signal, but the PLS2 signal is not generated, so that the PCHDA signal is not activated (FIG. 26(k)).

Figure 27:
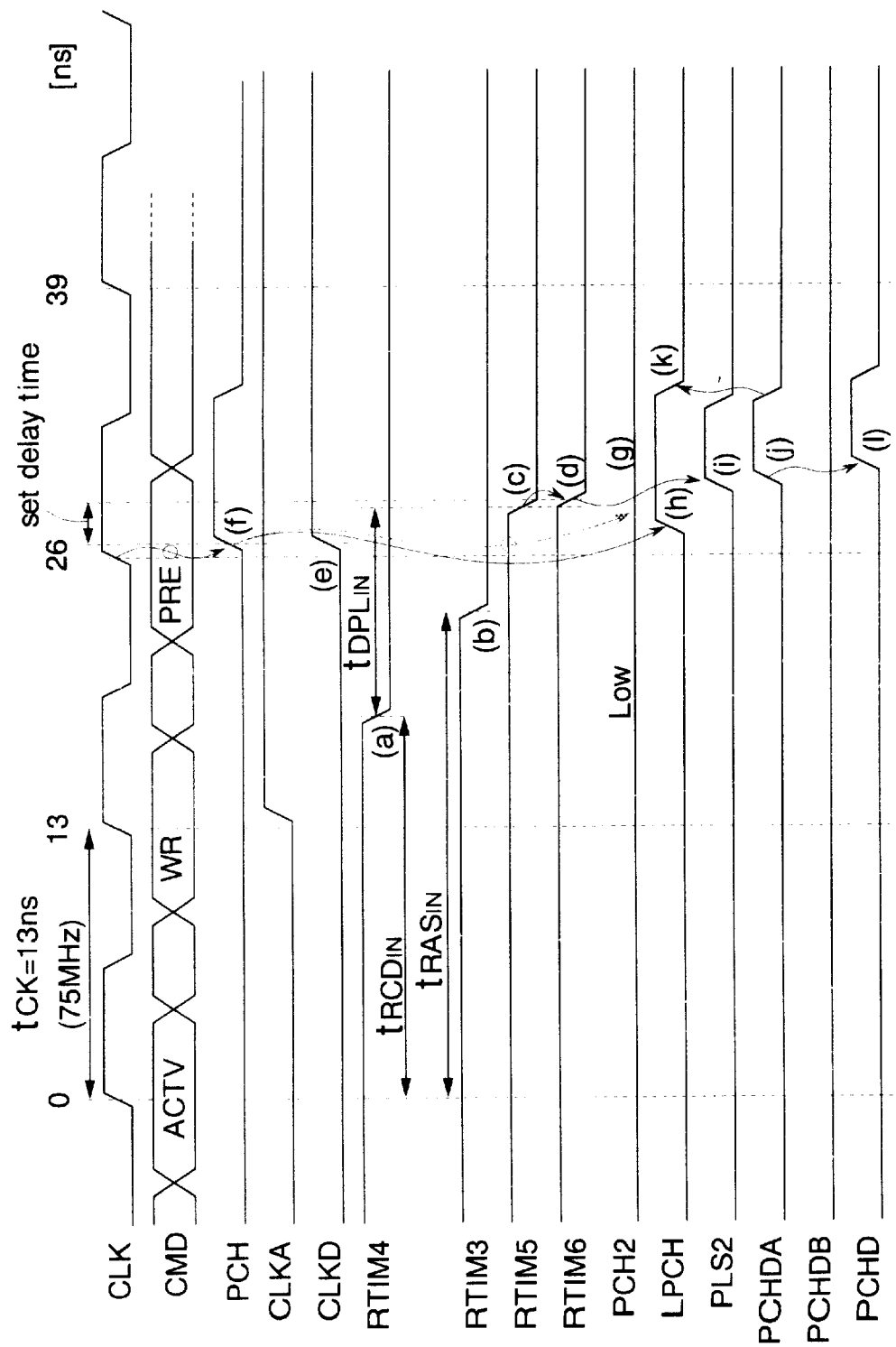
FIG. 27 is a timing chart showing the write operation and precharge operation of the SDRAM in the third embodiment.

FIG. 27 shows the write operation and precharge operation of the SDRAM in the case where the cycle "tCK" of the CLK signal is 13 ns (75 MHz). Here, the operation of the RAS control unit 72 shown in FIG. 19 will be described in detail.

In this example, the SDRAM receives the ACTV command, a WR command and the PRE command successively in synchronization with the CLK signal. Besides, in the case where the cycle tCK of the CLK signal is 13 ns (75 MHz), a latency is set at "2", and hence, the CLKD signal becomes the high level in synchronization with the second rising edge of the CLK signal (at 26 ns).

In addition, the timing adjusting circuit 90 measures a time from the rising edge of the CLKD signal to the falling edge of the RTIM5 signal, likewise to the operation shown in FIG. 25 (delay setting).

Symbols (a)~(l) indicated in the figure respectively correspond to those in FIG. 25 and the respective circuits similarly operate to those in FIG. 25.

Figure 28:
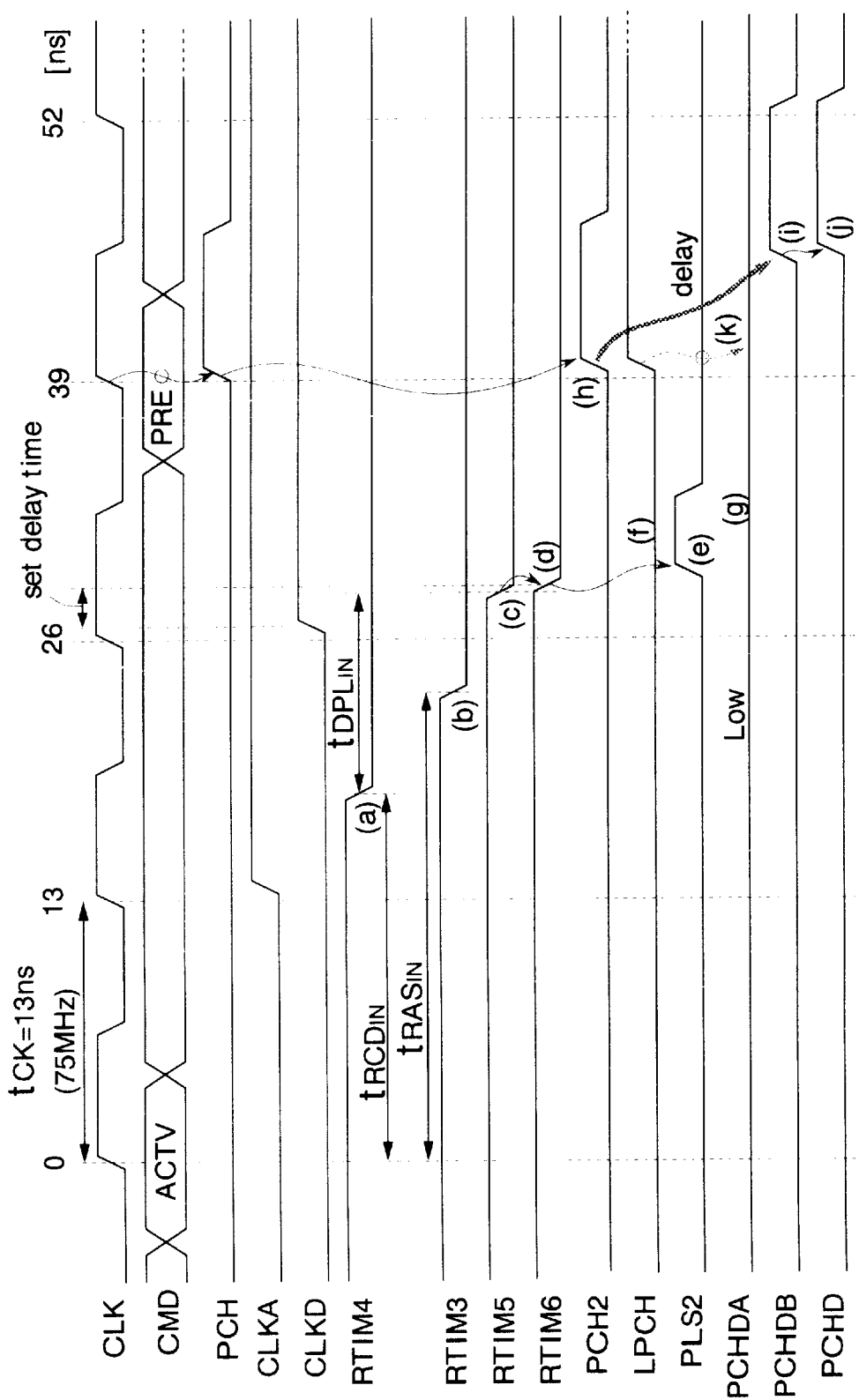
FIG. 28 is a timing chart showing another example of the precharge operation of the SDRAM in the third embodiment.

FIG. 28 shows another example of the precharge operation of the SDRAM in the case where the cycle "tCK" of the CLK signal is 13 ns (75 MHz).

In this example, the SDRAM receives the PRE command in synchronization with the third rising edge of the CLK signal (at 39 ns) after having received the ACTV command. Symbols (a)~(k) indicated in the figure respectively correspond to those in FIG. 26 and the respective circuits similarly operate to those in FIG. 26.

Also in this embodiment, the same effects as in the foregoing first embodiment can be attained. Further, in this embodiment, the delay times of the timing adjusting circuits 96, 98 are set using the RTIM4 signal which changes to the low level after the time tRCDIN being the actual value of the internal circuit. Therefore, the delay time can be set in accordance with that actual operating timing of the circuit corresponding to a row address which shifts depending upon the supply voltage, temperature, or the like of the chip. Accordingly, the circuit corresponding to a column address can be operated at the optimum timing which corresponds to the operating timing of the circuit corresponding to the row address.

Moreover, setting the delay time each time of receiving the ACTV command makes it possible to increase the frequency of setting the delay times and precisely operate the circuit corresponding to the column address.

The time corresponding to the difference between the transition edges of the two signals (for example, the CLKA signal and the RTIM4 signal) is obtained by each of the timing adjusting circuits, and the input signal (for example, the RW2 signal) is delayed by the obtained time. Therefore, the shifting of the operating timing of the internal circuit can be reliably reflected on the delay time of the input signal. Besides, since the delay circuits 100a, 100b are identical, the difference between the transition edges of the two signals can be readily reflected on the delay time of the input signal.

Figure 29:
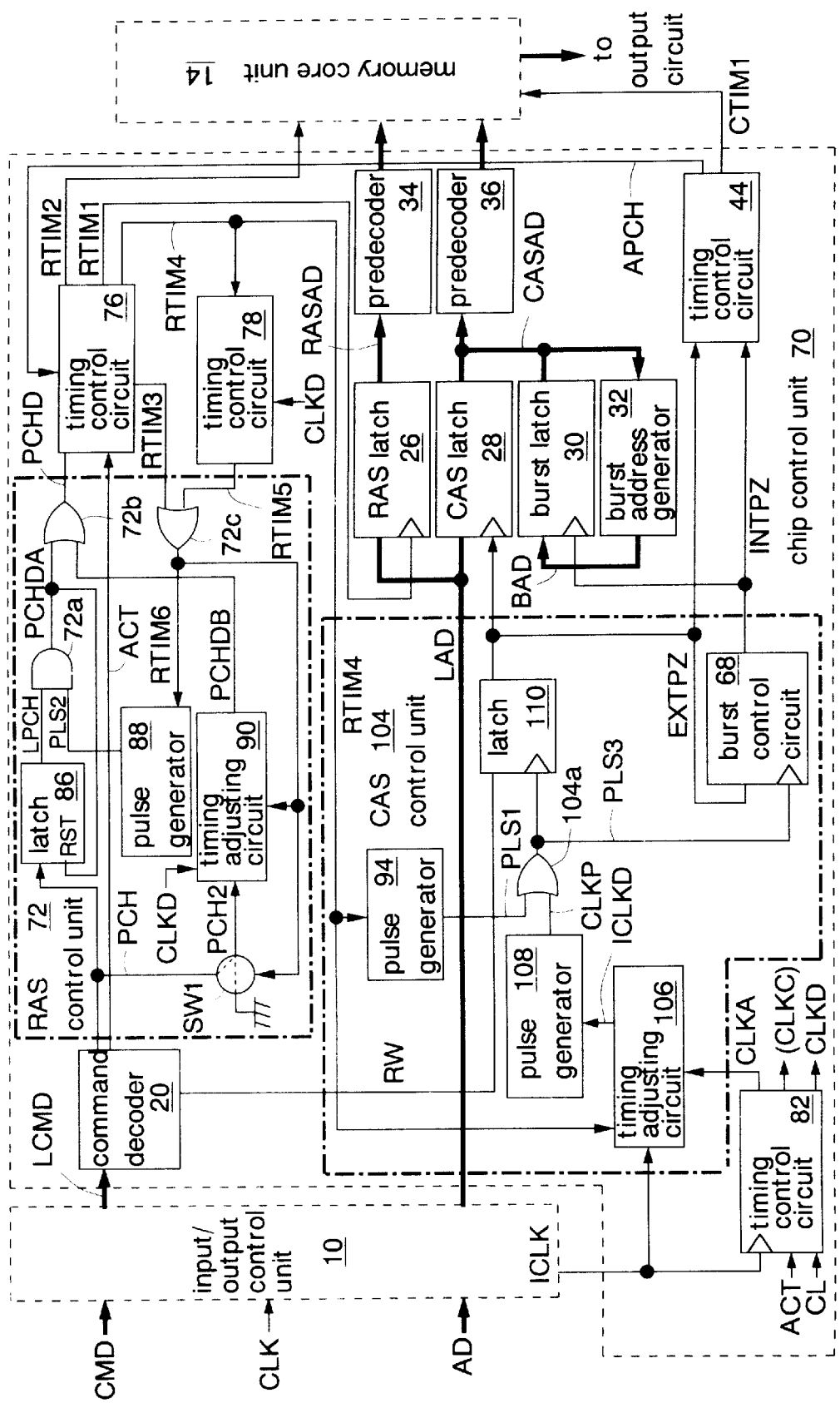
FIG. 29 is a block diagram showing the fourth embodiment of the semiconductor integrated circuit and the controlling method therefor, and one embodiment of the variable delay circuit.

FIG. 29 shows the fourth embodiment of the semiconductor integrated circuit and the controlling method therefor, and one embodiment of the variable delay circuit in the present invention. The same circuits as those explained in the first and third embodiments thereof have the identical reference numbers and the description thereof shall be omitted here.

In this embodiment, a CAS control unit 104 differs from the CAS control unit 74 in the third embodiment. The remaining construction is the same as in the third embodiment.

The CAS control unit 104 includes a timing adjusting circuit 106, pulse generators 94, 108, an OR gate 104a, a latch 110, and a burst control circuit 68.

The timing adjusting circuit 106 is the same circuit as the timing adjusting circuit 96 shown in FIG. 19. This timing adjusting circuit 106 measures a time from the rising edge of a CLKA signal to the falling edge of an RTIM4 signal, delays an ICLK signal by the measured time and outputs the resulting signal as a delayed internal clock signal ICLKD.

The pulse generator 108 is the same circuit as the pulse generator 94. This pulse generator 108 outputs a high pulse signal CLKP in synchronization with the rising edge of the ICLKD signal. The OR gate 104a outputs the logical sum between a PLS1 signal and the CLKP signal as a high pulse signal PLS3.

The latch 110 accepts an RW signal in synchronization with the PLS3 signal and outputs the accepted signal as an EXTPZ signal.

As in the second embodiment, the burst control circuit 68 is activated upon receiving the high level of the EXTPZ signal, and outputs the ICLKD signal as an INTPZ signal the number of times being smaller than a burst length by 1 (one).

Figure 30:
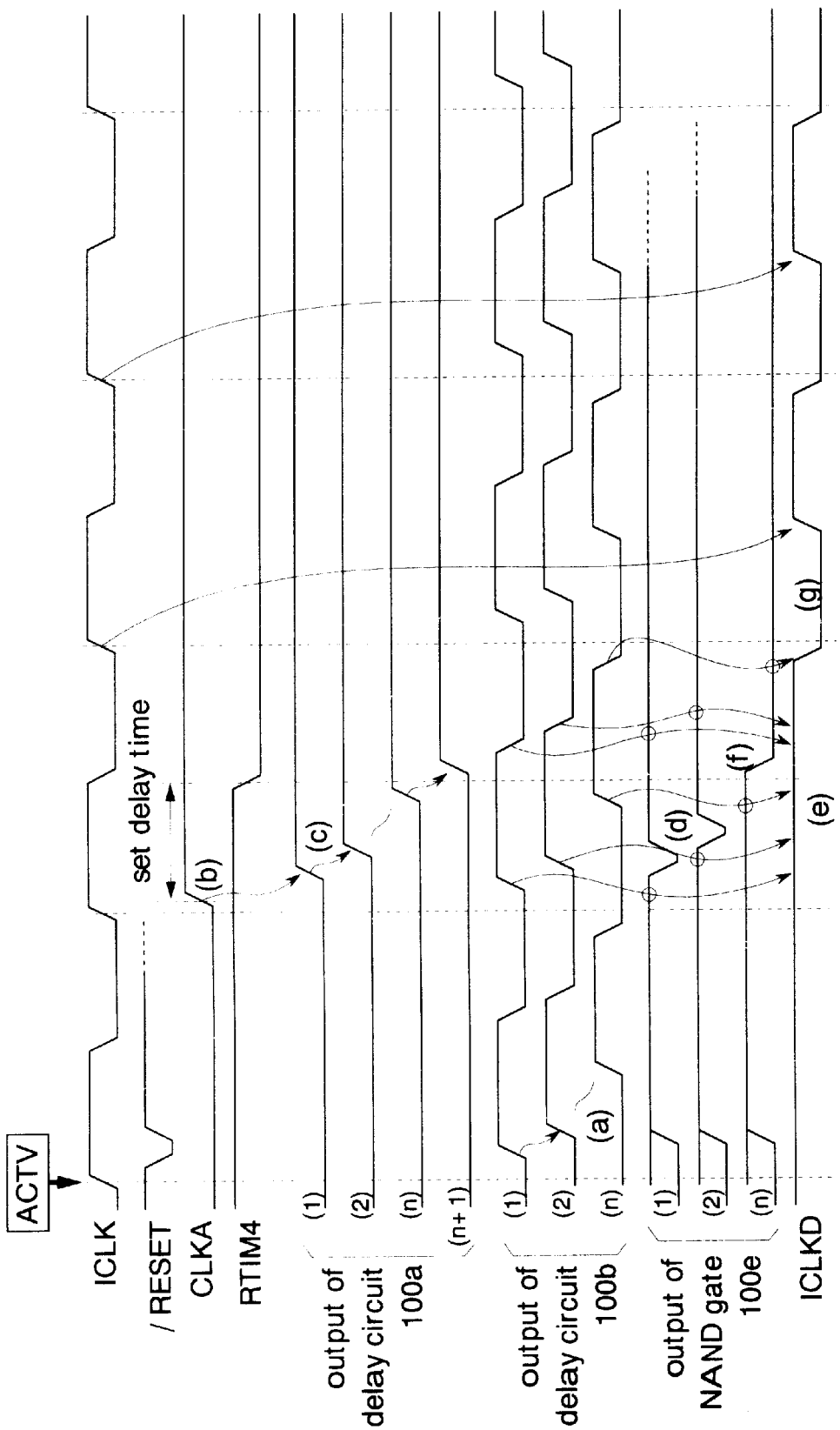
FIG. 30 is a timing chart showing the operation of a timing adjusting circuit shown in FIG. 29.

FIG. 30 shows the operation of the timing adjusting circuit 106.

First, in the same manner as in FIG. 23, the flip-flop circuit 100d of each of the delay setting parts 100 shown in FIG. 22 is reset upon receiving a /RESET signal.

The delay circuit 100b receives the ICLK signal or the output signal of the delay circuit 100b of the preceding stage, and outputs the delayed signal as its output (FIG. 30(a)).

Subsequently, the CLKA signal is activated in synchronization with the rising edge of the ICLK signal after the ACTV command (FIG. 30(b)). Each delay circuit 100a receives the CLKA signal and transmits the delayed signal to the NAND gate 100c of its own stage and to the delay circuit 100a of the succeeding stage (FIG. 30(c)). Such delayed signals are transmitted in succession.

The NAND gate 100e receives the high-level output of the flip-flop circuit 100d of its own stage and the low-level output of the flip-flop circuit 100d of the succeeding stage, and it outputs an low pulse signal (FIG. 30(d)). Such low pulse signals are outputted from the NAND gates 10e in succession.

Here, any of the outputs of the NAND gates 100e is at the high level when the levels of the delayed signals of the ICLK signal as are outputted from the delay circuits 100b change. Therefore, the output signal of each delay circuit 100b cannot transmit through the NOR gate 100f, and the ICLKD signal is held at the high level (FIG. 30(e)).

After a predetermined time, the RTIM4 signal changes to the low level, and the output of the nth NAND gate 100e, for example, is fixed to the low level (FIG. 30(f)). Owing to the fixation, the nth NOR gate 100f is activated to transmit the output signal of the delay circuit 100b to the NOR gate 102.

Thereafter, the ICLK signal is delayed by the delay time set by the delay adjustment circuit 106 and is outputted as the ICLKD signal (FIG. 30(g)).

Figure 31:
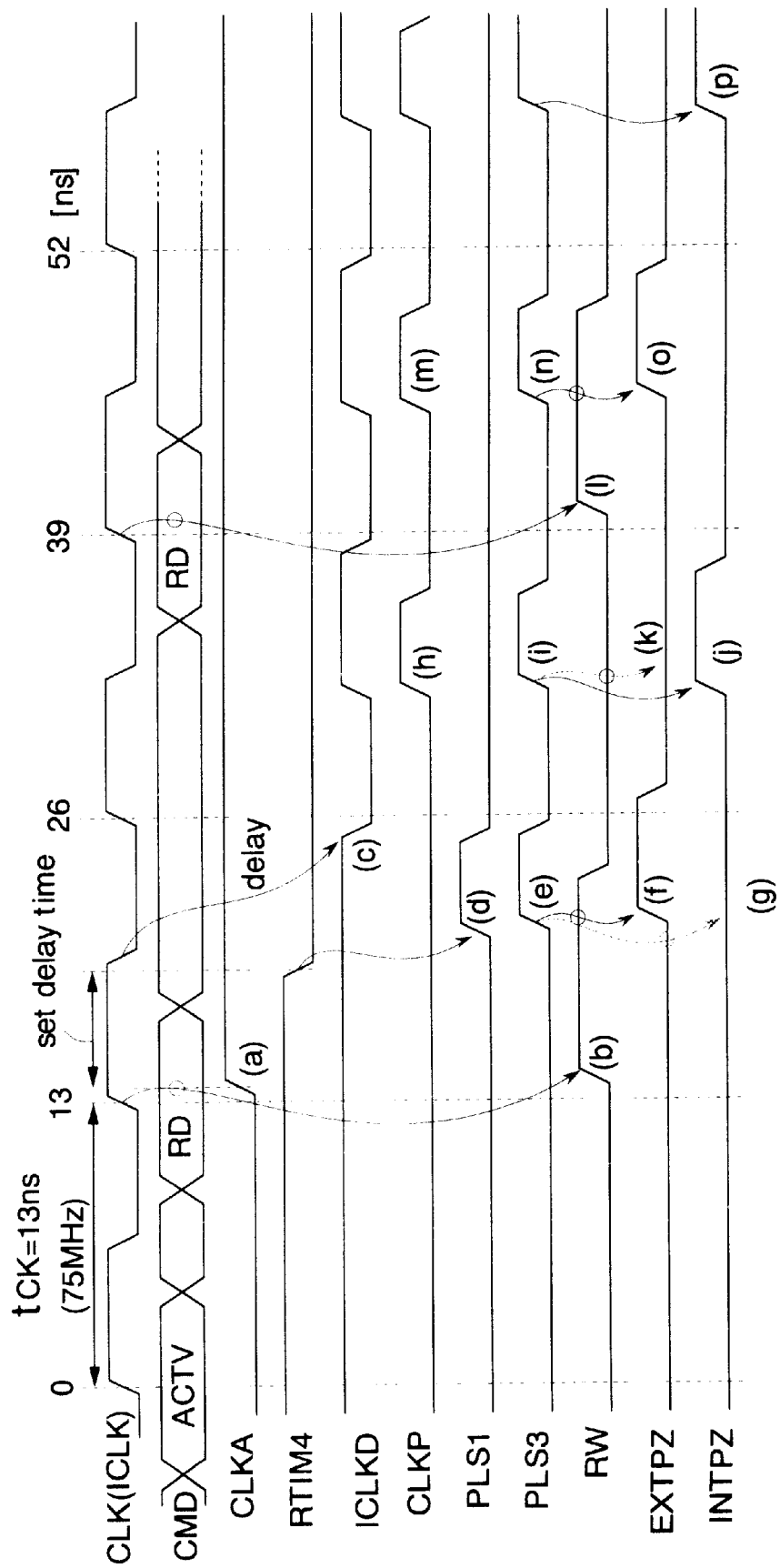
FIG. 31 is a timing chart showing the burst read operation of the SDRAM in the fourth embodiment.

FIG. 31 shows the burst read operation of the SDRAM in the case where the cycle "tCK" of the CLK signal is 13 ns (75 MHz). Here, the operation of the CAS control unit 104 shown in FIG. 19 will be described in detail.

First, the SDRAM-activates the row decoder 48 shown in FIG. 17, upon receiving the ACTV command. Subsequently, a timing control circuit 82 activates the CLKA signal in synchronization with the second rising edge of the CLK signal (at 13 ns) (FIG. 31(a)). Besides, the SDRAM activates the RW signal upon receiving an RD command (FIG. 31(b)).

As explained before, the timing adjusting circuit 96 measures a time from the rising edge of the CLKD signal to the falling edge of the RTIM4 signal (delay setting). After the delay setting, the timing adjusting circuit 96 outputs the ICLK signal delayed by the predetermined delay time (FIG. 31(c)).

In addition, the pulse generator 94 generates the PLS1 signal upon receiving the low level of the RTIM4 signal (FIG. 31(d)). The OR gate 104a outputs the PLS1 signal as the PLS3 signal (FIG. 31(e)).

The latch 110 accepts the high level of the RW signal in synchronization with the rising edge of the PLS3 signal, and outputs the accepted signal as the EXTPZ signal for about a half clock cycle (FIG. 31(f)). Since the EXTPZ signal is at the low level at the rise of the PLS3 signal, the burst Ace control circuit 68 holds the low level of the INTPZ signal (FIG. 31(g)).

Then, the first read operation is performed owing to the activation of the EXTPZ signal. In this manner, the EXTPZ signal for the first read operation after the ACTV command is generated from the RTIM4 signal.

Subsequently, the pulse generator 108 outputs the CLKP signal in synchronization with the rising edge of the ICLKD signal (FIG. 31(h)). The OR gate 104a outputs the CLKP signal as the PLS3 signal (FIG. 31(i)).

The burst control circuit 68 is activated by the high level of the EXTPZ signal and it outputs the PLS3 signal as the INTPZ signal the number of times being smaller than the burst length by 1. In this example, the burst length is set at "2" so that the INTPZ signal is activated once (FIG. 31(j)). Incidentally, since the RW signal is at the low level at the rise of the PLS3 signal, the latch 110 holds the low level of the EXTPZ signal (FIG. 31(k)). Then, the burst read operation is performed owing to the activation of the INTPZ signal.

Subsequently, the SDRAM receives the RD command in synchronization with the rising edge of the CLK signal (at 39 ns) and activates the RW signal (FIG. 31(*l*)). The pulse generator 108 outputs the CLKP signal (FIG. 31(*m*)) and the OR gate 104*a* outputs the PLS3 signal (FIG. 31(*n*)).

The latch 110 accepts the high level of the RW signal in synchronization with the rising edge of the PLS3 signal and outputs the accepted signal as the EXTPZ signal for about a half clock cycle (FIG. 31(*o*)).

Then, the read operation is performed owing to the activation of the EXTPZ signal. In this manner, the EXTPZ signals for use in the second and the subsequent read operations are generated from the ICLK signal.

Further, the INTPZ signal is activated in synchronization with the next rising edge of the ICLKD signal, whereby the burst read operation is performed (FIG. 31(*p*)).

Also in the semiconductor integrated circuit of this embodiment, the same effects as in the foregoing second and third embodiments can be attained.

In the foregoing embodiments, each of the timing adjusting circuits has been exemplified as setting the delay time each time the ACTV command is received. The present invention, however, is not limited to such embodiment. By way of example, the delay time may well be set only when power is switched on or in accordance with an external request by a mode register or a control terminal. Alternatively, the delay time may well be set in a refresh operation. Further, the delay time may well be set when the ACTV command has been received in the inactive state of the internal circuit. In this way, the frequency of setting the delay times can be lowered to reduce the power consumption of the semiconductor integrated circuit.

Besides, the foregoing embodiments have been described on the examples in which the present invention is applied to the SDRAM having one memory core unit 14. The present invention, however, is not limited to such embodiment. By way of example, the present invention may well be applied to an SDRAM of multi-bank construction having a plurality of memory core units 14. In this aspect, in the first embodiment by way of example, the timing adjusting circuits 40, 42 in pairs may well be formed in correspondence with the circuits relevant to the row addresses of the respective memory core units 14, so as to control the delay times of the EXTPZ signals and the INTPZ signals. On the other hand, in a case where the timing adjusting circuits 40, 42 are respectively formed in the multi-bank construction in order to make a circuit size smaller, the delay time may be set as follows:

(a) The delay time is set only when the power is switched on.
(b) The delay time is set in accordance with an external request. It is possible to receive the external request by writing a predetermined value into a mode register or feeding a predetermined control signal to a control terminal. Using the mode register enables the delay time to be set only if necessary. Using the control terminal, the delay time can be set immediately when a supply voltage, for example, has fluctuated.
(c) The delay time is set in a refresh operation. Concretely, the delay time is set when a refresh command has been received. Alternatively, the delay time may well be set only when the first refresh command has been received after the power is switched on.

The above measures (a)~(c) may be applied alone or in combination. The frequency of setting the delay times lowers in any of the embodiments so that the power consumption of the semiconductor integrated circuit can be reduced.

Figure 32:
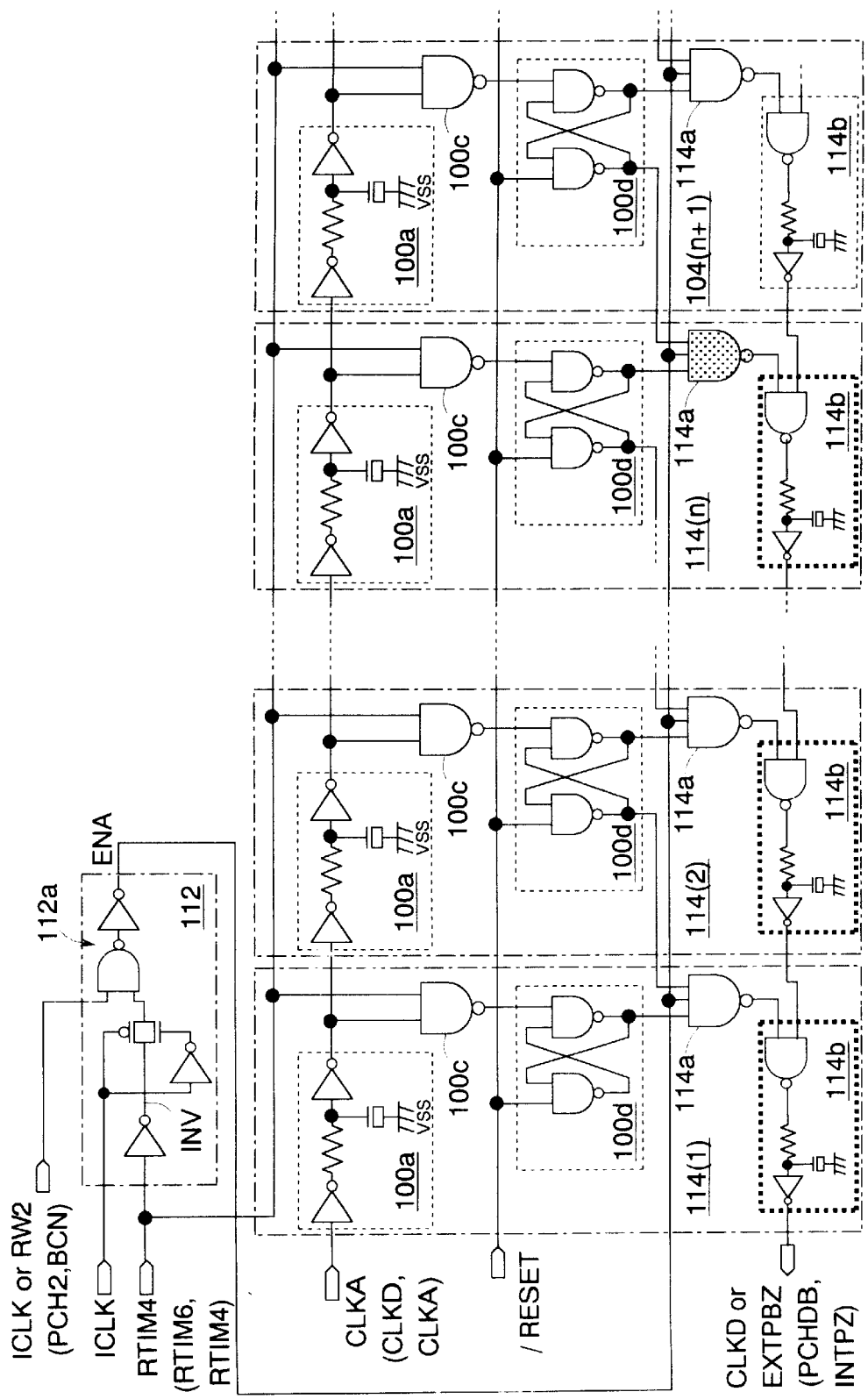
FIG. 32 is a circuit diagram showing another example of the timing adjusting circuit.

Further, each of the timing adjusting circuits 90, 96, 98 used in the foregoing third embodiment is not limited to the circuit shown in FIG. 22. Another example of the timing adjusting circuit is shown in FIG. 32.

This timing adjusting circuit is constructed of a generator 112 which generates an activation signal ENA, and a plurality of delay setting parts 114 which are connected in cascade. Each of the delay setting parts 114 is configured of the same delay circuit 100*a*, NAND gate 100*c* and flip-flop circuit 100*d* as in FIG. 22, and a 3-input NAND gate 114*a* as well as a delay circuit 114*b*. Here, the delay circuits 114*b* correspond to the first delay stages 6*a* shown in FIG. 5. The NAND gates 114*a* correspond to the selecting circuit 9 shown in FIG. 5.

The generator 112 is constructed of inverters, a CMOS transmission gate, and an AND circuit 112*a* connected in series. In this generator 112, the CMOS transmission gate accepts the inverted signal INV of the RTIM4 signal when the ICLK signal is at low level. The accepted INV signal is held by a latch circuit (not shown). During the high-level period of the INV signal, the ICLK signal or RW2 signal fed to the other input node of the AND circuit 112*a* is outputted as the enable signal ENA.

In addition, the NAND gate 114*a* of the delay setting part 114 receives the enable signal ENA, the output of the flip-flop circuit 100*d* of its own stage, and the output of the flip-flop circuit 100*d* of the succeeding stage.

The delay circuit 114*b* is such that an CR time-constant circuit is arranged between a NAND gate and an inverter. One input node of this NAND gate is connected to the output node of the NAND gate 114*a*, and the other input node thereof is connected to the output node of the delay circuit 114*b* of the preceding stage (at the right as viewed in the figure).

Incidentally, the input of the delay circuit 114*b* at the initial stage (located at the right side of the figure though not shown) is fixed to the high level.

Thus, the delayed clock signal CLKD or EXTPBZ signal delayed by a predetermined time is outputted from the delay circuit 114*a* of the delay setting part 114 at the final stage (at the left as viewed in the figure).

The signal names of in parentheses correspond to those of the timing adjusting circuits 90, 98.

Figure 33:
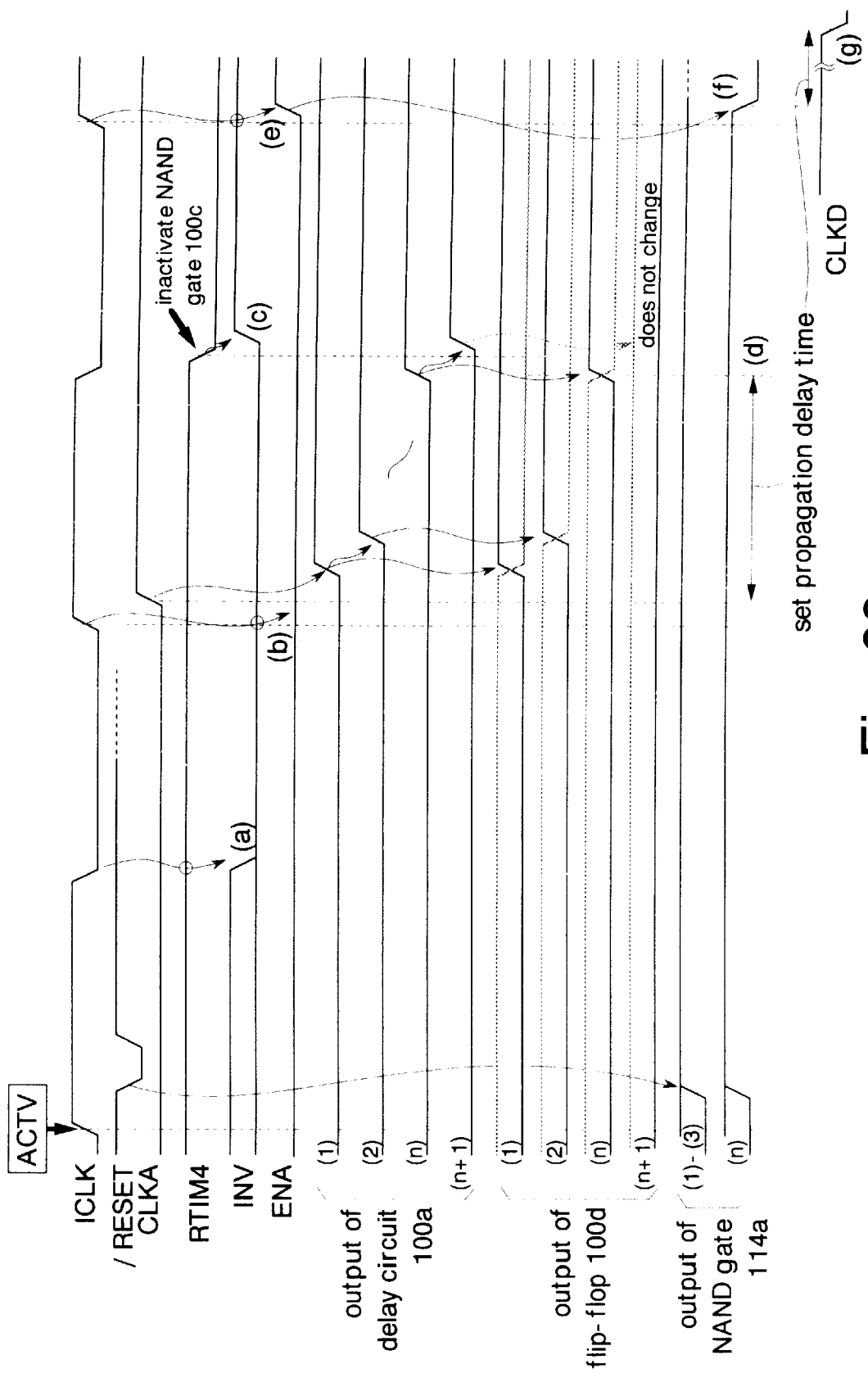
FIG. 33 is a timing chart showing the operation of the timing adjusting circuit shown in FIG. 32.

FIG. 33 shows the operation of setting the propagation delay time in the case where the ICLK signal is delayed in the timing adjusting circuit shown in FIG. 32. Only timings different from those shown in FIG. 23 will be explained here.

First, the CMOS transmission gate holds the inverted signal INV of the RTIM4 signal during the low-level period of the ICLK signal (FIG. 33(*a*)). The ENA signal holds the low level because of the low level of the INV signal at the rise of the ICLK signal, (FIG. 33(*b*)).

Subsequently, during the low-level period of the ICLK signal, the RTIM4 signal changes to the low level and the INV signal changes to the high level (FIG. 33(*c*)). The and circuit 112*a* is activated by the high level of the INV signal. Besides, before the AND circuit 112*a* is activated, the propagation delay time is set in the same manner as in FIG. 23 (FIG. 33(*d*)).

The AND circuit 112*a* turns the ENA signal to the high level upon receiving the next rise of the ICLK signal (FIG. 33(*e*)). Then, only the NAND gate 114*a* indicated by meshing in FIG. 32 is activated to change its output to the low level (FIG. 33(*f*)).

As a result, the delay circuits 114*b* indicated by bold broken lines in FIG. 32 are electrically connected in series. The ICLK signal delayed by the total time of the delays thereof is outputted as the CLKD signal (FIG. 33(*g*)). In other words, the propagation delay time is set.

In a case where the signal to be fed to the AND circuit 112a is the RW2 signal, waveforms similar to those shown in FIGS. 24(o), (p) are obtained.

Further, the foregoing embodiments have been described on the examples in which the present invention is applied to the SDRAM. The present invention, however, is not limited to such embodiments. By way of example, the present invention may be applied to a semiconductor memory such as DRAM or SRAM, which operates in synchronization with a clock signal. Alternatively, it may be applied to a system LSI in which the memory core of a DRAM is implemented.

Moreover, the semiconductor manufacturing process to which the present invention is applied is not limited to the CMOS process but also a Bi-CMOS process.

The invention is not limited to the above embodiments and various modifications may be made without departing from the spirit and the scope of the invention. Any improvement may be made in part or all of the components.

What is claimed is:

1. A semiconductor integrated circuit comprising:
   a plurality of memory cells connected to a word line;
   a row control circuit activating said word line;
   an address latch circuit latching a column address for selecting the accessed memory cell among said memory cells selected by said word line being activated;
   a column control circuit performing a read or a write operation in said memory cells selected by said word line being activated;
   a command control circuit receiving a column operation command in synchronization with a clock signal and controlling said column control circuit; and
   a timing adjusting circuit setting a variable latch timing of said column address and a variable delay time, which is from the reception of said column operation command to the start of the operation of said column control circuit.

2. semiconductor integrated circuit according to claim 1, wherein said timing adjusting circuit sets said delay time to a predetermined length in accordance with a latency, which is a value equal to the number of clock cycles from said reception of said column operation command to the performance of the read operation or the write operation.

3. A semiconductor integrated circuit according to claim 1, wherein said timing adjusting circuit includes a delay circuit for setting said delay time to a predetermined length.

4. A semiconductor integrated circuit according to claim 1, comprising a latch circuit latching said column operation command received by said command control circuit in response to the receipt of said clock signal whose time is variably delayed by said timing adjusting circuit.

5. A semiconductor integrated circuit according to claim 1, wherein said timing adjusting circuit sets said delay time to a predetermined length in accordance with an operating timing of said row control circuit.

6. A semiconductor integrated circuit according to claim 1, wherein said timing adjusting circuit sets said delay time to a predetermined length for every operation of said row control circuit.

7. A semiconductor integrated circuit according to claim 1, wherein said timing adjusting circuit sets said delay time to a predetermined length in response to the first operation of said row control circuit after the inactive state of an internal circuit.

8. A semiconductor integrated circuit according to claim 1, wherein said timing adjusting circuit sets said delay time to a predetermined length in response to the reception of a refresh command for refreshing said memory cells.

9. A semiconductor integrated circuit according to claim 8, wherein said timing adjusting circuit sets said delay time to a predetermined length in response to the reception of the first refresh command after the power is switched on.

10. A semiconductor integrated circuit according to claim 1, wherein said timing adjusting circuit sets said delay time to a predetermined length in response to a request to adjust said delay time from the exterior.

11. A semiconductor integrated circuit according to claim 1, comprising a mode register for setting an operating mode from the exterior, and wherein
    said timing adjusting circuit sets said delay time to a predetermined length in accordance with a value set by said mode register.

12. A semiconductor integrated circuit according to claim 1, comprising a control terminal receiving an external control signal, and wherein
    said timing adjusting circuit sets said delay time to a predetermined length in accordance with said control signal fed to said control terminal.

13. A semiconductor integrated circuit comprising:
    a plurality of memory cells connected to a bit line;
    a precharging circuit setting said bit line to have a predetermined voltage;
    a command control circuit receiving a precharge command in synchronization with a clock signal and controlling said precharging circuit; and
    a timing adjusting circuit setting a variable delay time, which is from the reception of said precharge command to the start of the operation of said, precharging circuit.

14. A semiconductor integrated circuit according to claim 13, wherein said timing adjusting circuit sets said delay time to a predetermined length in accordance with a latency, which is a value equal to the number of clock cycles from the reception of an operation command to the performance of a read or a write operation.

15. A semiconductor integrated circuit according to claim 14, wherein said timing adjusting circuit includes a delay circuit for setting said delay time to a predetermined length.

16. A semiconductor integrated circuit according to claim 14, comprising a row control circuit activating a word line, and wherein
    said timing adjusting circuit sets said delay time to a predetermined length in accordance with an operating timing of said row control circuit.

17. A method of controlling a semiconductor integrated circuit, comprising:
    a plurality of memory cells connected to a word line;
    a row control circuit activating said word line;
    a address latch circuit latching a column address for selecting the accessed memory cell among said memory cells selected by said word line being activated; and
    a column control circuit performing a read or a write operation in said memory cells selected by said word line being activated, comprising the step of:
    setting a variable latch timing of said column address and a variable delay time, which is from the reception of a column operation command in synchronization with a clock signal, for controlling said column control circuit, to the start of the operation of said column control circuit.

18. A method of controlling a semiconductor integrated circuit, comprising:

a plurality of memory cells connected to a bit line and a precharging circuit for setting said bit line to have a predetermined voltage, comprising the step of setting a variable delay time, which is from the reception of a precharge command in synchronization with a clock signal, for controlling said precharging circuit, to the start of the operation of said precharging circuit.

19. A semiconductor integrated circuit comprising:

a plurality of memory cells connected to a word line;

a row control circuit activating said word line;

a column control circuit performing a read or a write operation in said memory cells selected by said word line being activated;

a command control circuit receiving a column operation command in synchronization with a clock signal and controlling said column control circuit; and a timing adjusting circuit including a variable delay circuit for measuring the time difference between a predetermined transition edge of said clock signal and a transition edge of a timing signal, and for delaying the start of the operation of said column control circuit from the reception of said column operation command by said time difference.

20. A semiconductor integrated circuit comprising:

a plurality of memory cells connected to a bit line;

a precharging circuit setting said bit line to have a predetermined voltage;

a command control circuit receiving a precharge command in synchronization with a clock signal and controlling said precharging circuit; and a timing adjusting circuit including a variable delay circuit for measuring the time difference between a predetermined transition edge of said clock signal and a transition edge of a timing signal, and for delaying the start of the operation of said column control circuit from the reception of said column operation command by said time difference.

21. A method of controlling a semiconductor integrated circuit, comprising a plurality of memory cells connected to a word line, a row control circuit activating said word line, and a column control circuit performing a read or a write operation in said memory cells selected by said word line being activated, comprising the steps of:

measuring the time difference between a predetermined transition edge of said clock signal and a transition edge of a timing signal; and delaying the start of the operation of said column control circuit from the reception of a column operation command in synchronization with a clock signal by said time difference.

22. A method of controlling a semiconductor integrated circuit, comprising:

a plurality of memory cells connected to a bit line and a precharging circuit for setting said bit line to have a predetermined voltage, comprising the steps of measuring the time difference between a predetermined transition edge of said clock signal and a transition edge of a timing signal; and delaying the start of the operation of said precharging circuit from the reception of a precharge command in synchronization with a clock signal by said time difference.

* * * * *